(12) United States Patent
Young et al.

(10) Patent No.: US 11,716,856 B2
(45) Date of Patent: *Aug. 1, 2023

(54) THREE-DIMENSIONAL MEMORY DEVICE AND METHOD

(71) Applicant: Taiwan Semiconductor Manufacturing Co., Ltd., Hsinchu (TW)

(72) Inventors: Bo-Feng Young, Taipei (TW); Meng-Han Lin, Hsinchu (TW); Chih-Yu Chang, Taipei (TW); Sai-Hooi Yeong, Zhubei (TW); Yu-Ming Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 2 days.

This patent is subject to a terminal disclaimer.

(21) Appl. No.: 17/193,331

(22) Filed: Mar. 5, 2021

(65) Prior Publication Data
US 2022/0285393 A1     Sep. 8, 2022

(51) Int. Cl.
*H10B 51/20* (2023.01)
*H01L 21/02* (2006.01)
(Continued)

(52) U.S. Cl.
CPC ....... *H10B 51/20* (2023.02); *H01L 21/02565* (2013.01); *H01L 23/5226* (2013.01); *H01L 29/24* (2013.01); *H10B 51/30* (2023.02)

(58) Field of Classification Search
None
See application file for complete search history.

(56) References Cited

U.S. PATENT DOCUMENTS

| 1,152,386 A | 8/1915 | Smith |
| 8,203,884 B2 | 6/2012 | Kito et al. |

(Continued)

FOREIGN PATENT DOCUMENTS

| CN | 102971797 A | 3/2013 |
| CN | 104112748 A | 10/2014 |

(Continued)

OTHER PUBLICATIONS

Park, J. et al., "A hybrid ferroelectric-flash memory cells," J_Appl. Phys. 116, 124512, Sep. 29, 2014, 8 pages.
(Continued)

*Primary Examiner* — Vincent Wall
(74) *Attorney, Agent, or Firm* — Slater Matsil, LLP

(57) ABSTRACT

A memory cell includes patterning a first trench extending through a first conductive line, depositing a memory film along sidewalls and a bottom surface of the first trench, depositing a channel layer over the memory film, the channel layer extending along the sidewalls and the bottom surface of the first trench, depositing a first dielectric layer over and contacting the channel layer to fill the first trench, patterning a first opening, wherein patterning the first opening comprises etching the first dielectric layer, depositing a gate dielectric layer in the first opening, and depositing a gate electrode over the gate dielectric layer and in the first opening, the gate electrode being surrounded by the gate dielectric layer.

20 Claims, 64 Drawing Sheets

(51) Int. Cl.
*H01L 29/24* (2006.01)
*H01L 23/522* (2006.01)
*H10B 51/30* (2023.01)

(56) References Cited

U.S. PATENT DOCUMENTS

| | | | |
|---|---|---|---|
| 9,015,561 B1 | 4/2015 | Hu | |
| 9,240,420 B2 | 1/2016 | Rabkin et al. | |
| 9,455,262 B2 | 9/2016 | Widjaja | |
| 9,520,407 B2 | 12/2016 | Fukuzumi et al. | |
| 9,601,497 B1* | 3/2017 | Chen | H01L 29/0847 |
| 9,634,023 B2 | 4/2017 | Lee | |
| 9,806,202 B2 | 10/2017 | Yamazaki et al. | |
| 9,997,631 B2* | 6/2018 | Yang | H01L 29/66803 |
| 10,256,247 B1 | 4/2019 | Kanakamedala et al. | |
| 10,515,981 B2 | 12/2019 | Or-Bach et al. | |
| 10,777,566 B2 | 9/2020 | Lue | |
| 10,868,042 B1 | 12/2020 | Zhang et al. | |
| 10,998,447 B2 | 5/2021 | Onuki et al. | |
| 11,171,157 B1* | 11/2021 | Lai | H10B 51/50 |
| 11,211,395 B2* | 12/2021 | Lung | G06F 7/5443 |
| 11,404,091 B2* | 8/2022 | Lin | H10B 41/27 |
| 11,423,966 B2* | 8/2022 | Lin | H10B 99/00 |
| 2007/0072439 A1 | 3/2007 | Akimoto et al. | |
| 2008/0265235 A1 | 10/2008 | Kamigaichu et al. | |
| 2011/0266604 A1* | 11/2011 | Kim | H10B 43/20 257/314 |
| 2011/0298013 A1 | 12/2011 | Hwang et al. | |
| 2014/0048868 A1* | 2/2014 | Kim | H01L 29/7926 257/324 |
| 2014/0264532 A1 | 9/2014 | Dennison et al. | |
| 2014/0264718 A1 | 9/2014 | Wada et al. | |
| 2015/0294977 A1 | 10/2015 | Kim et al. | |
| 2016/0012901 A1 | 1/2016 | Hsu et al. | |
| 2016/0086970 A1 | 3/2016 | Peng | |
| 2016/0181259 A1 | 6/2016 | Van Houdt et al. | |
| 2016/0284811 A1 | 9/2016 | Yu et al. | |
| 2016/0322368 A1 | 11/2016 | Sun et al. | |
| 2017/0117290 A1 | 4/2017 | Lee et al. | |
| 2017/0148517 A1 | 5/2017 | Harari | |
| 2017/0213846 A1 | 7/2017 | Lee | |
| 2017/0301684 A1 | 10/2017 | Park et al. | |
| 2018/0083018 A1 | 3/2018 | Yamakita et al. | |
| 2018/0130823 A1 | 5/2018 | Kim | |
| 2018/0269210 A1* | 9/2018 | Tezuka | H10B 43/27 |
| 2018/0315794 A1* | 11/2018 | Kamalanathan | H10N 70/066 |
| 2019/0027493 A1* | 1/2019 | Kimura | H10B 43/20 |
| 2019/0058109 A1 | 2/2019 | Chen et al. | |
| 2019/0067325 A1 | 2/2019 | Yano | |
| 2019/0102104 A1 | 4/2019 | Righetti et al. | |
| 2019/0123061 A1* | 4/2019 | Liu | G11C 11/2273 |
| 2019/0148393 A1* | 5/2019 | Lue | G11C 16/0416 365/185.05 |
| 2019/0295626 A1 | 9/2019 | Ikeda et al. | |
| 2019/0312050 A1 | 10/2019 | Lai et al. | |
| 2019/0326308 A1 | 10/2019 | Pu et al. | |
| 2020/0013791 A1 | 1/2020 | Or-Bach et al. | |
| 2020/0013799 A1 | 1/2020 | Herner et al. | |
| 2020/0026990 A1* | 1/2020 | Lue | G06N 3/063 |
| 2020/0035701 A1* | 1/2020 | Huang | H01L 29/40117 |
| 2020/0058673 A1 | 2/2020 | Nishikawa et al. | |
| 2020/0075631 A1* | 3/2020 | Dong | H01L 29/7827 |
| 2020/0083248 A1 | 3/2020 | Uchida | |
| 2020/0098774 A1 | 3/2020 | Yeh et al. | |
| 2020/0105773 A1 | 4/2020 | Morris et al. | |
| 2020/0119025 A1 | 4/2020 | Jiang et al. | |
| 2020/0185409 A1 | 6/2020 | Baek et al. | |
| 2020/0185411 A1* | 6/2020 | Herner | H10B 43/20 |
| 2020/0194451 A1 | 6/2020 | Lee et al. | |
| 2020/0203329 A1 | 6/2020 | Kanamori et al. | |
| 2020/0227439 A1 | 7/2020 | Sato | |
| 2020/0295033 A1 | 9/2020 | Sakamoto et al. | |
| 2020/0303300 A1 | 9/2020 | Kato | |
| 2020/0343252 A1 | 10/2020 | Lai et al. | |
| 2020/0402890 A1 | 12/2020 | Chary et al. | |
| 2021/0036019 A1 | 2/2021 | Sharangpani et al. | |
| 2021/0065805 A1 | 3/2021 | Choi et al. | |
| 2021/0066344 A1 | 3/2021 | Son et al. | |
| 2021/0335805 A1 | 10/2021 | Kai et al. | |
| 2021/0375917 A1* | 12/2021 | Lu | H10B 43/27 |
| 2021/0375927 A1* | 12/2021 | Chia | G11C 11/5657 |
| 2021/0375932 A1* | 12/2021 | Wang | H10B 51/30 |
| 2021/0376153 A1* | 12/2021 | Lu | H10B 51/10 |
| 2021/0391355 A1 | 12/2021 | Lill et al. | |
| 2021/0407569 A1* | 12/2021 | Young | H10B 51/20 |
| 2021/0407845 A1* | 12/2021 | Wang | H10B 51/20 |
| 2021/0407980 A1* | 12/2021 | Young | H10B 43/40 |
| 2021/0408038 A1* | 12/2021 | Lin | H10B 43/20 |
| 2021/0408044 A1* | 12/2021 | Chiang | G11C 11/223 |
| 2021/0408045 A1* | 12/2021 | Chiang | H01L 27/1225 |
| 2021/0408046 A1* | 12/2021 | Chang | G11C 11/223 |
| 2022/0005821 A1 | 1/2022 | Or-Bach et al. | |
| 2022/0036931 A1* | 2/2022 | Lin | H10B 41/20 |
| 2022/0037253 A1 | 2/2022 | Yang et al. | |
| 2022/0037361 A1* | 2/2022 | Lin | H10B 51/30 |
| 2022/0037362 A1 | 2/2022 | Lin et al. | |

FOREIGN PATENT DOCUMENTS

| | | |
|---|---|---|
| CN | 105359270 A | 2/2016 |
| CN | 107871520 A | 4/2018 |
| CN | 108401468 A | 8/2018 |
| CN | 110268523 A | 9/2019 |
| CN | 110416223 A | 11/2019 |
| KR | 20140024632 A | 3/2014 |
| KR | 20150118648 A | 10/2015 |
| KR | 20170089378 A | 8/2017 |
| KR | 20170093099 A | 8/2017 |
| TW | 201114021 A | 4/2011 |
| TW | 201205576 A | 2/2012 |
| TW | 201624708 A | 7/2016 |
| TW | 201803131 A | 1/2018 |
| TW | I643317 B | 12/2018 |
| TW | I643318 B | 12/2018 |
| TW | 201909386 A | 3/2019 |
| TW | 201913963 A | 4/2019 |
| TW | 201926642 A | 7/2019 |
| TW | 201931577 A | 8/2019 |
| TW | 201944543 A | 11/2019 |
| TW | I681548 B | 1/2020 |
| TW | I692038 B | 4/2020 |
| TW | 202029353 A | 8/2020 |
| WO | 2016093947 A1 | 6/2016 |
| WO | 2017091338 A1 | 6/2017 |
| WO | 2019125352 A1 | 6/2019 |
| WO | 2019152226 A1 | 8/2019 |

OTHER PUBLICATIONS

Wu, B. et al., "High aspect ratio silicon etch: a review," J. Appl. Phys. 108, 051101 (2010): https://doi.,Jrg/10.1063/1.3474652, Sep. 9, 2010, 21 pages.

* cited by examiner

THREE-DIMENSIONAL MEMORY DEVICE AND METHOD

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
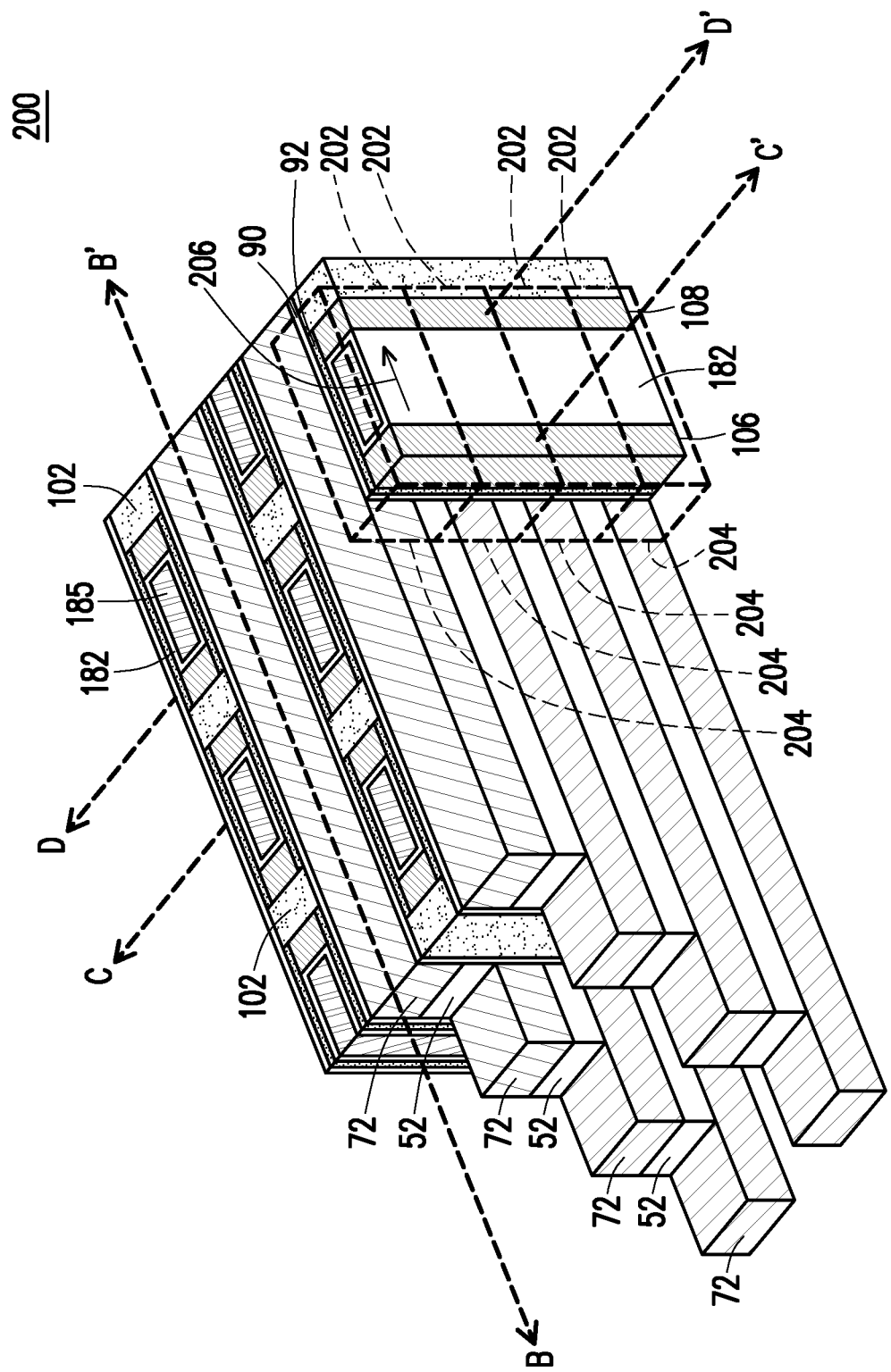
FIGS. 1A, 1B, and 1C illustrate a perspective view, a circuit diagram, and a top down view of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D memory array with a plurality of vertically stacked memory cells. Each memory cell includes a transistor having a word line region acting as a first gate electrode, a bit line region acting as a first source/drain electrode, and a source line region acting as a second source/drain electrode. Each transistor further includes an insulating memory film (e.g., as a gate dielectric) and an oxide semiconductor (OS) channel region. Additionally, each memory cell includes a second gate electrode that may be used to provide extra charge (e.g., to apply a biasing voltage to increase a write voltage). As a result, the operational voltage of the 3D memory array can be reduced, leading to improved reliability. In addition, increasing the write voltage applied during a write operation can help increase the speed and accuracy of the write operation. Further, the oxide semiconductor (OS) channel region can be formed with a recess that allows the second gate electrode to exert better control of each transistor during operation.

Figure 1B:
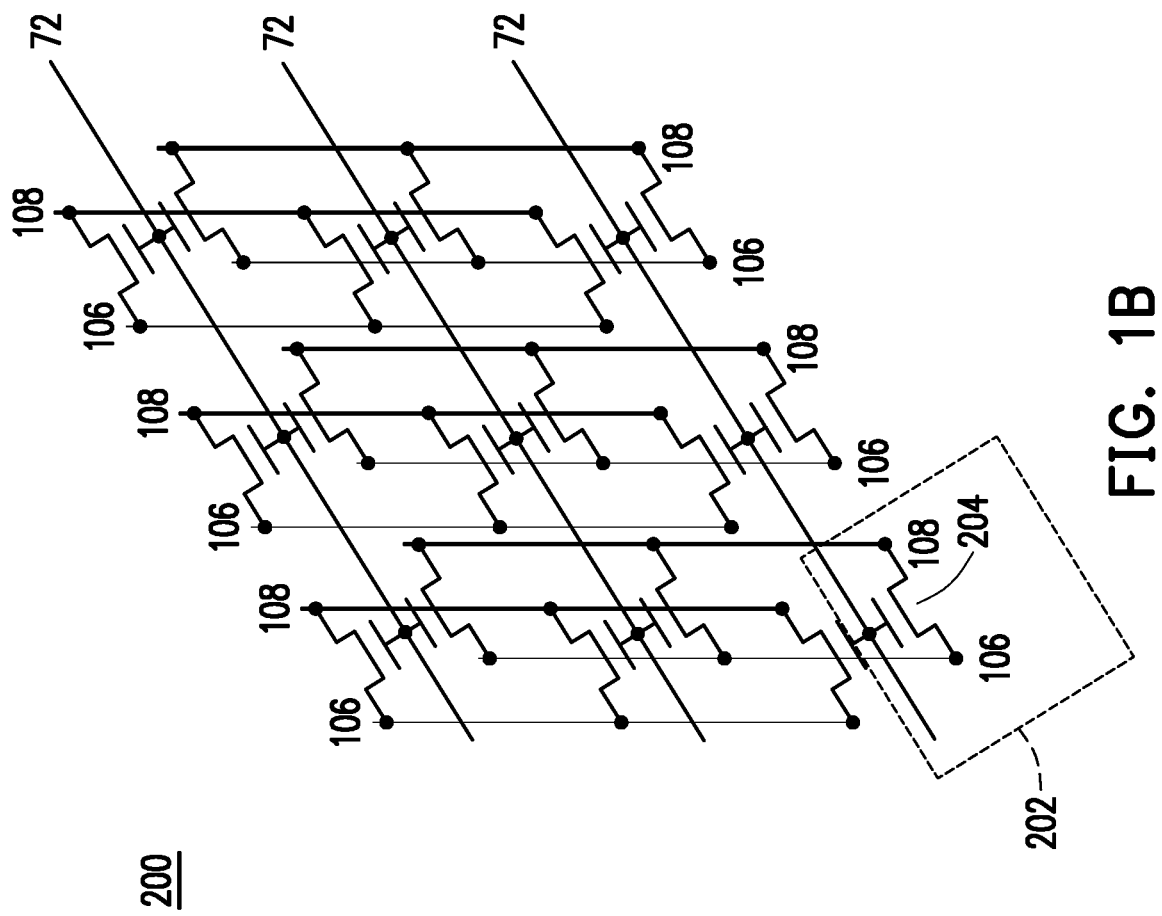
Figure 1C:
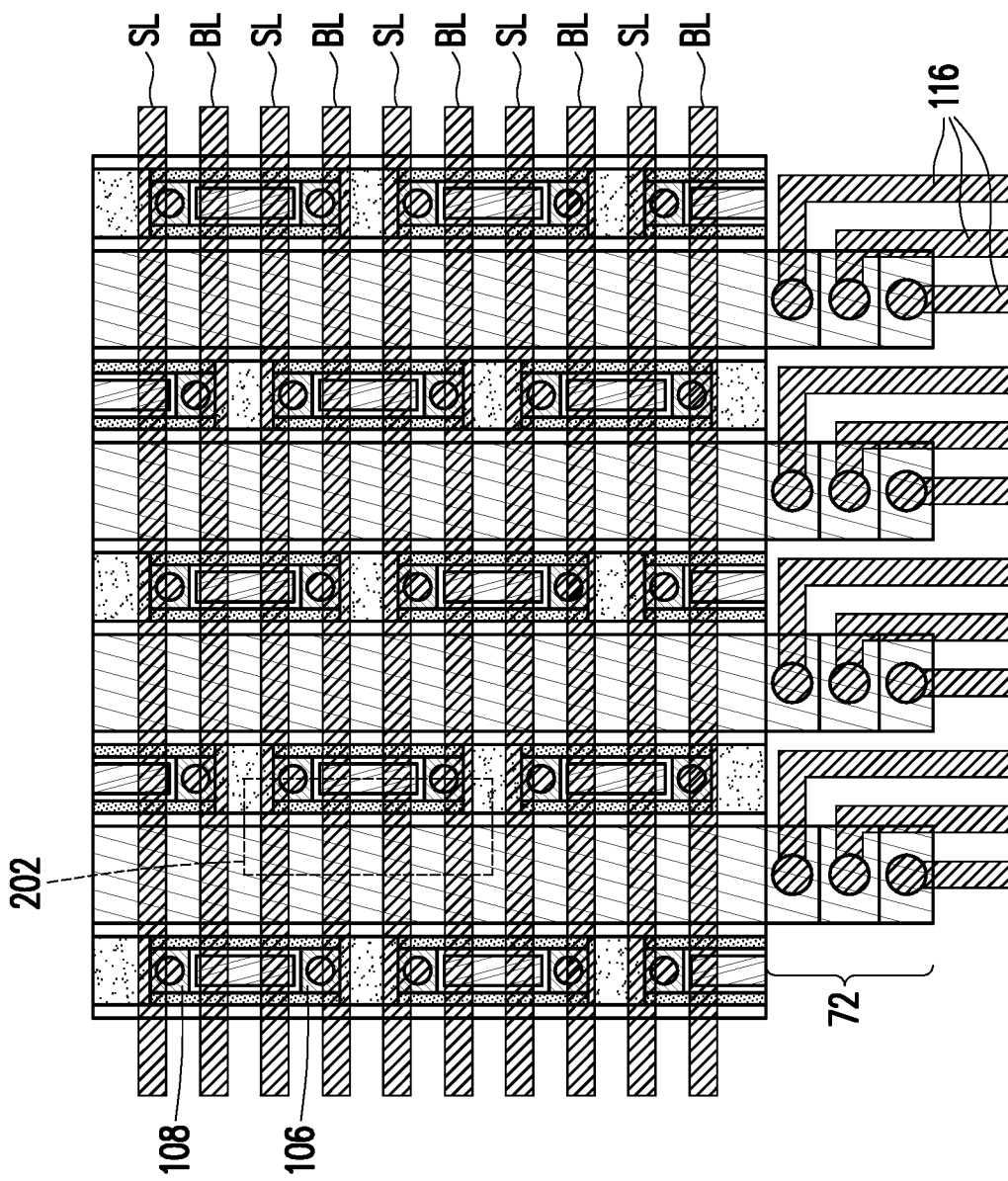

FIGS. 1A, 1B, and 1C illustrate examples of a memory array according to some embodiments. FIG. 1A illustrates an example of a portion of the memory array 200 in a three-dimensional view; FIG. 1B illustrates a circuit diagram of the memory array 200; and FIG. 1C illustrates a top down view of the memory array 200 in accordance with some embodiments. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory array 200 can be a NOR memory array, or the like. Each memory cell 202 may include a transistor 204 with an insulating, memory film 90 as a gate dielectric. In some embodiments, the transistor 204 may comprise a thin film transistor (TFT). In some embodiments, a gate of each transistor 204 is provided by a portion of a respective word line (e.g., conductive line 72) and a respective gate electrode 185, a first source/drain region of each transistor 204 is provided by a portion of a respective bit line (e.g., conductive line 106), and a second source/drain region of each transistor 204 is provided by a portion of a respective source line (e.g., conductive line 108), which electrically couples the second source/drain region to ground. The memory cells 202 in a same horizontal row of the memory array 200 may share a common word line while the memory cells 202 in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72.

The memory array 200 further includes a plurality of conductive lines 106 (e.g., bit lines) and conductive lines 108 (e.g., source lines). The conductive lines 106 and 108 may each extend in a direction perpendicular to the conductive lines 72.

Pairs of the conductive lines 106 and 108 along with an intersecting conductive line 72 define boundaries of each memory cell 202, and a dielectric material 102 is disposed between and isolates adjacent pairs of the conductive lines 106 and 108. In some embodiments, the conductive lines 108 are electrically coupled to ground. Although FIG. 1A illustrates a particular placement of the conductive lines 106 relative the conductive lines 108, it should be appreciated that the placement of the conductive lines 106 and 108 may be flipped in other embodiments.

As discussed above, the memory array 200 may also include an oxide semiconductor (OS) layer 92. The OS layer 92 may provide channel regions for the transistors 204 of the memory cells 202. For example, when an appropriate voltage (e.g., higher than a respective threshold voltage ($V_{th}$) of a corresponding transistor 204) is applied through a corresponding conductive line 72 and a corresponding gate electrode 185, a region of the OS layer 92 that intersects the conductive line 72 may allow current to flow from the conductive lines 106 to the conductive lines 108 (e.g., in the direction indicated by arrow 206).

A memory film 90 is disposed between the conductive lines 72 and the OS layer 92, and the memory film 90 may provide gate dielectrics for the transistors 204. In some embodiments, the memory film 90 comprises a ferroelectric material, such as a hafnium oxide, hafnium zirconium oxide, silicon-doped hafnium oxide, or the like. Accordingly, the memory array 200 may also be referred to as a ferroelectric random access memory (FERAM) array. Alternatively, the memory film 90 may be a multilayer structure comprising a layer of $SiN_x$ between two $SiO_x$ layers (e.g., an ONO structure), a different ferroelectric material, a different type of memory layer (e.g., capable of storing a bit), or the like.

In embodiments where the memory film 90 comprises a ferroelectric material, the memory film 90 may be polarized in one of two different directions, and the polarization direction may be changed by applying an appropriate voltage differential across the memory film 90 and generating an appropriate electric field. The polarization may be relatively localized (e.g., generally contained within each boundaries of the memory cells 202), and a continuous region of the memory film 90 may extend across a plurality of memory cells 202. Depending on a polarization direction of a particular region of the memory film 90, a threshold voltage of a corresponding transistor 204 varies, and a digital value (e.g., 0 or 1) can be stored. For example, when a region of the memory film 90 has a first electrical polarization direction, the corresponding transistor 204 may have a relatively low threshold voltage, and when the region of the memory film 90 has a second electrical polarization direction, the corresponding transistor 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory film 90 corresponding to the memory cell 202. The write voltage can be applied, for example, by applying appropriate voltages to a corresponding conductive line 72 (e.g., the word line), a corresponding gate electrode 185, and the corresponding conductive lines 106/108 (e.g., the bit line/source line). By applying the write voltage across the portion of the memory film 90, a polarization direction of the region of the memory film 90 can be changed. As a result, the corresponding threshold voltage of the corresponding transistor 204 can also be switched from a low threshold voltage to a high threshold voltage or vice versa, and a digital value can be stored in the memory cell 202. Because the conductive lines 72 intersect the conductive lines 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the word line) and a corresponding gate electrode 185. Depending on the polarization direction of the corresponding region of the memory film 90, the transistor 204 of the memory cell 202 may or may not be turned on. As a result, the conductive line 106 may or may not be discharged through the conductive line 108 (e.g., a source line that is coupled to ground), and the digital value stored in the memory cell 202 can be determined. Because the conductive lines 72 intersect the conductive lines 106 and 108, individual memory cells 202 may be selected for the read operation. In some embodiments, the gate electrode 185 is not used during read operations, and can be left floating during read operations.

FIGS. 1A, 1B, and 1C illustrate a gate dielectric layer 182 and the gate electrodes 185. The gate electrodes 185 may each extend in a direction perpendicular to the conductive lines 72. The gate dielectric layer 182 surrounds and isolates adjacent ones of the gate electrodes 185 from the source/drain electrodes (e.g., the conductive lines 106 and 108). Applying the write voltage during a write operation for a memory cell 202 also includes applying a biasing voltage to the gate electrode 185 corresponding to the memory cell 202. Applying the biasing voltage to the gate electrode 185 increases the write voltage applied across the portion of the memory film 90 corresponding to the memory cell 202. Increasing the write voltage applied during the write operation can help increase the speed and accuracy of the write operation. Further, because a biasing voltage is applied, the voltages applied to the conductive line 72 (e.g., the word line), the gate electrode 185, the conductive line 106 (e.g., the bit line), and the conductive line 108 (e.g., the source line) during the write operation may be decreased, resulting in an improved reliability of the memory array 200. In some embodiments, the gate electrodes 185 are not used during read operations, and can be left floating during read operations.

FIG. 1A further illustrates reference cross-sections of the memory array 200 that are used in later figures. Cross-section B-B' is along a longitudinal axis of conductive lines 72 and in a direction, for example, parallel to the direction of current flow of the transistors 204. Cross-section C-C' is perpendicular to cross-section B-B' and is parallel to a longitudinal axis of the conductive lines 72. Cross-section C-C' extends through the conductive lines 106. Cross-section D-D' is parallel to cross-section C-C' and extends through the dielectric material 102. Subsequent figures refer to these reference cross-sections for clarity.

Figure 2:
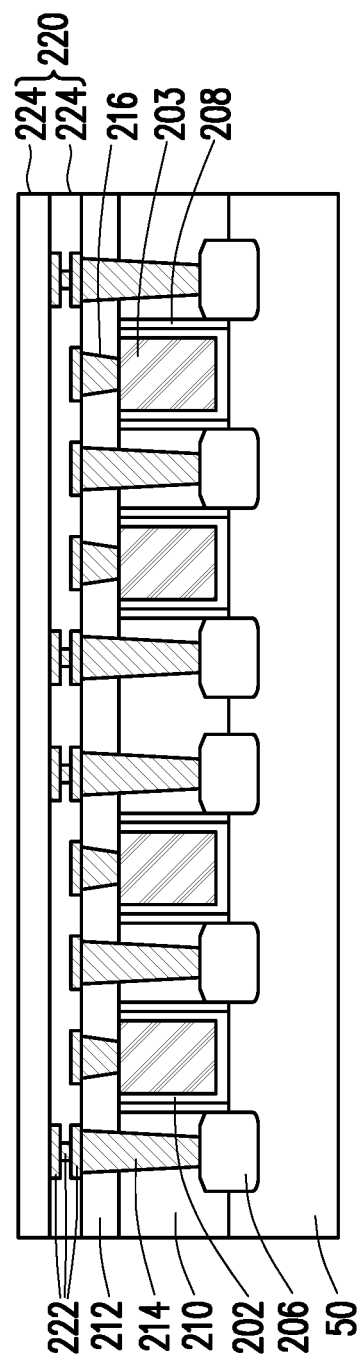
FIGS. 2, 3A, 3B, 4, 5, 6, 7, 8, 9, 10, 11, 12A, 12B, 13, 14, 15, 16, 17A, 17B, 18A, 18B, 19A, 19B, 20, 21, 22, 23A, 23B, 23C, 24A, 24B, 24C, 25A, 25B, 25C, 26A, 26B, 26C, 27A, 27B, 27C, 28A, 28B, 28C, 29A, 29B, 29C, 29D, 30A, 30B, 30C and 30D illustrate varying views of manufacturing a memory array in accordance with some embodiments.

FIGS. 2 through 30D illustrate intermediate steps that may be used to form the memory array 200 of FIG. 1. In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include active devices (e.g., transistors) at a top surface of the substrate 50. The transistors may include gate dielectric layers 202 over top surfaces of the substrate 50 and gate electrodes 203 over the gate dielectric layers 202. Source/drain regions 206 are disposed in the substrate 50 on opposite sides of the gate dielectric layers 202 and the gate electrodes 203. Gate spacers 208 are formed along sidewalls of the gate dielectric layers 202 and separate the source/drain regions 206 from the gate electrodes 203 by appropriate lateral distances. In some embodiments, the transistors may be planar field effect transistors (FETs), fin field effect transistors (finFETs), nano-field effect transistors (nanoFETs), or the like.

A first ILD 210 surrounds and isolates the source/drain regions 206, the gate dielectric layers 202, and the gate electrodes 203 and a second ILD 212 is over the first ILD 210. Source/drain contacts 214 extend through the second ILD 212 and the first ILD 210 and are electrically coupled to the source/drain regions 206 and gate contacts 216 extend through the second ILD 212 and are electrically coupled to the gate electrodes 203. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 220 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
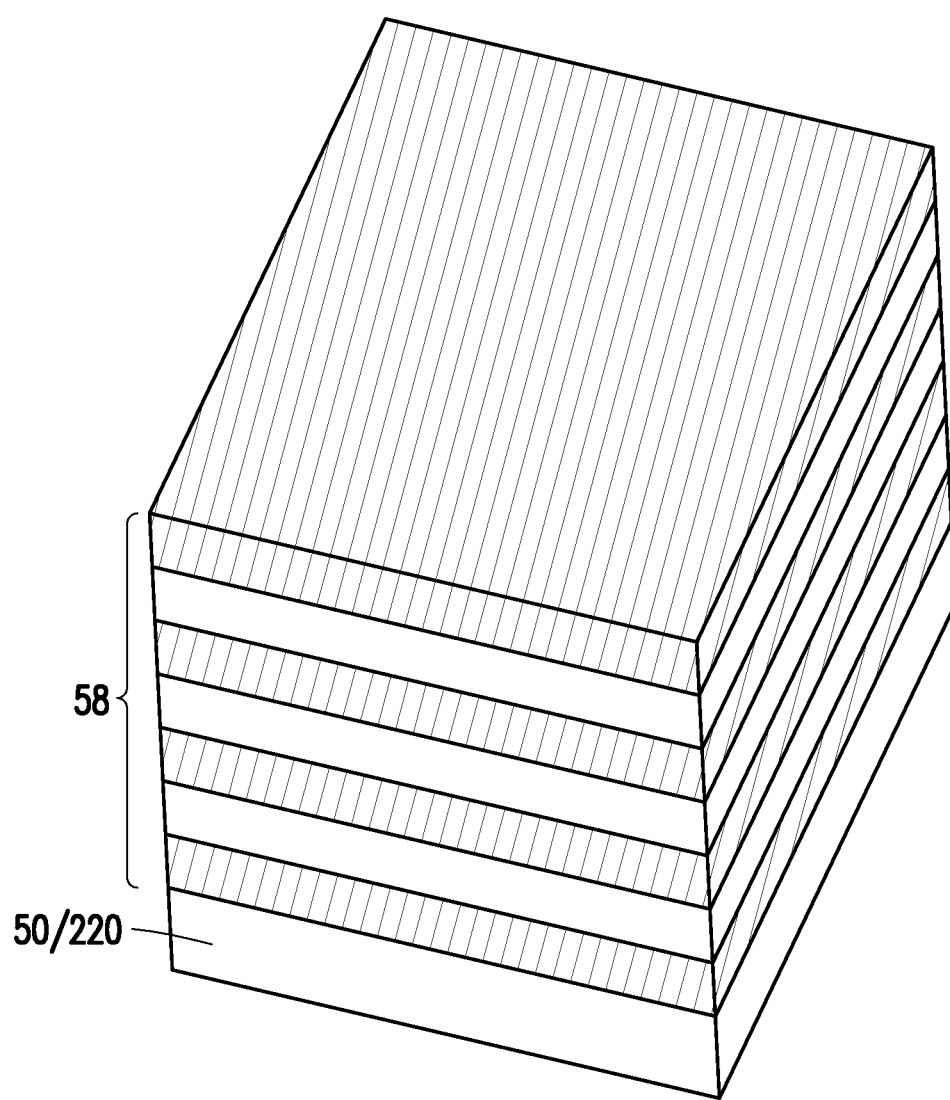
Figure 3B:
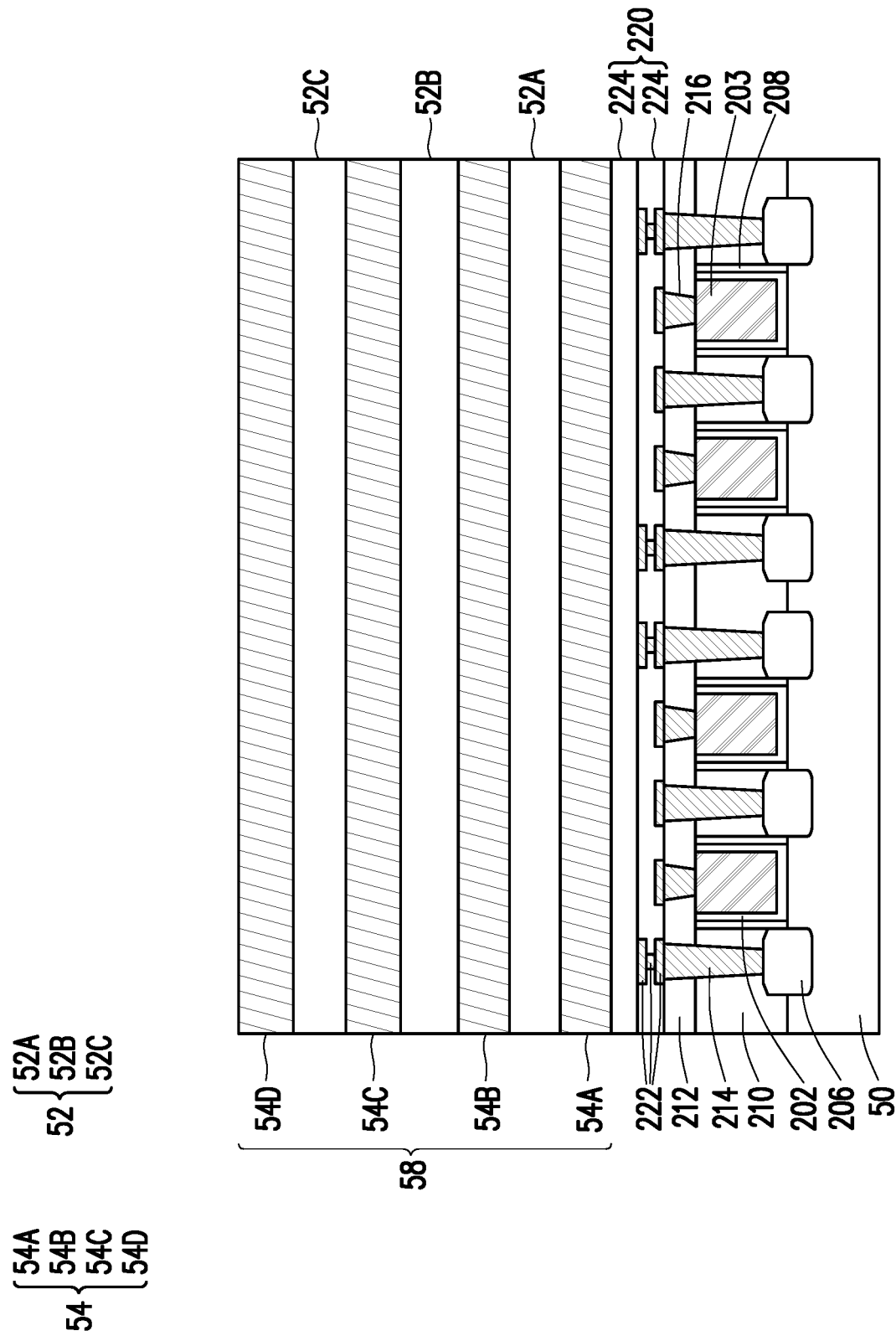

In FIGS. 3A and 3B, a multi-layer stack 58 is formed over the structure of FIG. 2. The substrate 50, the transistors, the ILDs, and the interconnect structure 220 may be omitted from subsequent drawings for the purposes of simplicity and clarity. Although the multi-layer stack 58 is illustrated as contacting the dielectric layers 224 of the interconnect structure 220, any number of intermediate layers may be disposed between the substrate 50 and the multi-layer stack 58. For example, one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of conductive lines 54A-D (collectively referred to as conductive layers 54) and dielectric layers 52A-C (collectively referred to as dielectric layers 52). The conductive layers 54 may be patterned in subsequent steps to define the conductive lines 72 (e.g., word lines). The conductive layers 54 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and dielectric layers 52 may be each formed using, for example, chemical vapor deposition (CVD), atomic layer deposition (ALD), physical vapor deposition (PVD), plasma enhanced CVD (PECVD), or the like. Although FIGS. 3A and 3B illustrate a particular number of conductive layers 54 and dielectric layers 52, other embodiments may include a different number of conductive layers 54 and dielectric layers 52.

FIGS. 4 through 12B are views of intermediate stages in the manufacturing a staircase structure of the memory array 200, in accordance with some embodiments. FIGS. 4 through 11 and 12B are illustrated along reference cross-section B-B' illustrated in FIG. 1. FIG. 12A is illustrated in a three-dimensional view.

Figure 4:
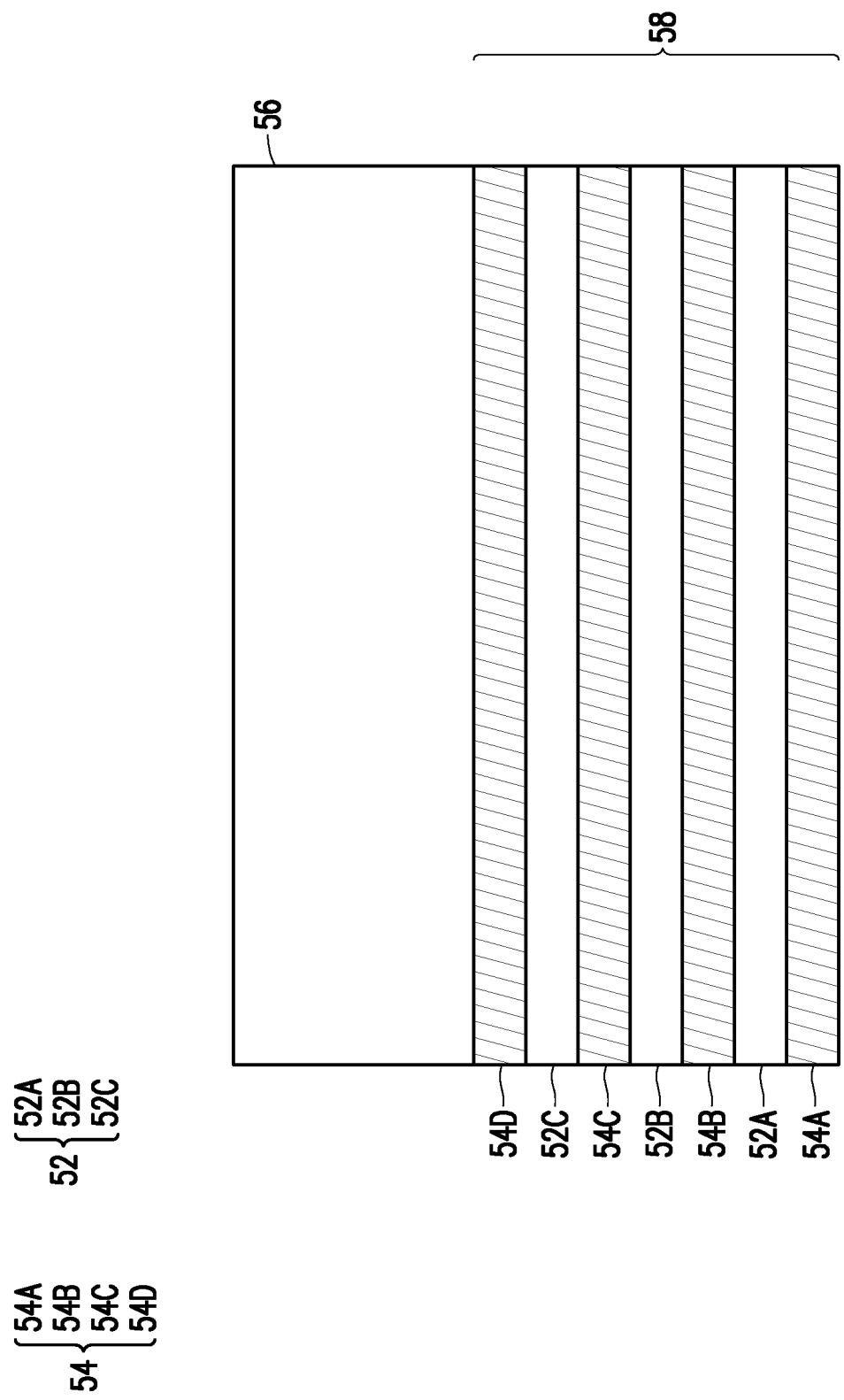

In FIG. 4 a photoresist 56 is formed over the multi-layer stack 58. As discussed above, the multi-layer stack 58 may comprise alternating layers of the conductive layers 54 (labeled 54A, 54B, 54C, and 54D) and the dielectric layers 52 (labeled 52A, 52B, and 52C). The photoresist 56 can be formed by using a spin-on technique.

Figure 5:
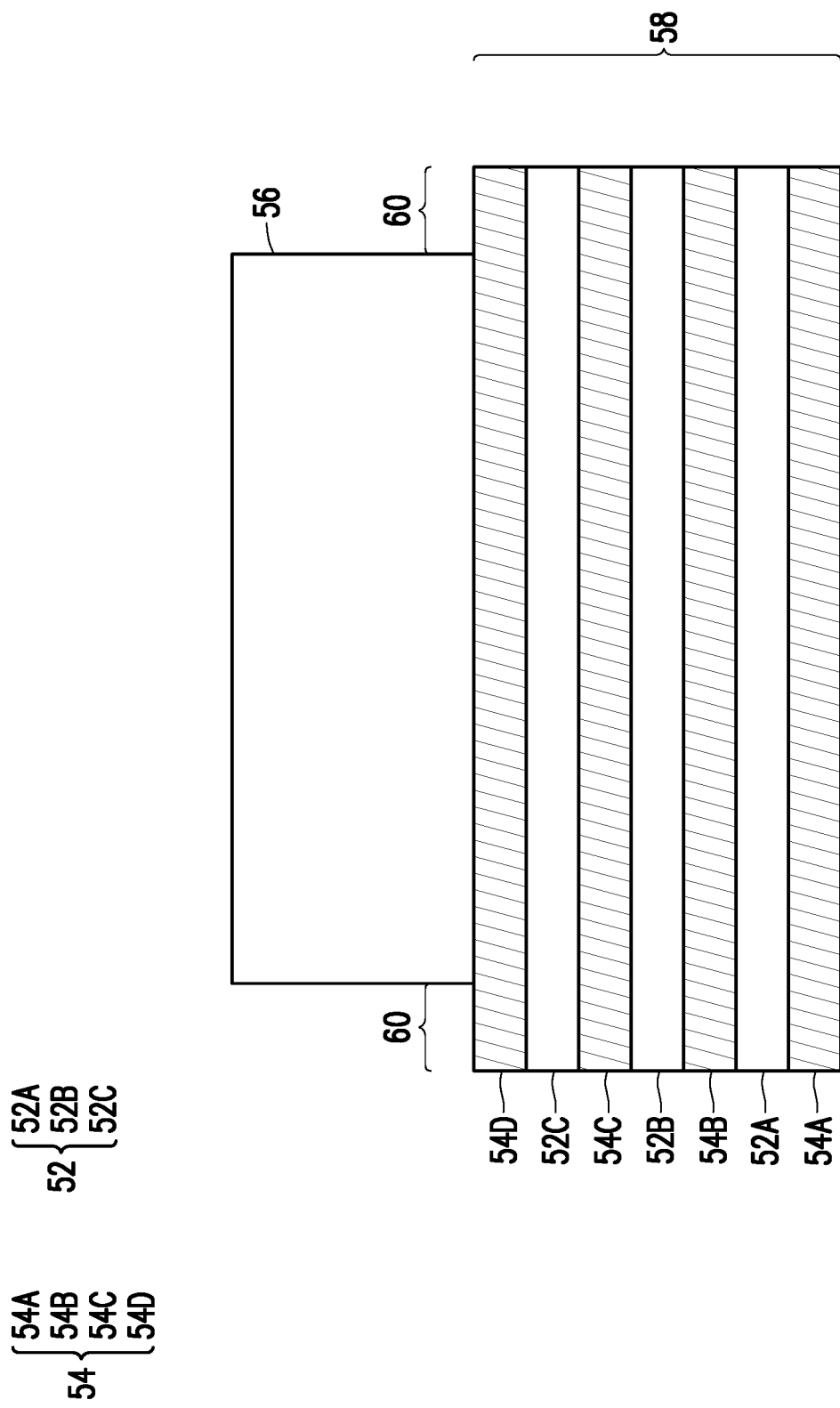
Figure 6:
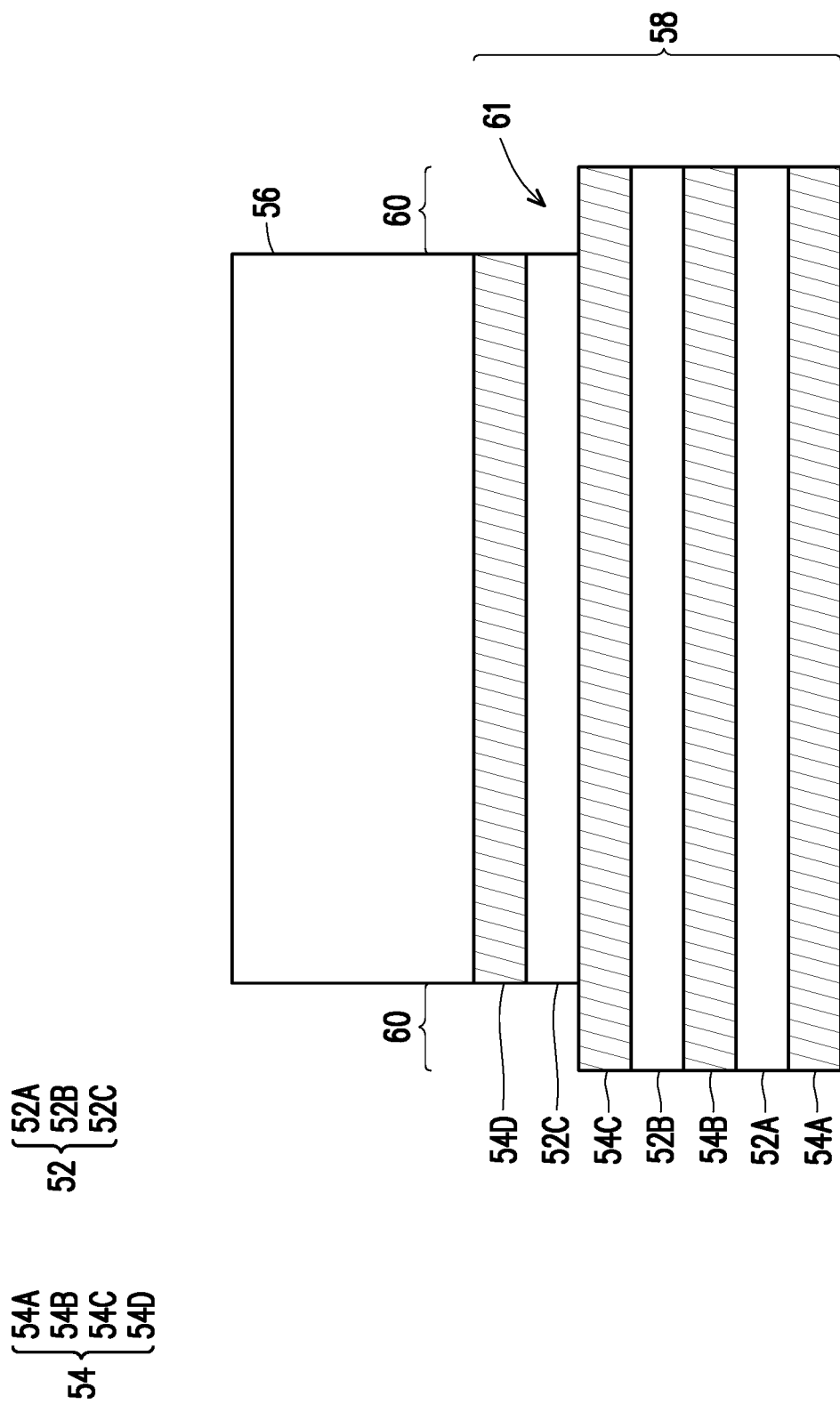

In FIG. 5, the photoresist 56 is patterned to expose the multi-layer stack 58 in regions 60 while masking remaining portions of the multi-layer stack 58. For example, a topmost layer of the multi-layer stack 58 (e.g., conductive layer 54D) may be exposed in the regions 60. The photoresist 56 may be patterned using acceptable photolithography techniques In FIG. 6, the exposed portions of the multi-layer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the conductive layer 54D and dielectric layer 52C in the regions 60 and define openings 61. Because the conductive layer 54D and the dielectric layer 52C have different material compositions, etchants used to remove exposed portions of these layers may be different. In some embodiments, the dielectric layer 52C acts as an etch stop layer while etching the conductive layer 54D, and the conductive layer 54C acts as an etch stop layer while etching dielectric layer 52C. As a result, the portions of the conductive layer 54E and the conductive layer 54D may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the conductive layer 54C is exposed in the regions 60.

Figure 7:
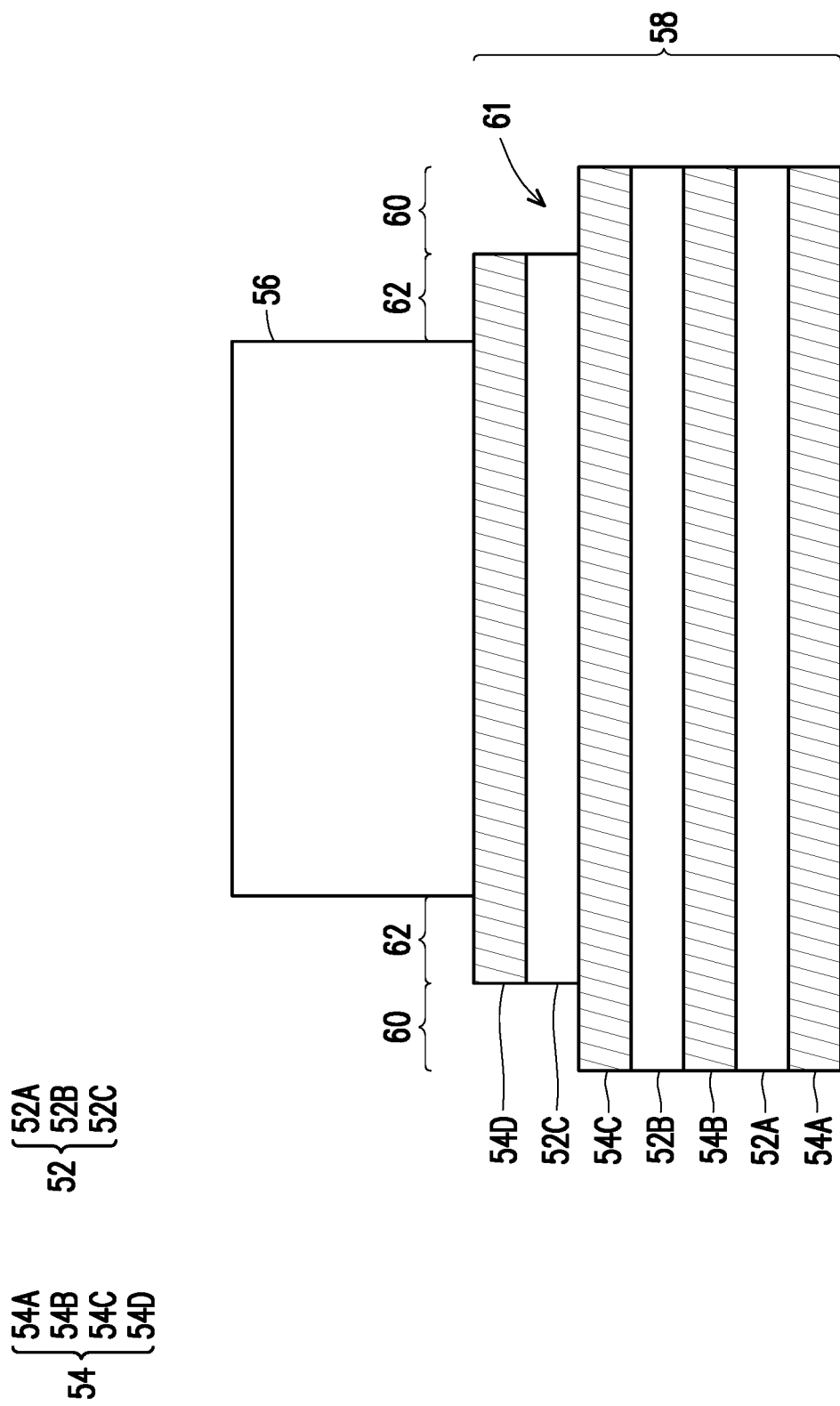

In FIG. 7, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 and 62 may be exposed. For example, a top surface of the conductive layer 54C may be exposed in the regions 60, and a top surface of the conductive layer 54D may be exposed in the regions 62.

Figure 8:
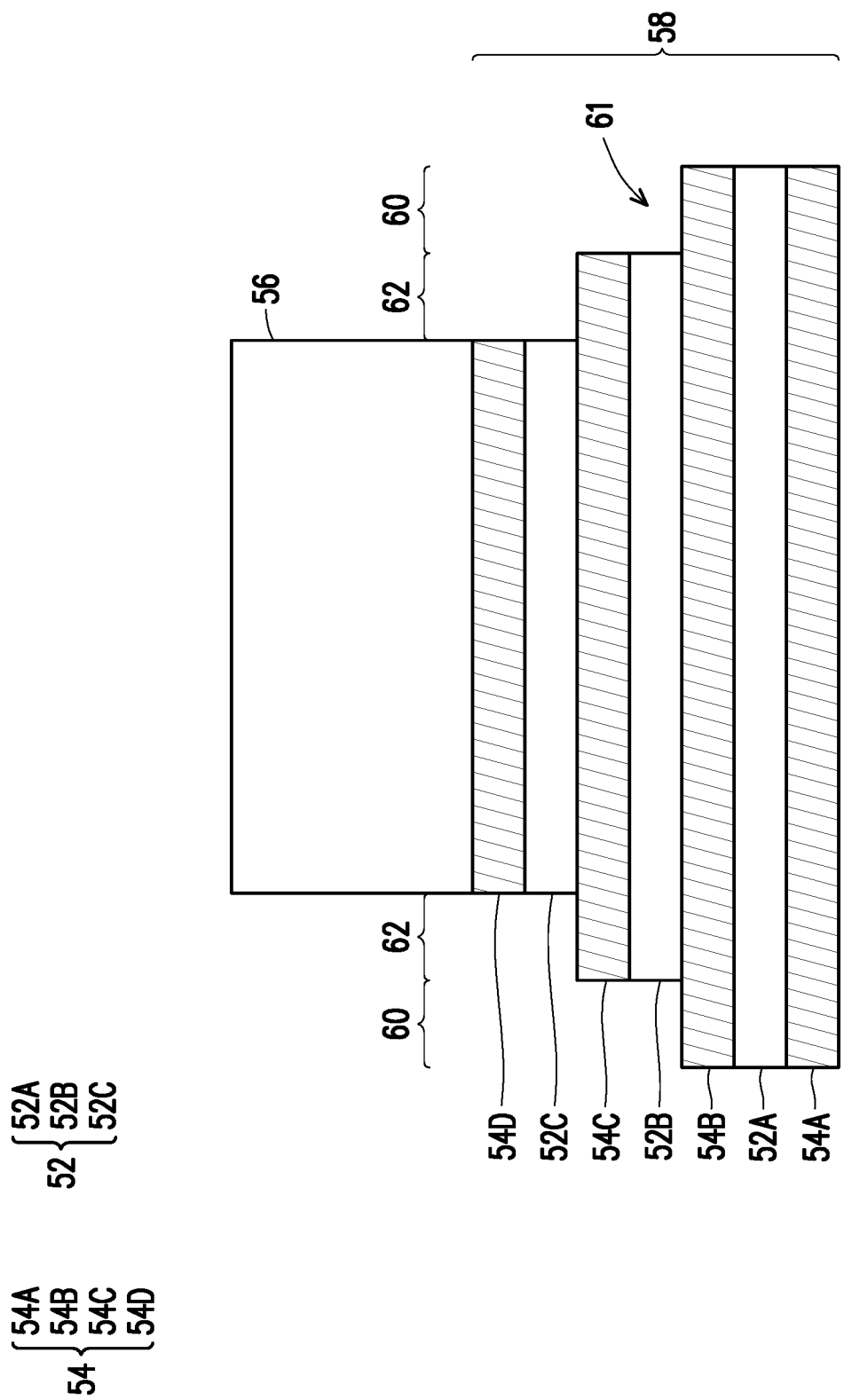

In FIG. 8, portions of the conductive layer 54D, the dielectric layer 52C, the conductive layer 54C, and the dielectric layer 52B in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the conductive layers 54D/54C and the dielectric layers 52C/52B have different material compositions, etchants used to remove exposed portions of these layers may be different. In some embodiments, the dielectric layer 52C acts as an etch stop layer while etching the conductive layer 54D; the conductive layer 54C acts as an etch stop layer while etching dielectric layer 52C; the dielectric layer 52B acts as an etch stop layer while etching the conductive layer 54C; and the conductive layer 54B acts as an etch stop layer while etching the dielectric layer 52B. As a result, portions of the conductive layers 54D/54C and the dielectric layer 52C/52B may be selectively removed without removing remaining layers of the multi-layer stack 58, and the openings 61 may be extended to a desired depth. Further, during the etching processes, unetched portions of the conductive layers 54 and dielectric layers 52 act as a mask for underlying layers, and as a result a previous pattern of the conductive layer 54D and dielectric layer 52C (see FIG. 7) may be transferred to the underlying conductive layer 54C and dielectric layer 52B. In the resulting structure, the conductive layer 54B is exposed in the regions 60, and the conductive layer 54C is exposed in the regions 62.

Figure 9:
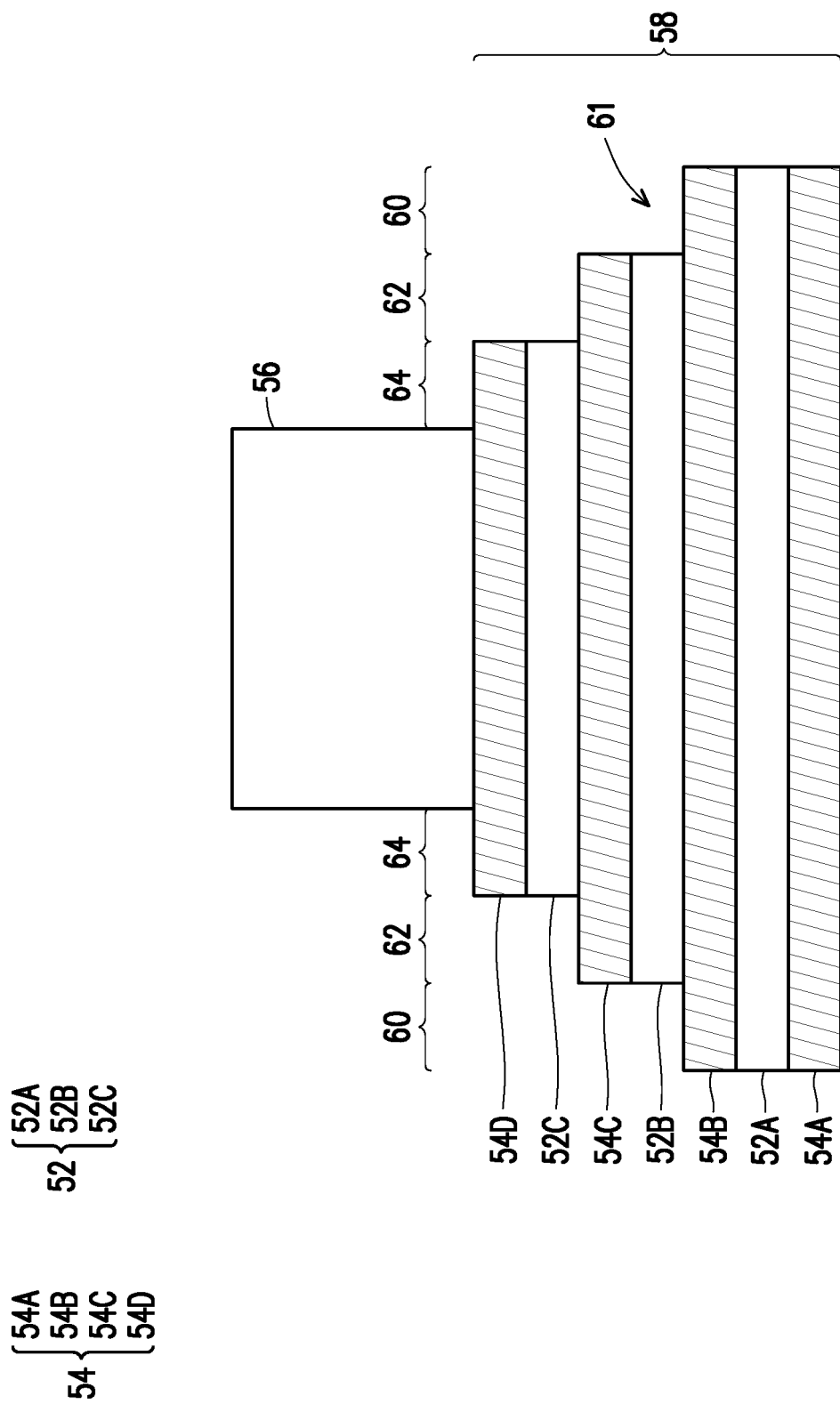

In FIG. 9, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60, 62, and 64 may be exposed. For example, a top surface of the conductive layer 54B may be exposed in the regions 60; a top surface of the conductive layer 54C may be exposed in the regions 62; and a top surface of the conductive layer 542D may be exposed in the regions 64.

Figure 10:
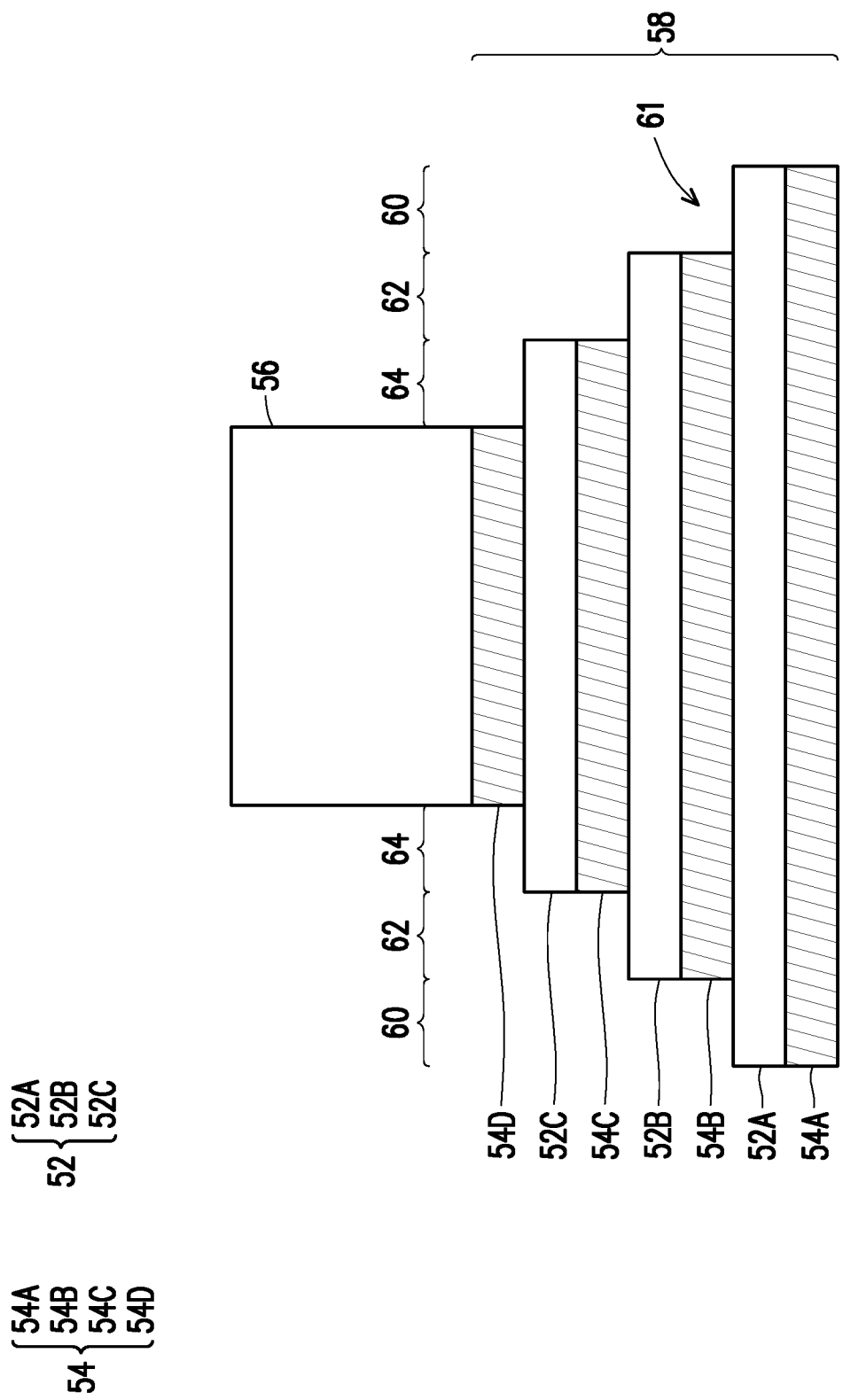

In FIG. 10, portions of the conductive layers 54D, 54C, and 54B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. In some embodiments, the dielectric layer 52C acts as an etch stop layer while etching the conductive layer 54D; the dielectric layer 52B acts as an etch stop layer while etching the conductive layer 54C; and the dielectric layer 52A acts as an etch stop layer etching the conductive layer 54B. As a result, portions of the conductive layers 54D, 54C, and 54B may be selectively removed without removing remaining layers of the multi-layer stack 58, and the openings 61 may be extended to a desired depth. Further, during the etching processes, each of the dielectric layers 52 act as a mask for underlying layers, and as a result a previous pattern of the dielectric layers 52C/52B (see FIG. 9) may be transferred to the underlying conductive layers 54C/54B. In the resulting structure, the dielectric layer 52A is exposed in the regions 60; the dielectric layer 52B is exposed in the regions 62; and the dielectric layer 52C is exposed in the regions 64.

Figure 11:
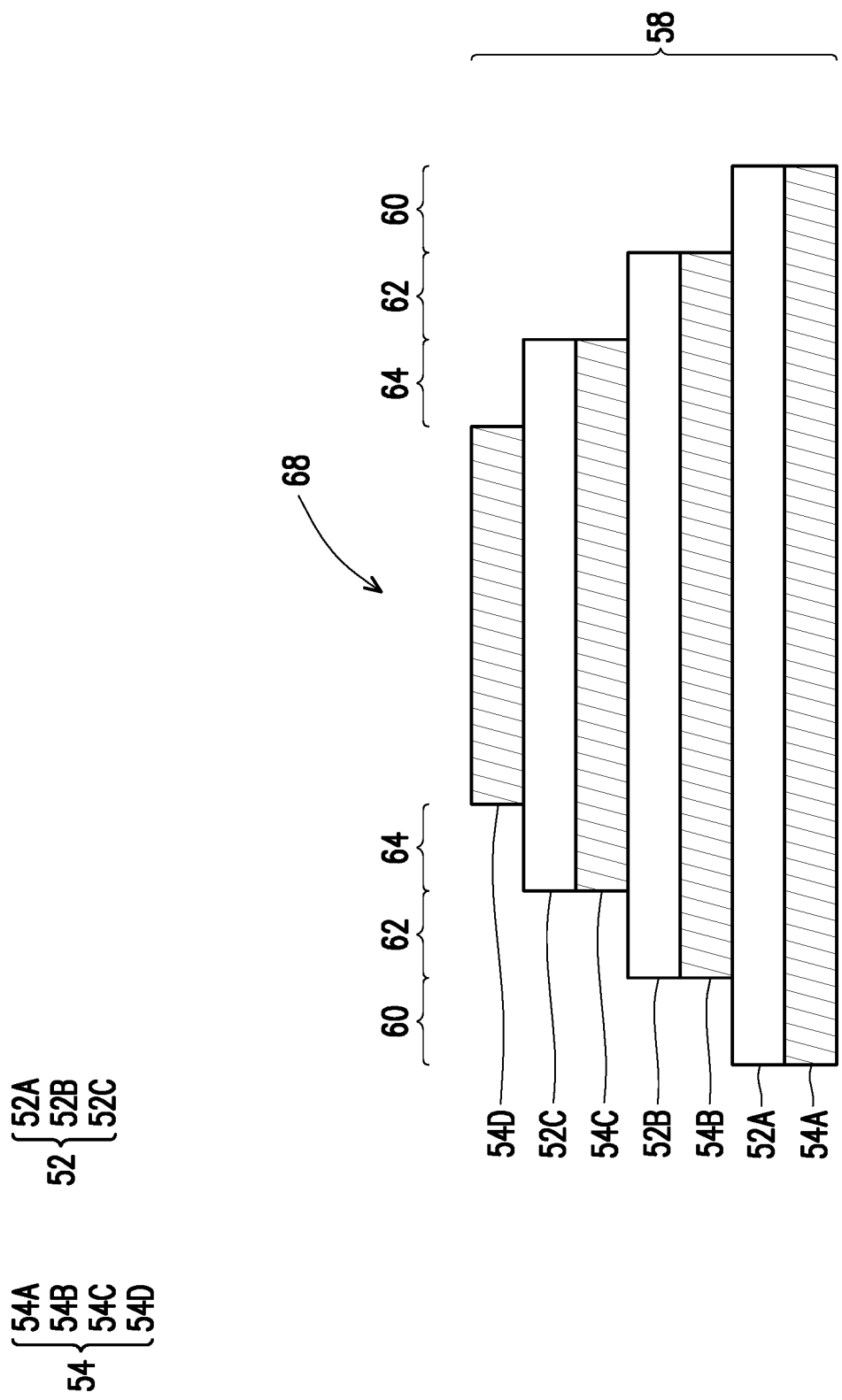

In FIG. 11, the photoresist 56 may be removed, such as by an acceptable ashing or wet strip process. Thus, a staircase structure 68 is formed. The staircase structure comprises a stack of alternating ones of the conductive layers 54 and the dielectric layers 52. Lower conductive layers 54 are wider and extend laterally past upper conductive layers 54, and a width of each of the conductive layers 54 increases in a direction towards the substrate 50. For example, the conductive layer 54A may longer than the conductive layer 54B; the conductive layer 54B may be longer than the conductive layer 54C; and the conductive layer 54C may be longer than the conductive layer 54D. As a result, conductive contacts can be made from above the staircase structure 68 to each of the conductive layers 54 in subsequent processing steps.

Figure 12A:
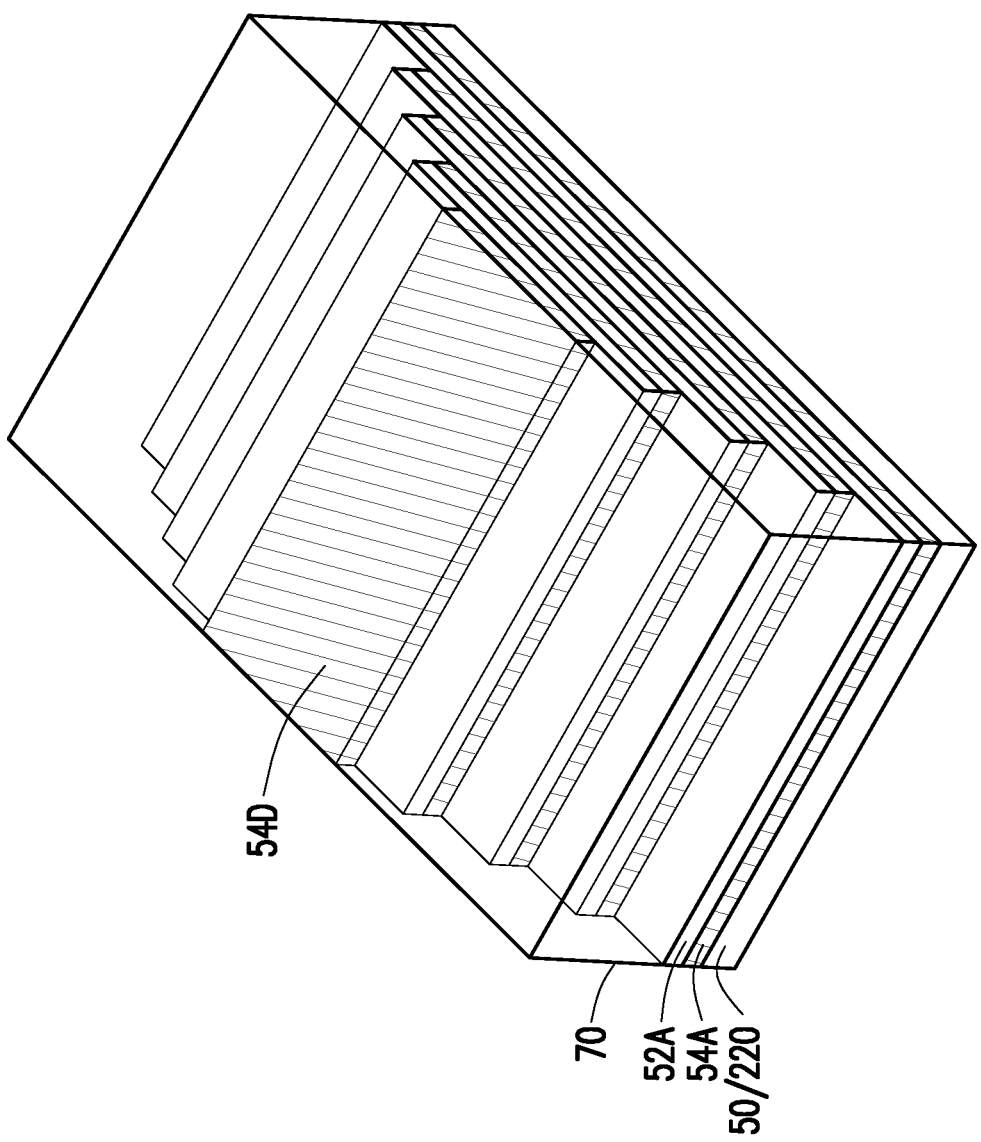
Figure 12B:
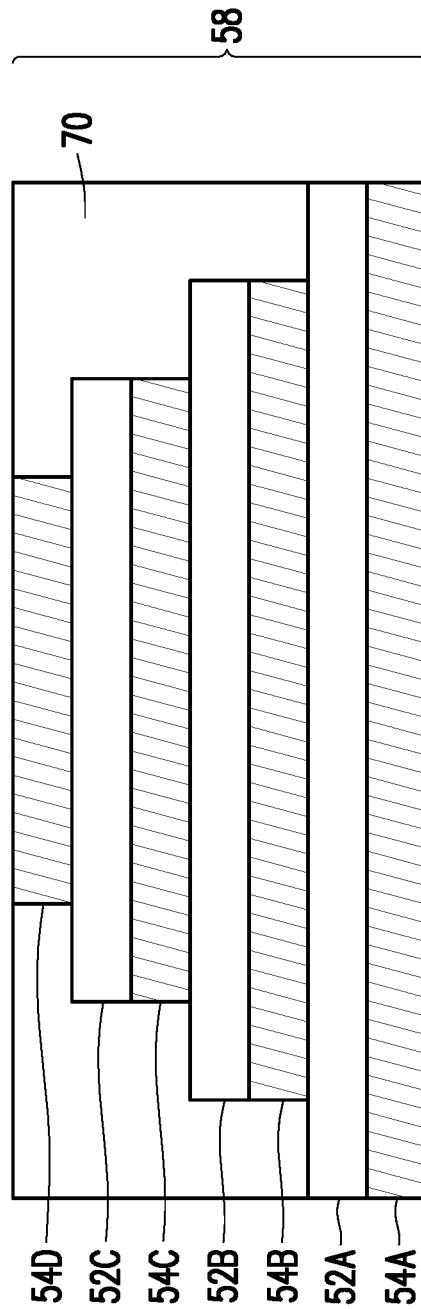

In FIGS. 12A and 12B, an inter-metal dielectric (IMD) 70 is deposited over the multi-layer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 70 extends along sidewalls of the conductive layers 54 as well as sidewalls of the dielectric layers 52. Further, the IMD 70 may contact top surfaces of each of the dielectric layers 52.

As further illustrated in FIG. 12B, a removal process is then applied to the IMD 70 to remove excess dielectric material over the multi-layer stack 58. In some embodiments, a planarization process such as a chemical mechanical polish (CMP), an etch-back process, combinations thereof, or the like may be utilized. The planarization process exposes the multi-layer stack 58 such that top surfaces of the multi-layer stack 58 and IMD 70 are level after the planarization process is complete.

FIGS. 13 through 17B are views of intermediate stages in the manufacturing of the memory array 200, in accordance with some embodiments. In FIGS. 13 through 17B the multi-layer stack 58 is formed and trenches are formed in the multi-layer stack 58, thereby defining the conductive lines 72. The conductive lines 72 may correspond to word lines in the memory array 200, and the conductive lines 72 may further provide gate electrodes for the resulting transistors of the memory array 200. FIG. 17A is illustrated in a three-dimensional view. FIGS. 13 through 16 and 17B are illustrated along reference cross-section C-C' illustrated in FIG. 1A.

Figure 13:
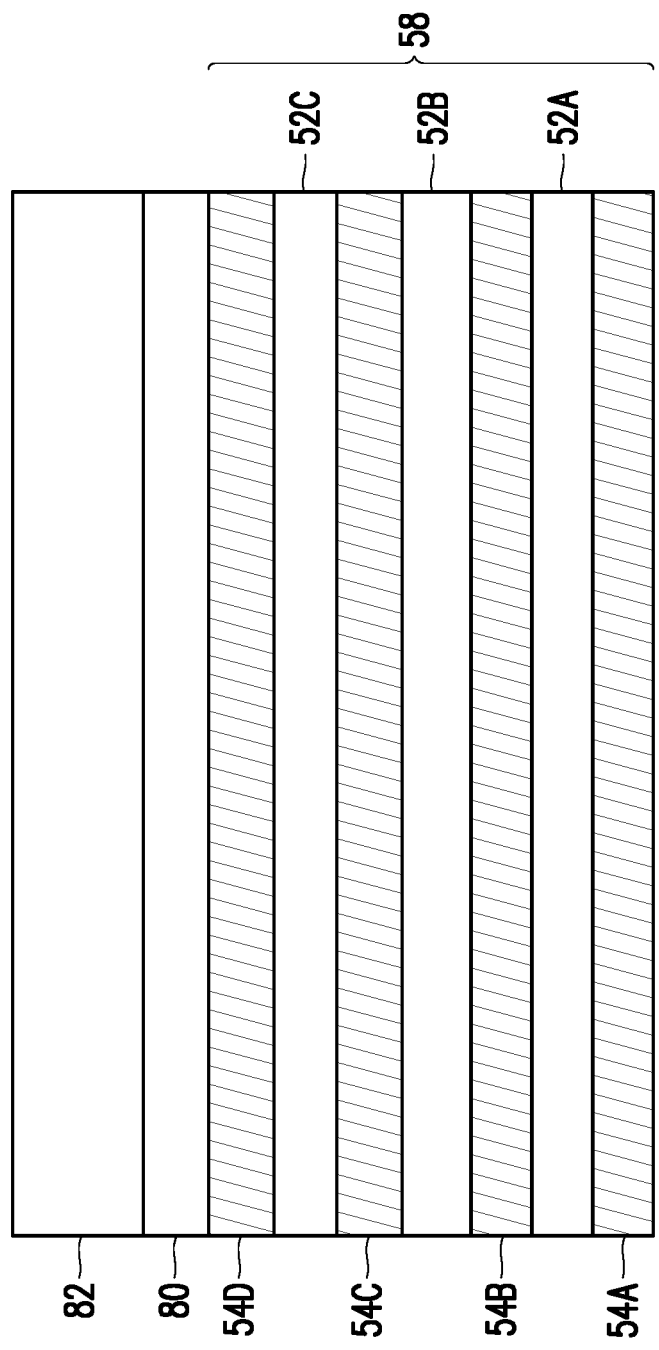

In FIG. 13, a hard mask 80 and a photoresist 82 are deposited over the multi-layer stack 58. The hard mask layer 80 may include, for example, silicon nitride, silicon oxynitride, or the like, which may be deposited by CVD, PVD, ALD, PECVD, or the like. The photoresist 82 can be formed by using a spin-on technique, for example.

Figure 14:
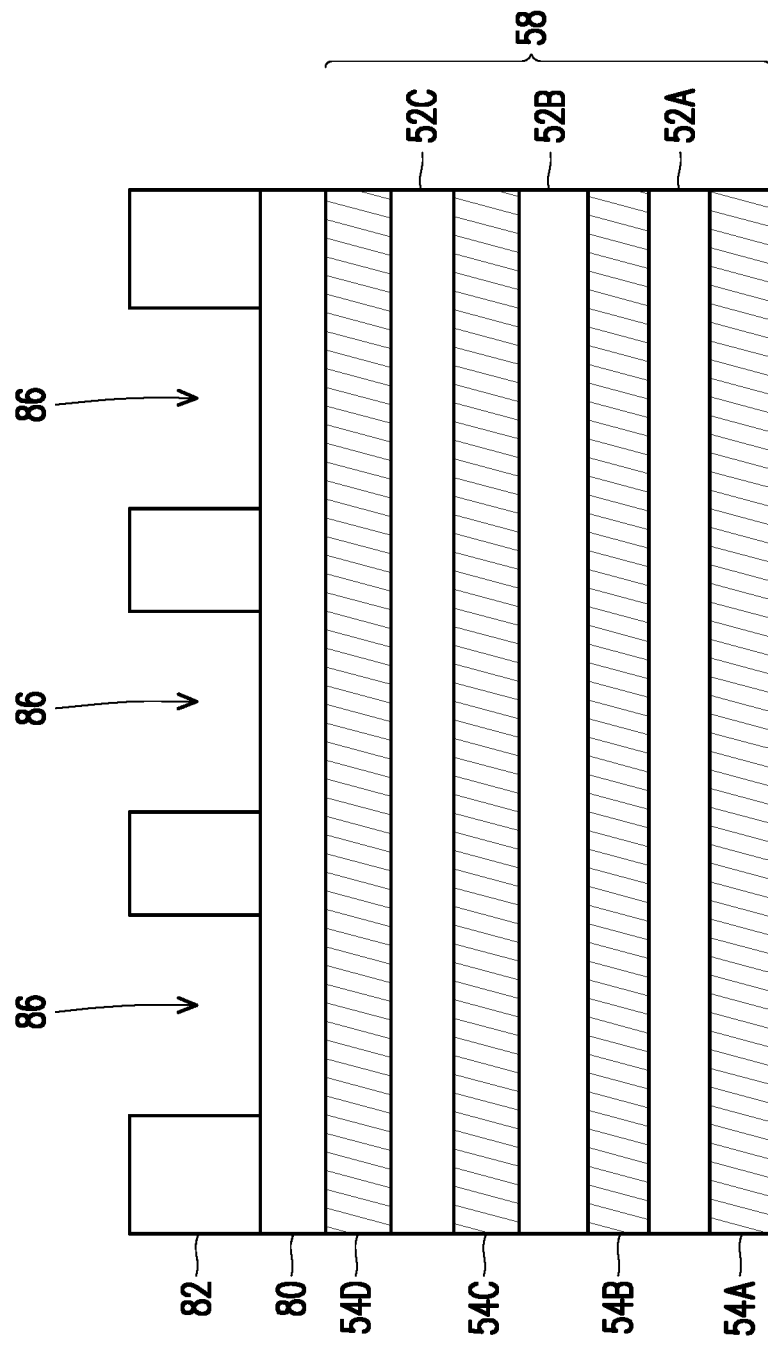

In FIG. 14, the photoresist 82 is patterned to form trenches 86. The photoresists can be patterned using acceptable photolithography techniques. For example, the photoresist 82 be exposed to light for patterning. After the exposure process, the photoresist 82 may be developed to remove exposed or unexposed portions of the photo resist depending on whether a negative or positive resist is used, thereby defining a patterning of the form trenches 86.

Figure 15:
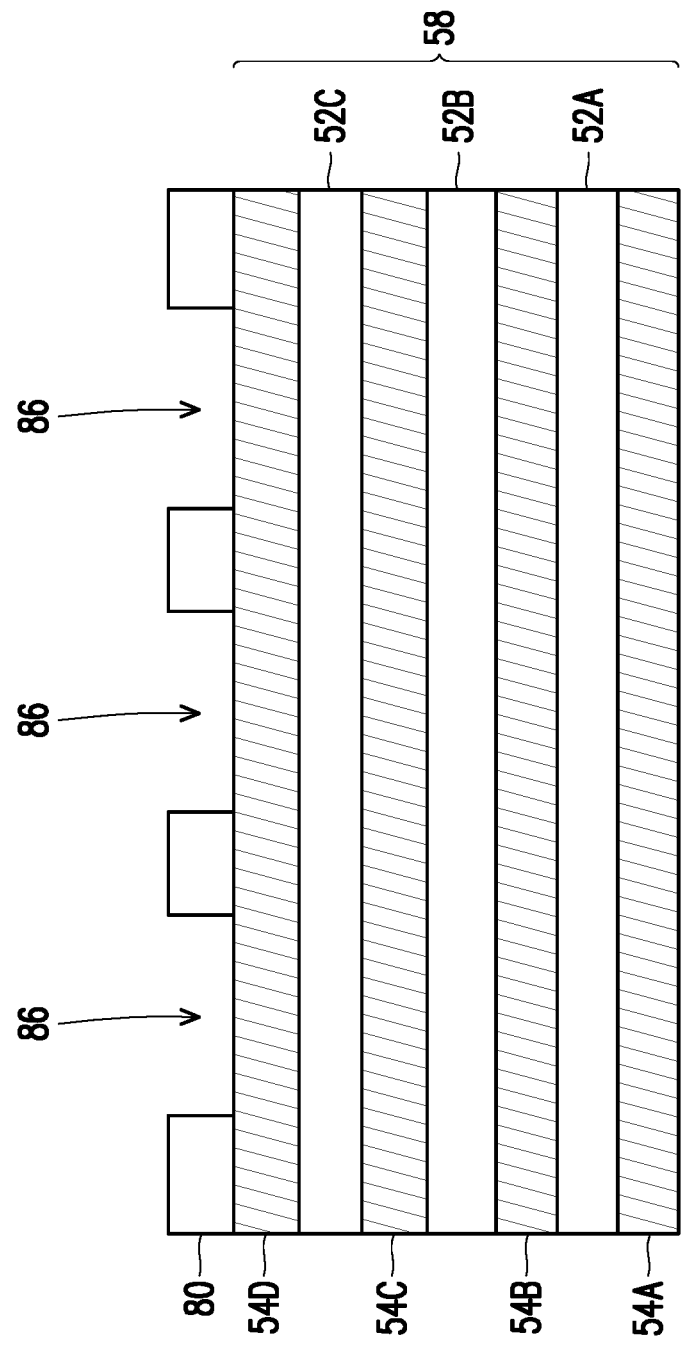

In FIG. 15, a pattern of the photoresist 82 is transferred to the hard mask 80 using an acceptable etching process, such as by wet or dry etching, a reactive ion etch (RIE), neutral beam etch (NBE), the like, or a combination thereof. The etching may be anisotropic. Thus, trenches 86 are formed extending through the hard mask 80. The photoresist 82 may be removed by an ashing process, for example.

Figure 16:
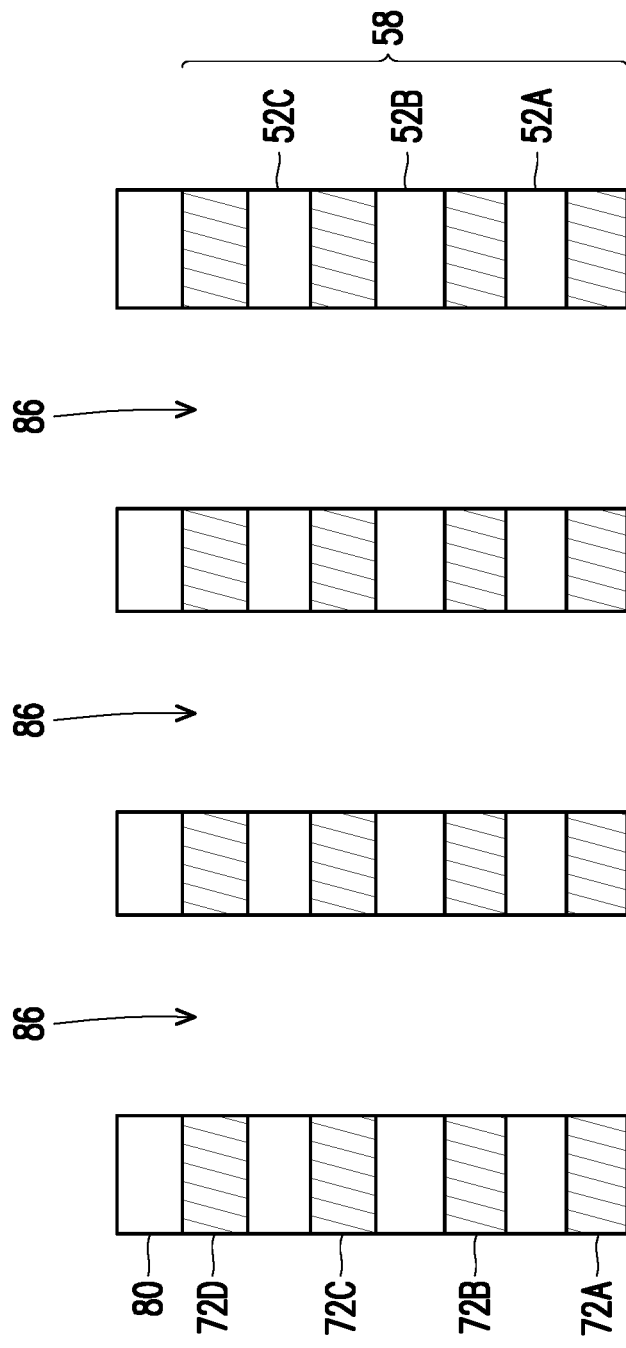
Figure 17A:
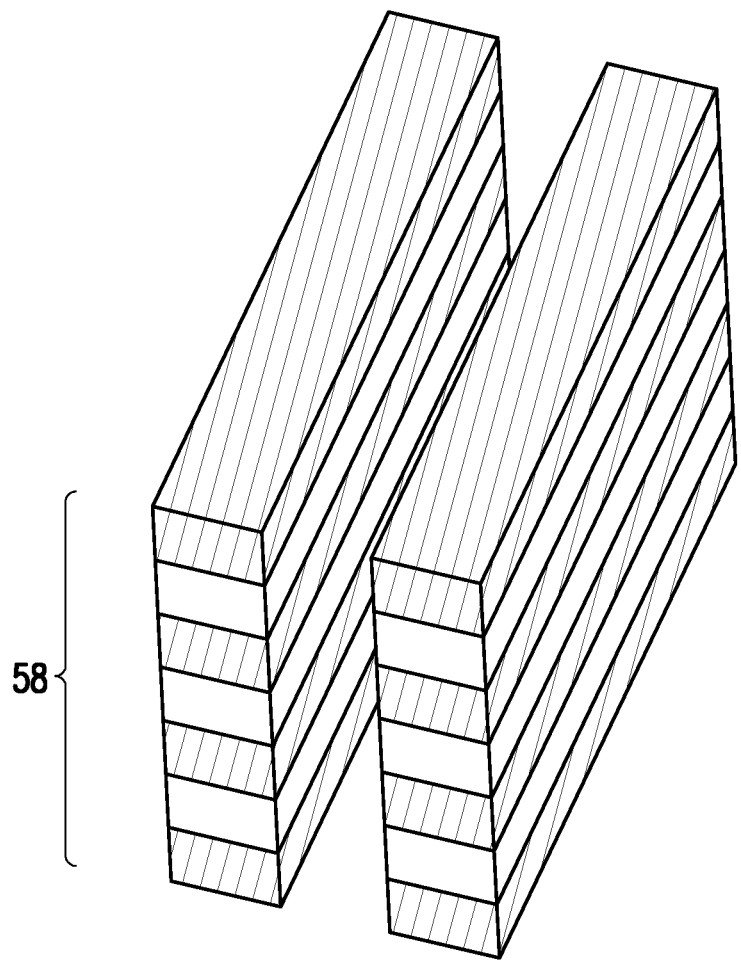
Figure 17B:
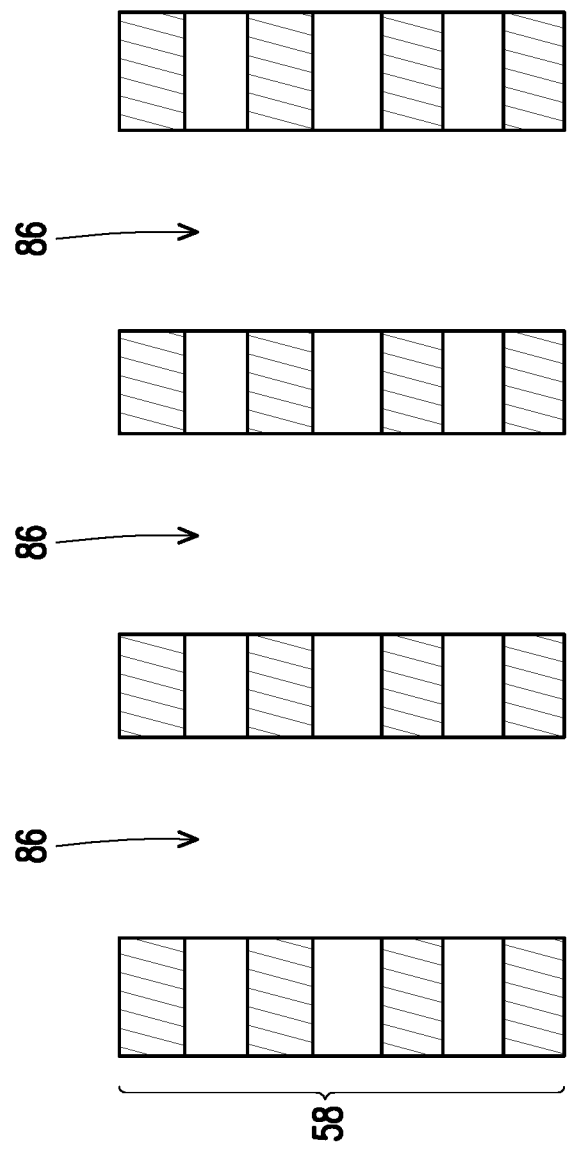

In FIG. 16, a pattern of the hard mask 80 is transferred to the multi-layer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multi-layer stack 58, and the conductive lines 72 (e.g., word lines) are formed from the conductive layers 54. By etching trenches 86 through the conductive layers 54, adjacent conductive lines 72 can be separated from each other. Subsequently, in FIGS. 17A and 17B, the hard mask 80 may then be removed by an acceptable process, such as a wet etching process, a dry etching process, a planarization process, combinations thereof, or the like. Due to the staircase shape of the multi-layered stack 58 (see e.g., FIGS. 12A and 12B), the conductive lines 72 may have varying lengths that increase in a direction towards the substrate 50. For example, the conductive lines 72A may be longer than the conductive lines 72B; the conductive lines 72B may be longer than the conductive lines 72C; and the conductive lines 72C may be longer than the conductive lines 72D.

Figure 18A:
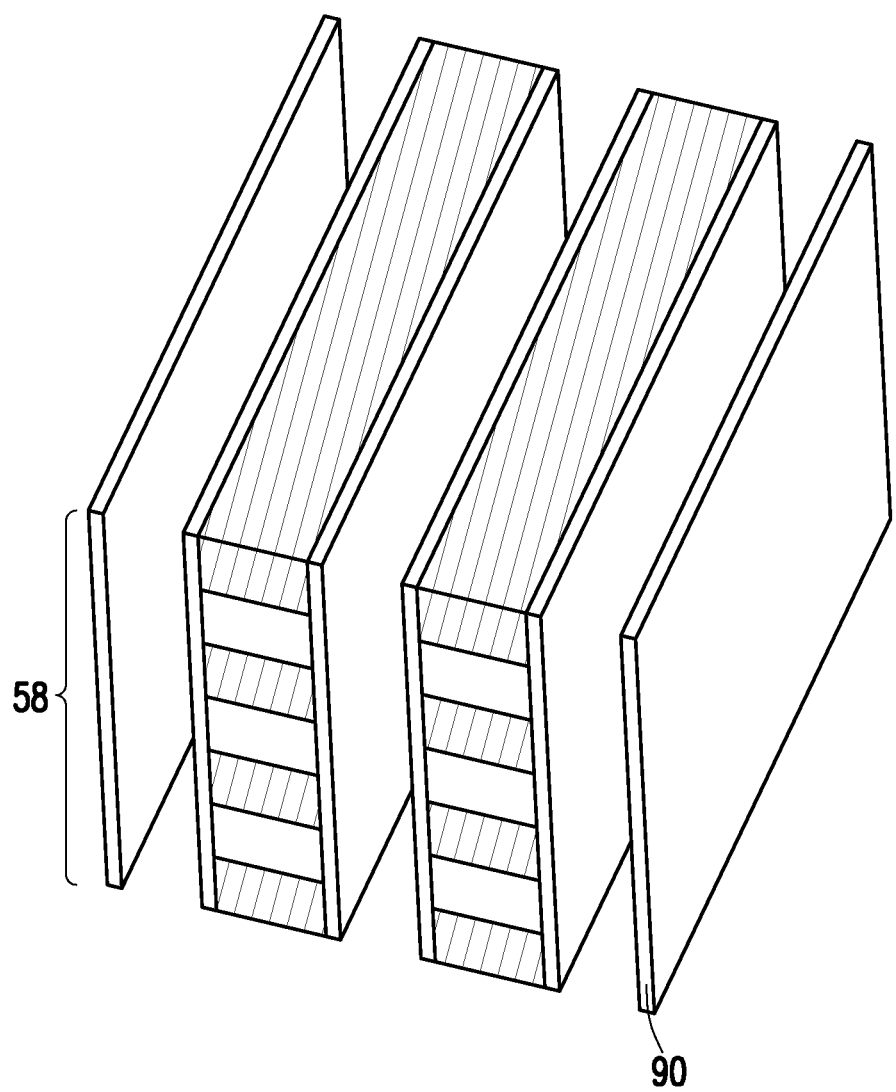
Figure 21:
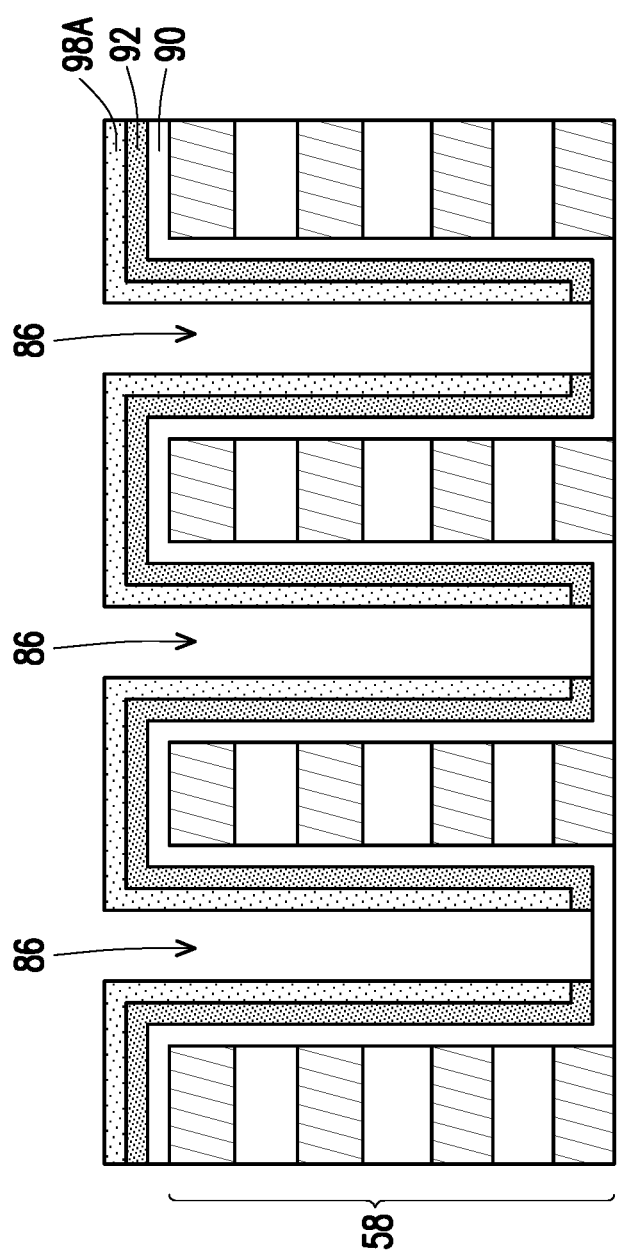
Figure 22:
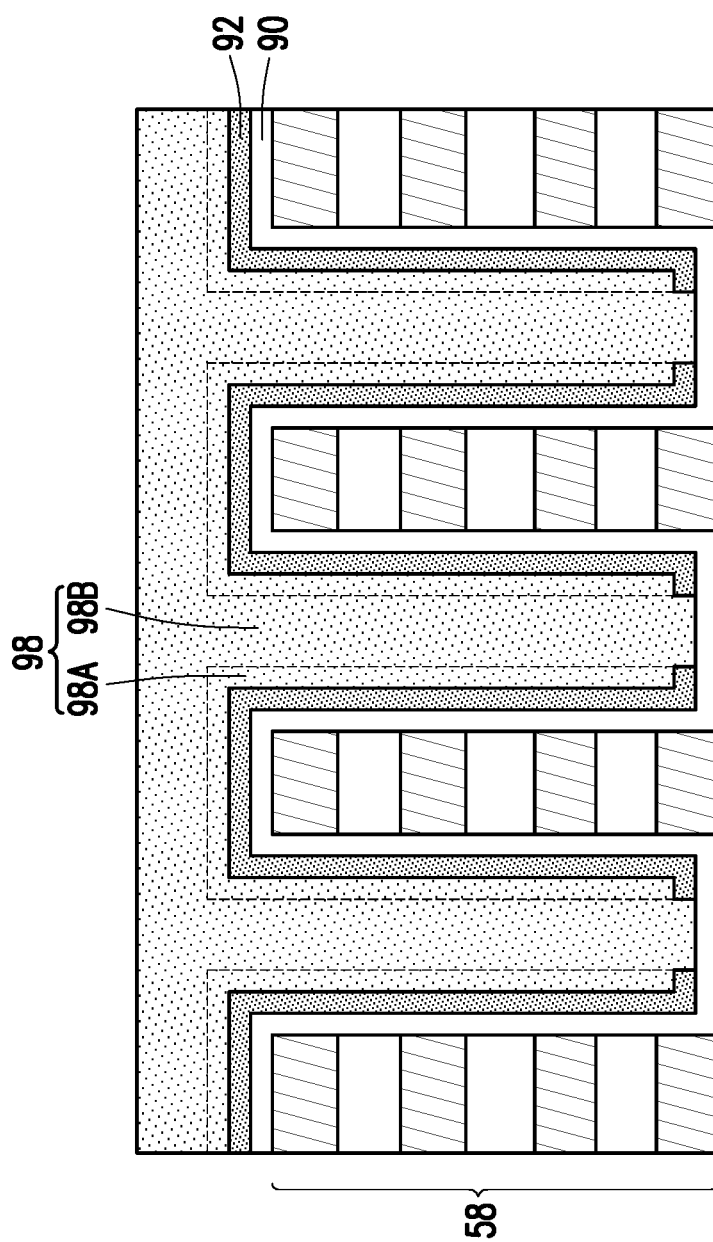
Figure 23A:
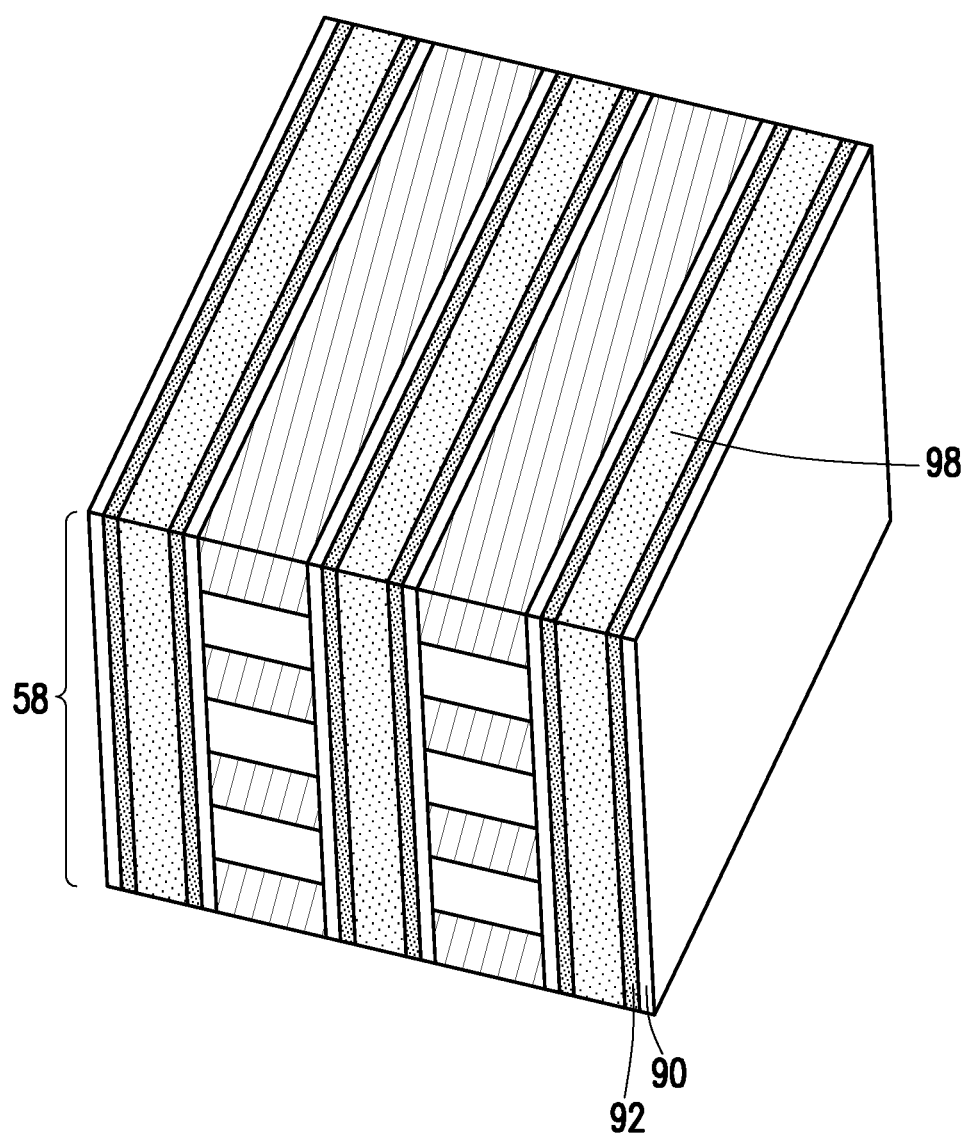
Figure 23B:
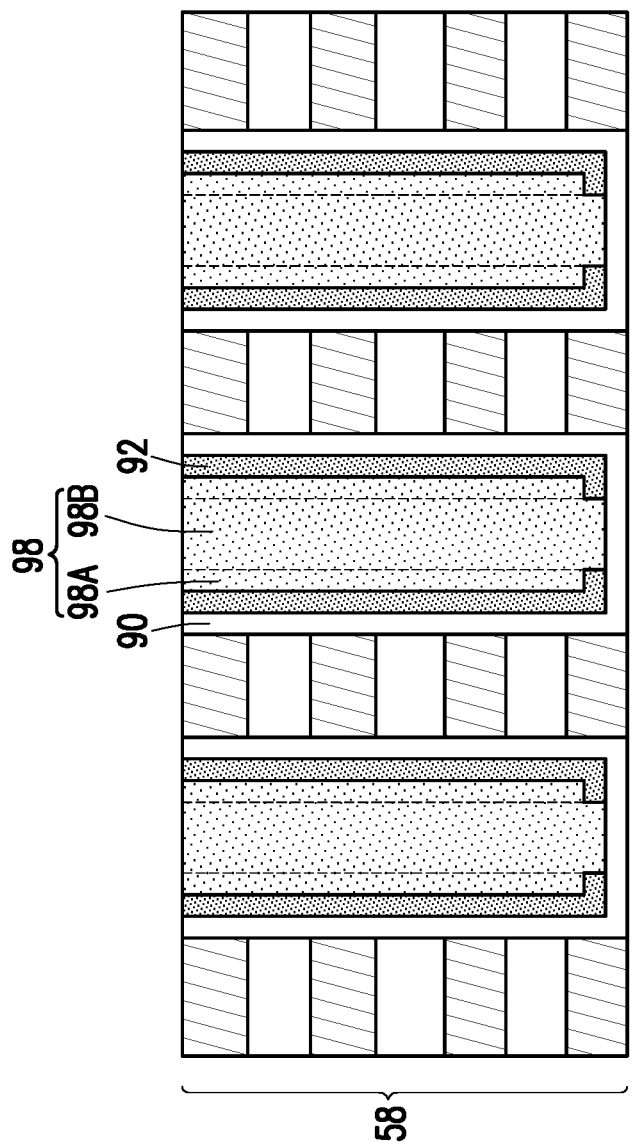
Figure 23C:
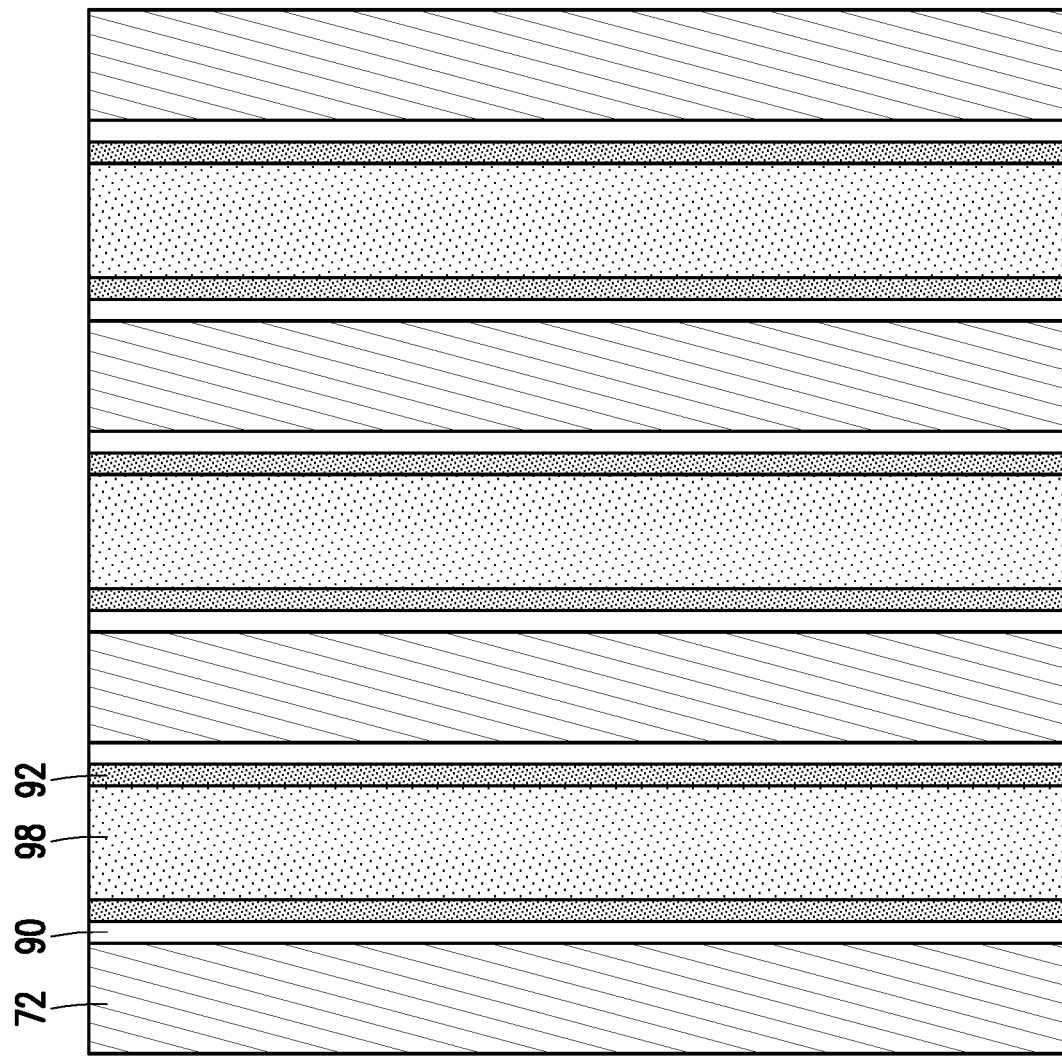

FIGS. 18A through 23C illustrate forming and patterning channel regions for the transistors 204 (see FIG. 1A) in the trenches 86. FIGS. 18A, 19A, and 23A are illustrated in a three-dimensional view. In FIGS. 18B, 19B, 20, 21, 22, and 23B cross-sectional views are provided along line C-C' of FIG. 1A. FIG. 23C illustrates a corresponding top-down view of the transistor structure.

Figure 18B:
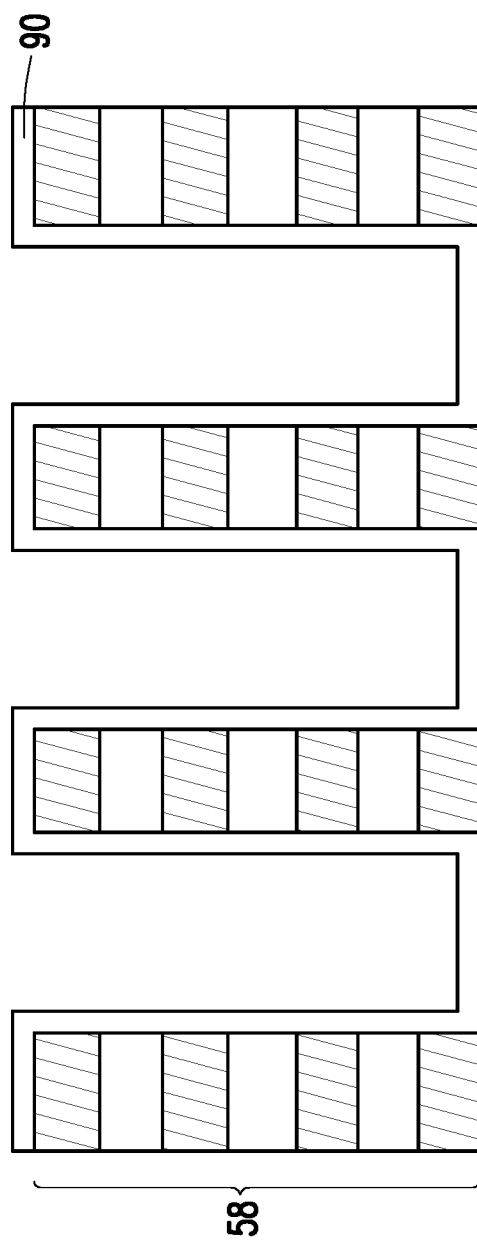

In FIGS. 18A and 18B, a memory film 90 is conformally deposited in the trenches 86. The memory film 90 may have a material that is capable of storing a bit, such as material capable of switching between two different polarization directions by applying an appropriate voltage differential across the memory film 90. For example, the polarization of the memory film 90 may change due to an electric field resulting from applying the voltage differential.

For example, the memory film 90 may be a high-k dielectric material, such as a hafnium (Hf) based dielectric material, or the like. In some embodiments, the memory film 90 comprises a ferroelectric material, such as, hafnium oxide, hafnium zirconium oxide, silicon-doped hafnium oxide, or the like. In other embodiments, the memory 90 may be a multilayer structure comprising a layer of $SiN_x$ between two $SiO_x$ layers (e.g., an ONO structure). In still other embodiments, the memory film 90 may comprise a different ferroelectric material or a different type of memory material. The memory film 90 may be deposited by CVD, PVD, ALD, PECVD, or the like to extend along sidewalls and a bottom surface of the trenches 86. After the memory film 90 is deposited, an annealing step (e.g., at a temperature range of about 300° C. to about 600° C.) in may be performed to achieve a desired crystalline phase, improve film quality, and reduce film-related defects/impurities for the memory film 90. In some embodiments, the annealing step may further be below 400° C. to meet a BEOL thermal budget and reduce defects that may result in other features from high-temperature annealing processes.

Figure 19A:
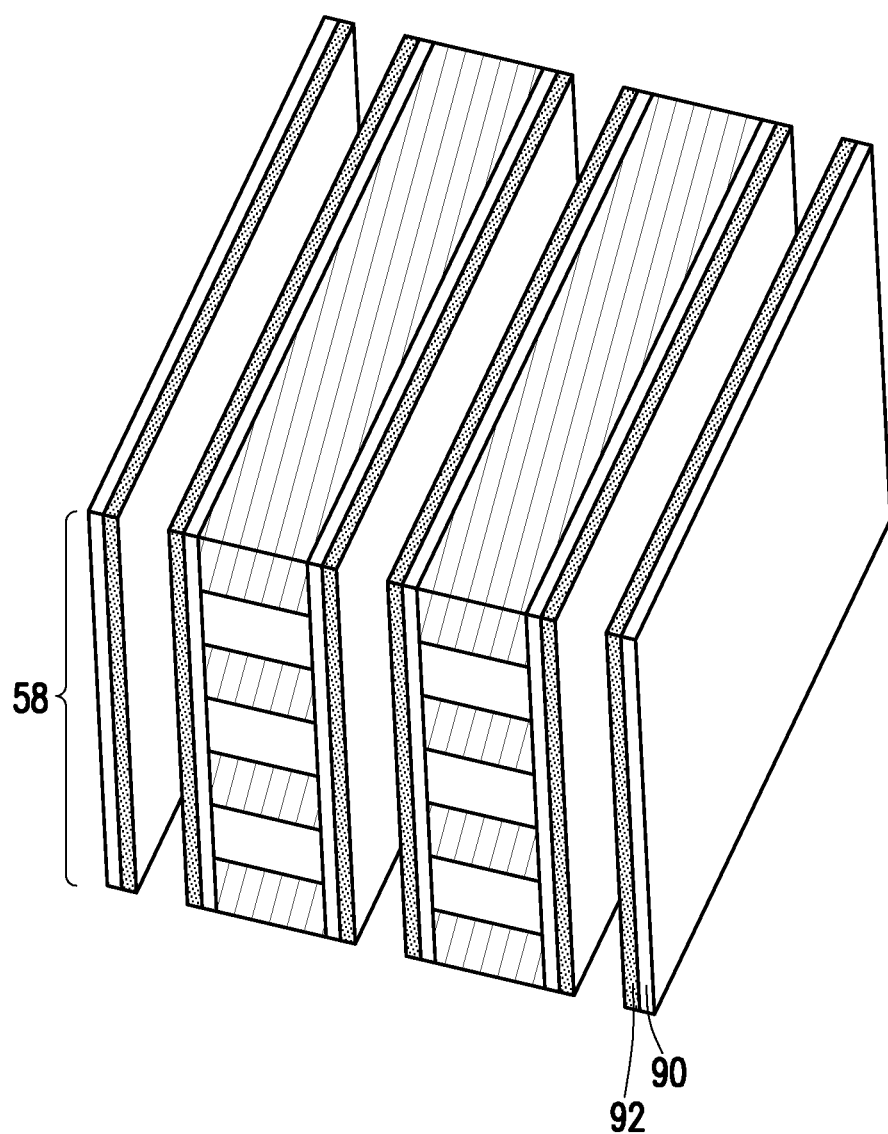
Figure 19B:
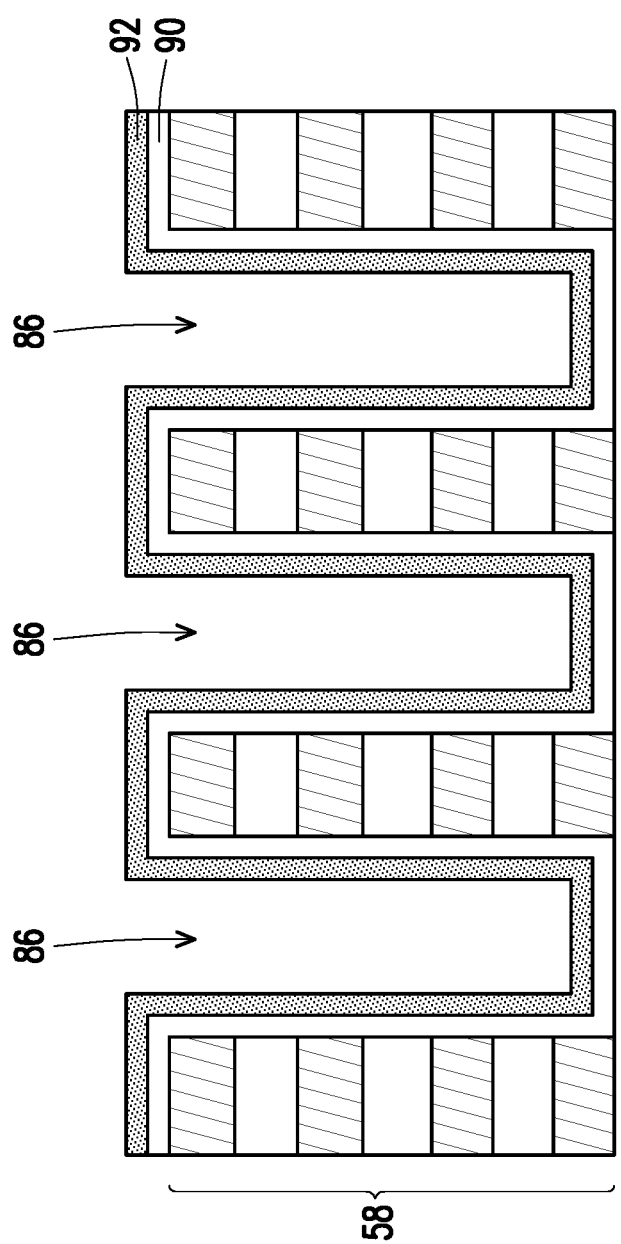

In FIGS. 19A and 19B, the OS layer 92 is conformally deposited in the trenches 86 over the memory film 90. The OS layer 92 comprises a material suitable for providing a channel region for a transistor (e.g., transistors 204, see FIG. 1A). In some embodiments the OS layer 92 may comprise a thin film semiconductor material suitable for providing a channel region for a thin film transistor (TFT). In some embodiments, the OS layer 92 comprises an indium-comprising material, such as $In_xGa_yZn_zMO$, where M may be Ti, Al, Ag, Si, Sn, or the like. X, Y, and Z may each be any value between 0 and 1. In other embodiments, a different semiconductor material may be used for the OS layer 92. The OS layer 92 may be deposited by CVD, PVD, ALD, PECVD, or the like. The OS layer 92 may extend along sidewalls and a bottom surface of the trenches 86 over the FE layer 90. After the OS layer 92 is deposited, an annealing step (e.g., at a temperature range of about 300° C. to about 450° C. or in a range of about 300° C. to about 400° C.) in oxygen-related ambient may be performed to activate the charge carriers of the OS layer 92.

Figure 20:
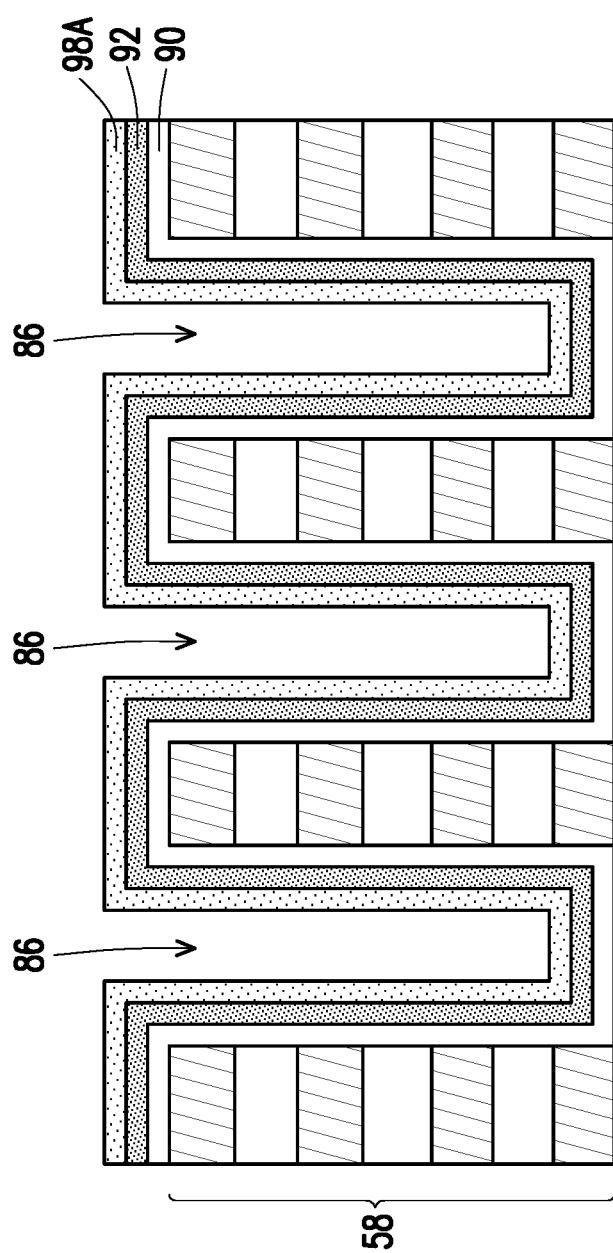

In FIG. 20, a dielectric layer 98A is conformally deposited on the OS layer 92 and in the trenches 86. The dielectric layer 98A may be formed of materials that are selected from the same group of candidate materials of the dielectric layers 52, and may be formed using methods that are selected from the same group of candidate methods for forming the materials of the dielectric layers 52. The dielectric layers 52 and the dielectric layer 98A may be formed from the same material, or may include different materials. In some embodiments, the dielectric layer 98A is an oxide such as silicon oxide deposited by ALD. In another embodiment, the dielectric layer 98A can be formed of a high-k ferroelectric material, such as a material that is selected from the same group of candidate materials of the memory film 90. The dielectric layer 98A can have a thickness in the range of about 1 nm to about 100 nm.

In FIG. 21, bottom portions of the dielectric layer 98A in the trenches 86 are removed using a combination of photolithography and etching, for example. The etching may be any acceptable etch process, such as by wet or dry etching, a reactive ion etch (RIE), neutral beam etch (NBE), the like, or a combination thereof. The etching may be anisotropic.

Subsequently, as also illustrated by FIG. 21, the dielectric layer 98A may be used as an etch mask to etch through a bottom portion of the OS layer 92 in the trenches 86. The etching may be any acceptable etch process, such as by wet or dry etching, a reactive ion etch (RIE), neutral beam etch (NBE), the like, or a combination thereof. The etching may be anisotropic. Etching the OS layer 92 may expose portions of the memory film 90 on a bottom surface of the trenches 86. Thus, portions of the OS layer 92 on opposing sidewalls of the trenches 86 may be separated from each other, which improves isolation between the memory cells 202 of the memory array 200 (see FIG. 1A).

In FIG. 22, an additional dielectric layer 98B may be deposited to fill remaining portions of the trenches 86. In the embodiment of FIG. 22, the dielectric layer 98B may have a same material composition and be formed using a like process as the dielectric layer 98A. The dielectric layer 98B and the dielectric layer 98A may be referred to collectively as the dielectric layer 98 herein after.

In FIGS. 23A through 23C, a removal process is then applied to the dielectric layer 98, the OS layer 92, and the memory film 90 to remove excess material over the multi-layer stack 58. In some embodiments, a planarization process such as a chemical mechanical polish (CMP), an etch-back process, combinations thereof, or the like may be utilized. The planarization process exposes the multi-layer stack 58 such that top surface of the multi-layer stack 58 is level after the planarization process is complete. FIG. 23C illustrates a corresponding top-down view of the structure illustrated in FIG. 23A.

FIGS. 24A through 27C illustrate intermediate steps of manufacturing conductive lines 106 and 108 (e.g., source lines and bit lines) in the memory array 200. The conductive lines 106 and 108 may extend along a direction perpendicular to the conductive lines 72 such that individual cells of the memory array 200 may be selected for read and write operations. In FIGS. 24A through 27C, figures ending in "A" illustrate a 3D view; figures ending in "B" illustrate a top down view, and figures ending in "C" illustrate a corresponding cross-sectional view parallel to line C-C' of FIG. 1A.

Figure 24A:
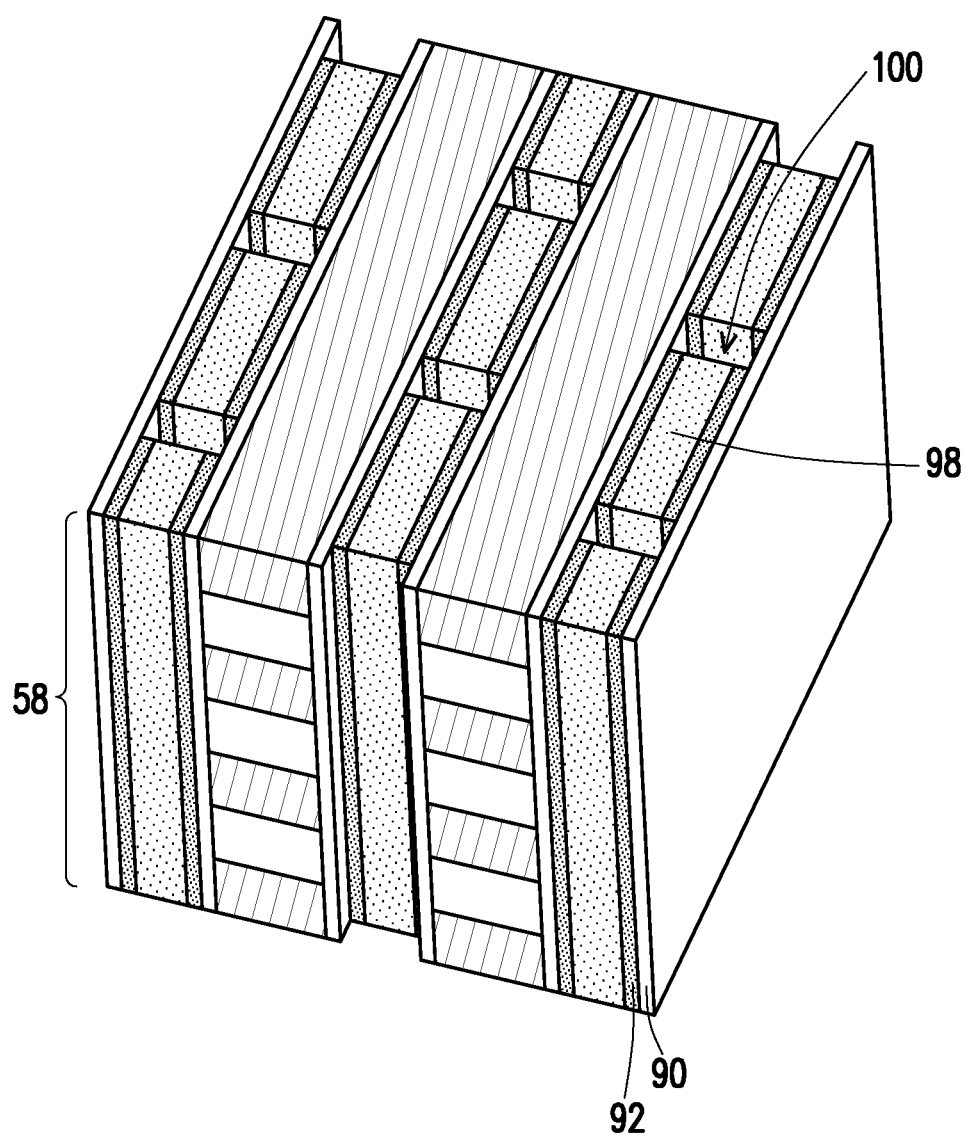
Figure 24B:
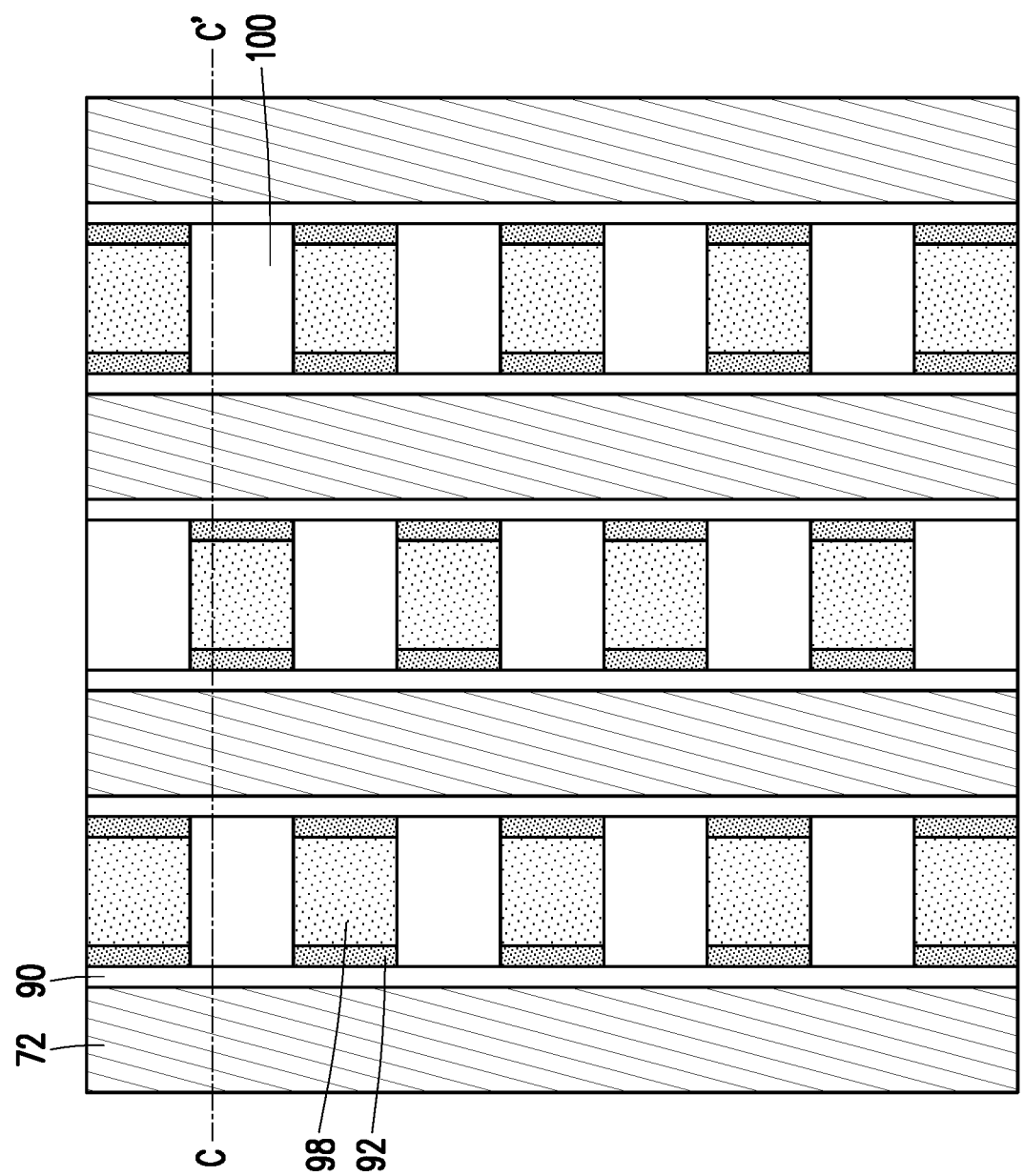
Figure 24C:
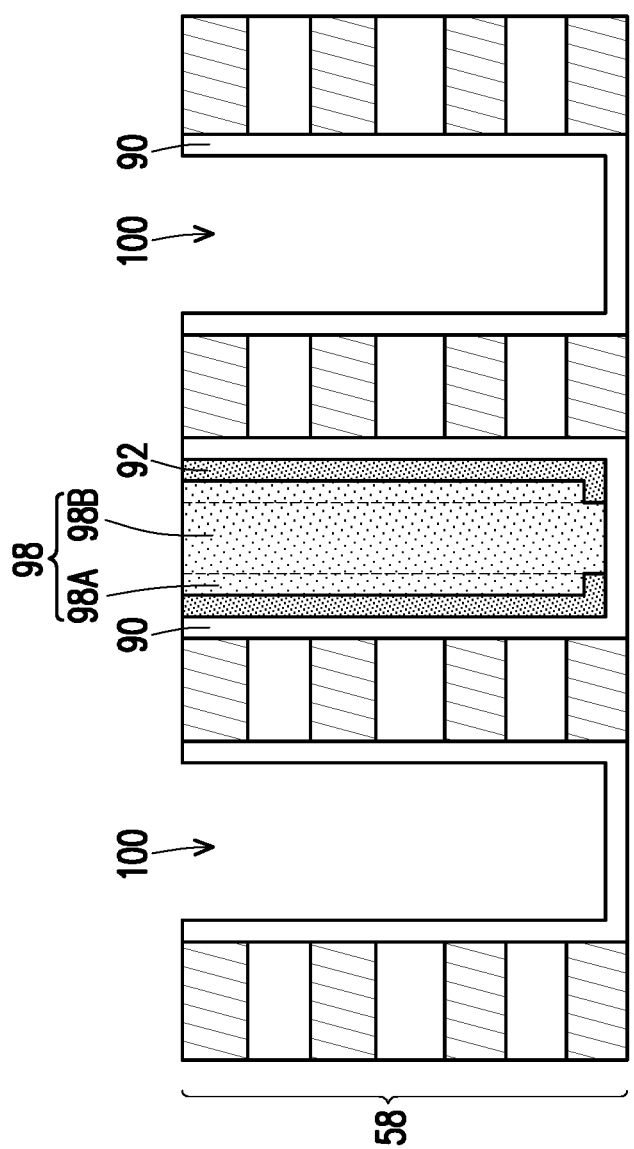

In FIGS. 24A, 24B, and 24C, trenches 100 are patterned through the OS layer 92 and the dielectric layer 98. FIG. 24C illustrates a cross-section view of line C-C' in FIG. 24B. Patterning the trenches 100 may be performed through a combination of photolithography and etching, for example. The trenches 100 may be disposed between opposing sidewalls of the memory film 90, and the trenches 100 may physically separate adjacent stacks of memory cells in the memory array 200 (see FIG. 1A).

Figure 25A:
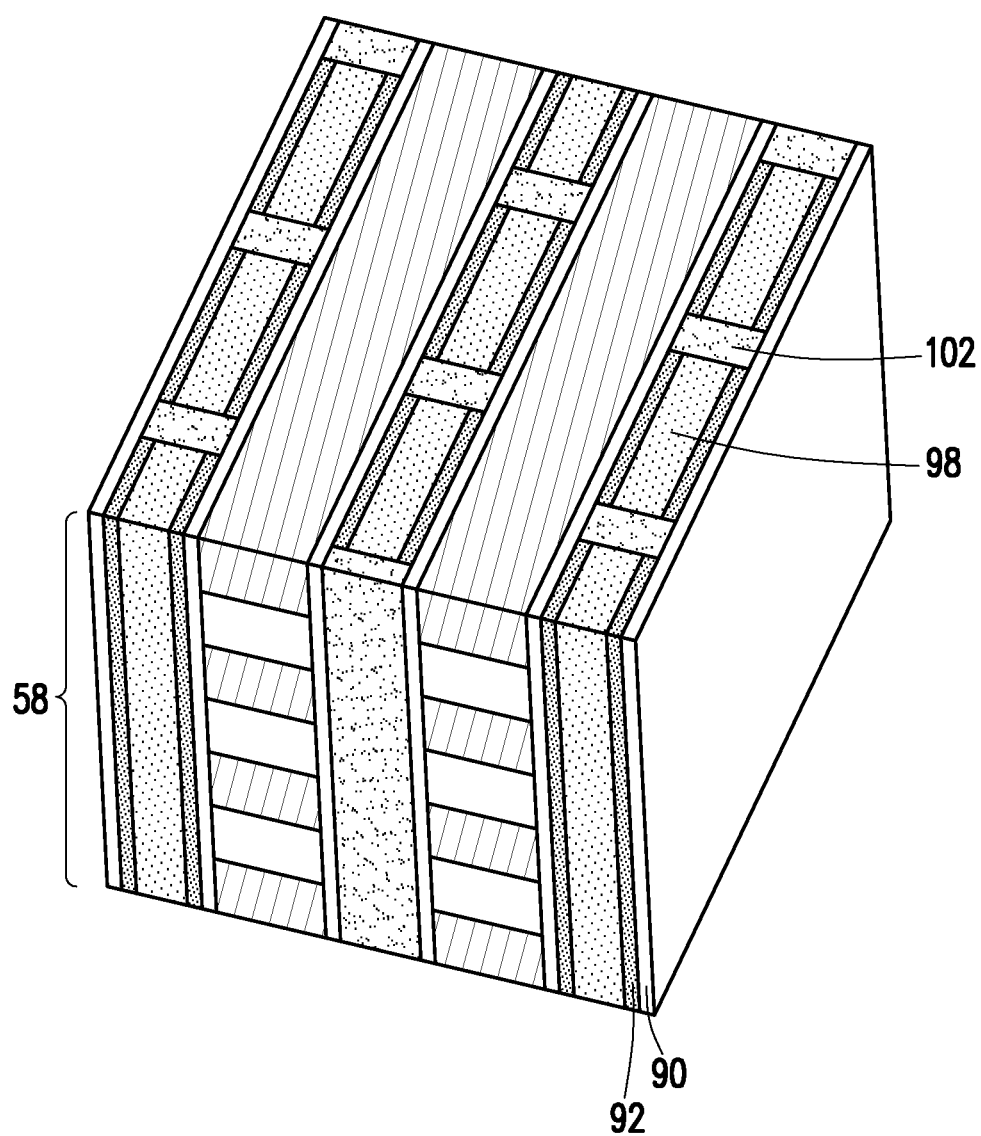
Figure 25B:
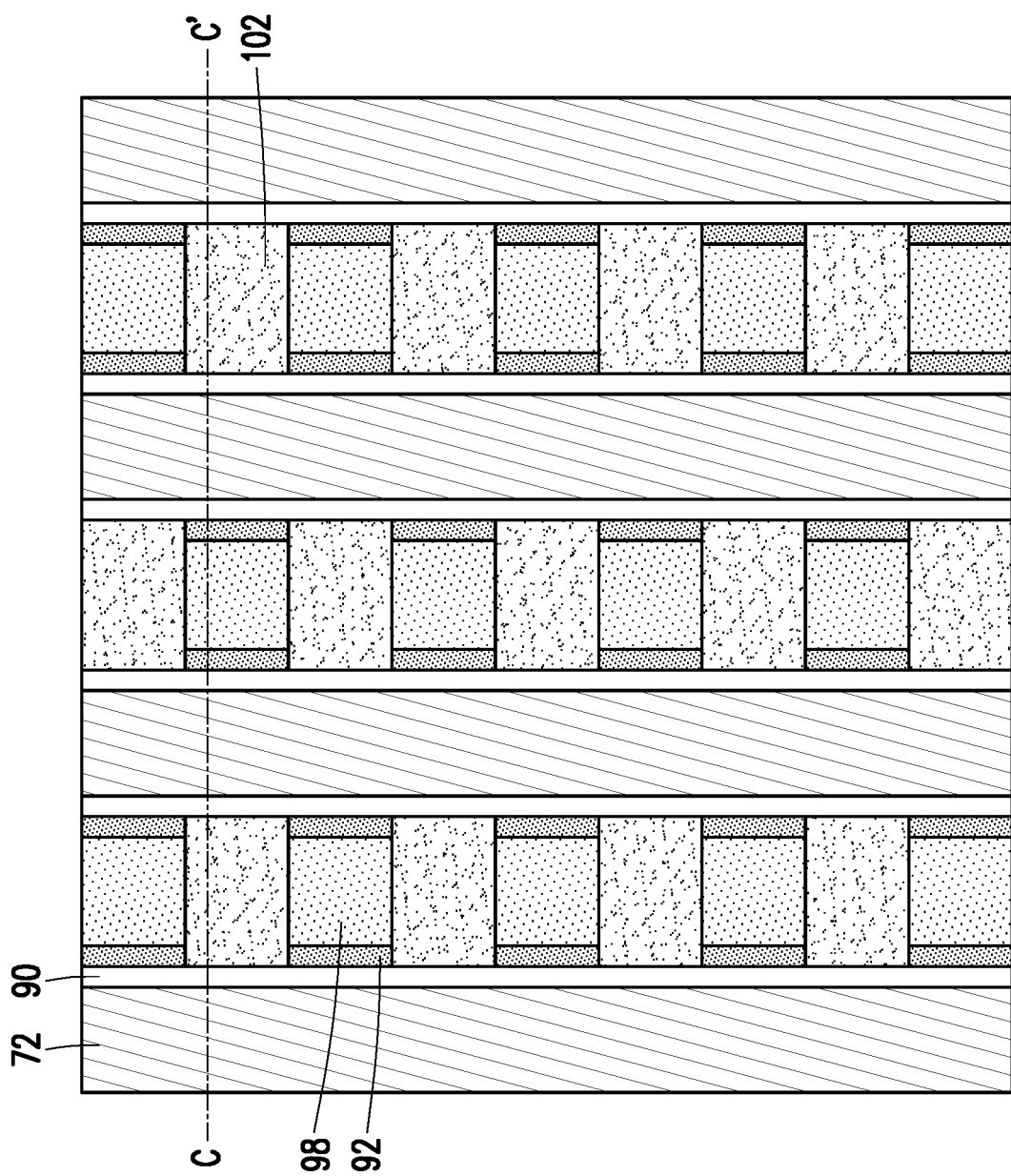
Figure 25C:
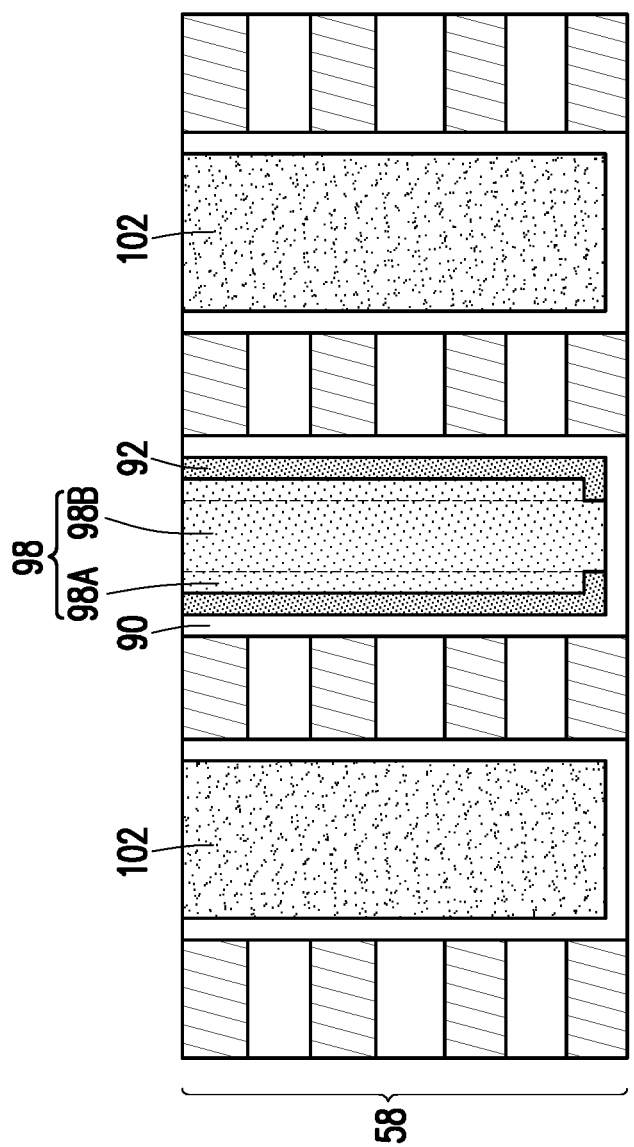

In FIGS. 25A, 25B, and 25C, a dielectric layer 102 is deposited in and fills the trenches 100. FIG. 25C illustrates a cross-sectional view of line C-C' in FIG. 25B. The dielectric layer 102 may include, for example, silicon oxide, silicon nitride, silicon oxynitride, or the like, which may be deposited by CVD, PVD, ALD, PECVD, or the like. The dielectric layer 102 may extend along sidewalls and a bottom surface of the trenches 100. After deposition, a planarization process (e.g., a CMP, etch back, or the like) may be performed to remove excess portions of the dielectric layer 102. In the resulting structure, top surfaces of the multi-layer stack 58, the memory film 90, the OS layer 92, and the dielectric layer 102 may be substantially level (e.g., within process variations). In some embodiments, materials of the dielectric layer 98 and 102 may be selected so that they may be etched selectively relative each other. For example, in some embodiments, the dielectric layer 98 is an oxide and the dielectric layer 102 is a nitride. In some embodiments, the dielectric layer 98 is a nitride and the dielectric layer 102 is an oxide. Other materials are also possible.

Figure 26A:
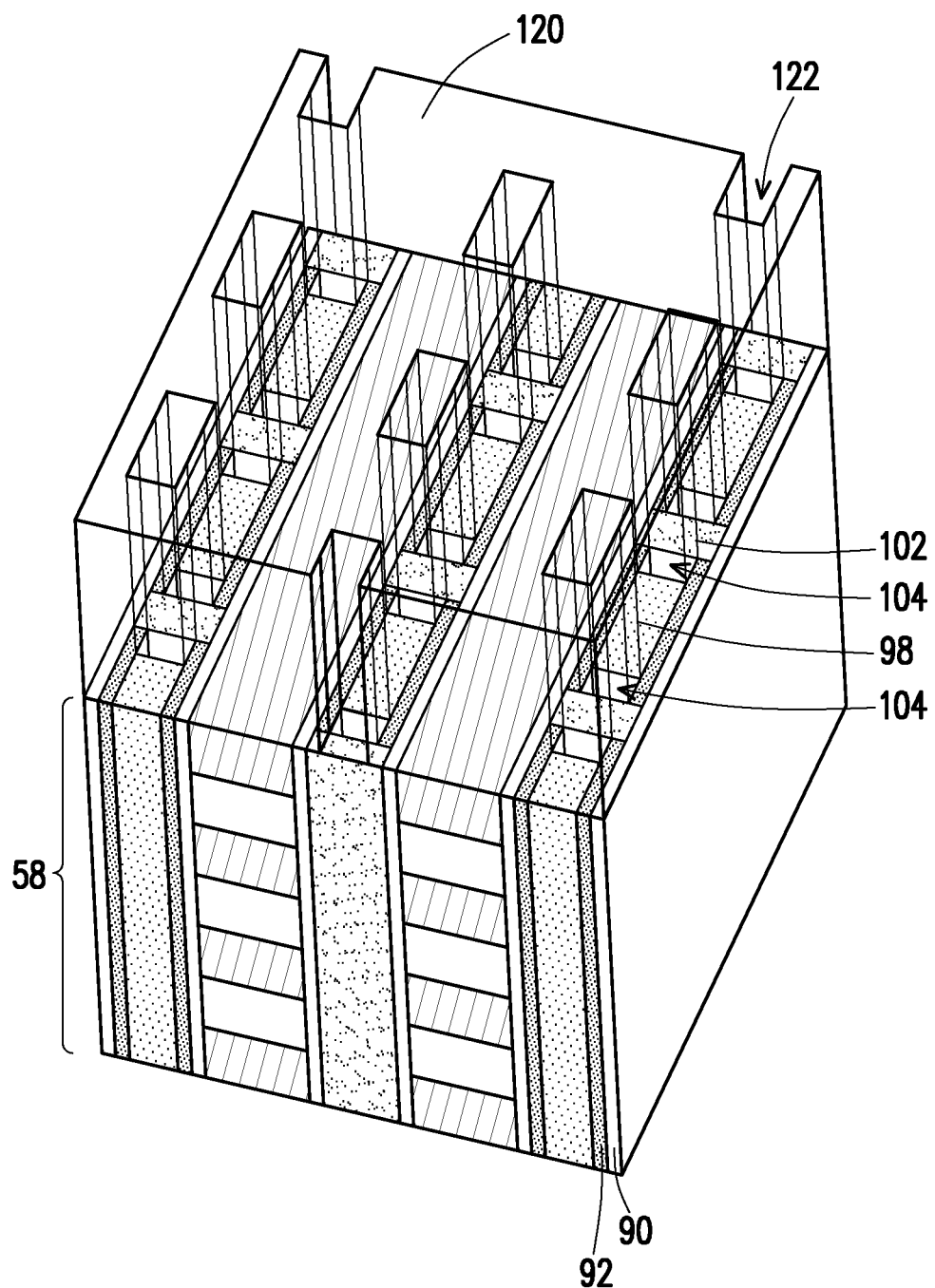
Figure 26B:
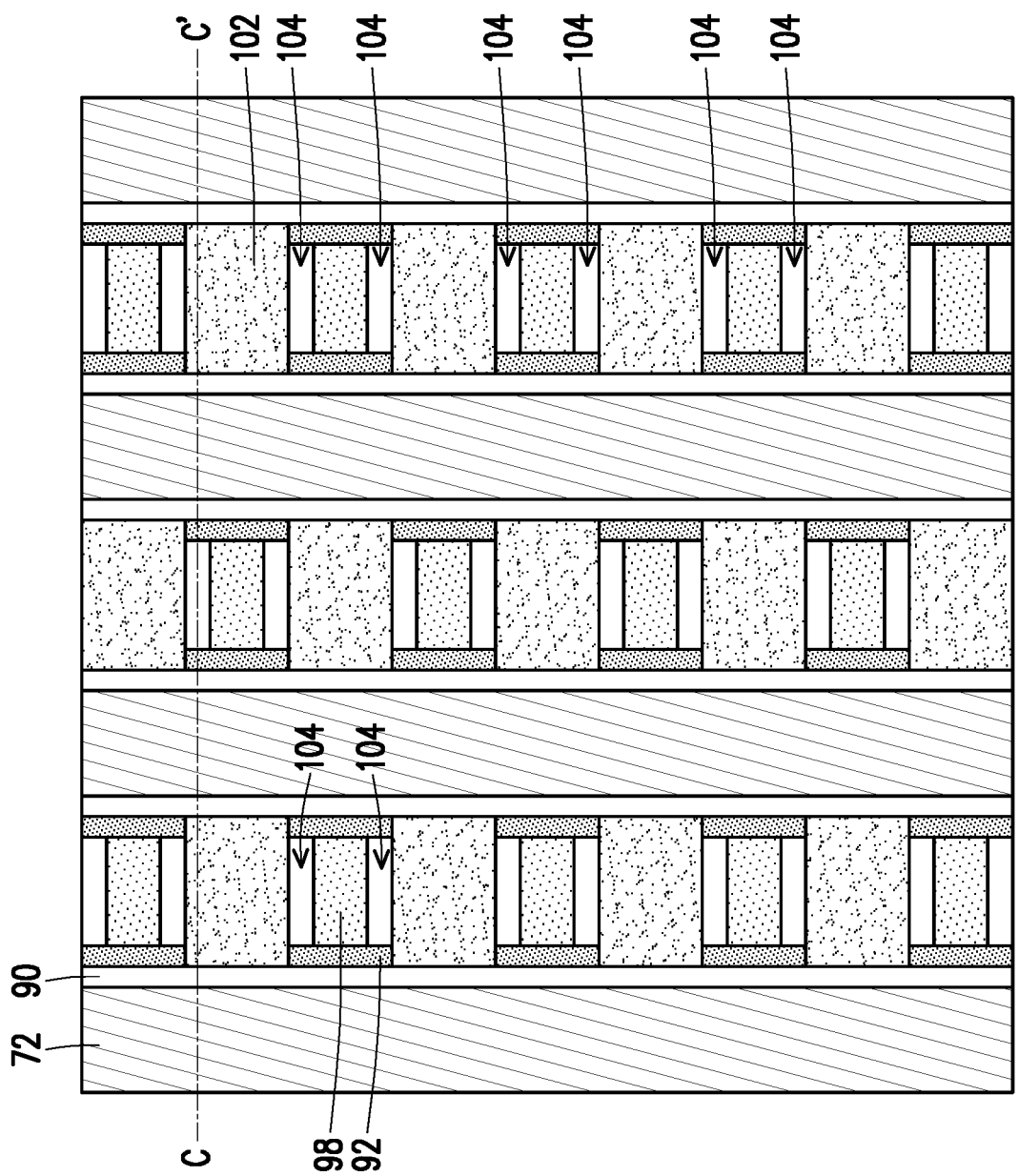
Figure 26C:
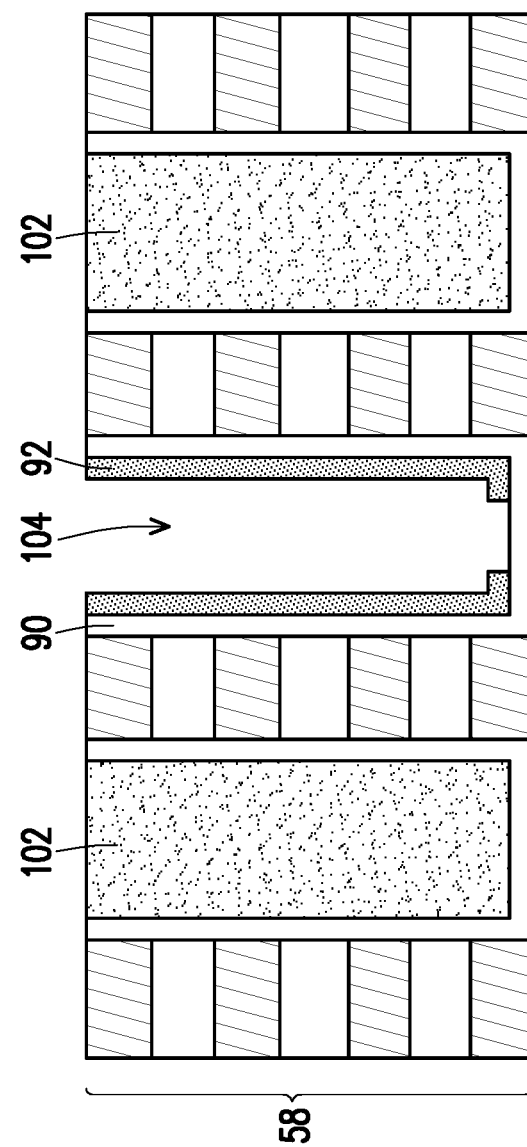

In FIGS. 26A, 26B, and 26C, trenches 104 are patterned for the conductive lines 106 and 108. FIG. 26C illustrates a cross-sectional view of line C-C' in FIG. 26B. The trenches 104 are patterned by patterning the dielectric layer 98 using a combination of photolithography and etching, for example.

For example, a photoresist 120 may be deposited over the multi-layer stack 58, the dielectric layer 98, the dielectric layer 102, the OS layer 92, and the memory film 90. The photoresist 120 can be formed by using a spin-on technique, for example. The photoresist 120 is patterned to define openings 122. Each of the openings 122 may overlap a corresponding region of the dielectric layer 102, and each of the openings 122 may further partially expose two separate regions of the dielectric layer 98. For example, each opening 122 may expose a region of the dielectric layer 102; and partially expose a first region of the dielectric layer 98; and partially expose a second region of the dielectric layer 98 that is separated from the first region of the dielectric layer 98 by the region of the dielectric layer 102. In this way, each of the openings 122 may define a pattern of a conductive line 106 and an adjacent conductive line 108 that are separated by the dielectric layer 102. The photoresists can be patterned using acceptable photolithography techniques. For example, the photoresist 120 be exposed to light for patterning. After the exposure process, the photoresist 120 may be developed to remove exposed or unexposed portions of the photoresist depending on whether a negative or positive resist is used, thereby defining a patterning of the form openings 122.

Subsequently, portions of the dielectric layer 98 exposed by the openings 122 may be removed by etching, for example. The etching may be any acceptable etch process, such as by wet or dry etching, a reactive ion etch (RIE), neutral beam etch (NBE), the like, or a combination thereof. The etching may be anisotropic. The etching process may use an etchant that etches the dielectric layer 98 without significantly etching the dielectric layer 102. As a result, even though the openings 122 expose the dielectric layer 102, the dielectric layer 102 may not be significantly removed. A pattern of the trenches 104 may correspond to the conductive lines 106 and 108 (see FIGS. 27A, 27B, and 27C). For example, a portion of the dielectric layer 98 may remain between each pair of the trenches 104, and the dielectric layer 102 may be disposed between adjacent pairs of the trenches 104. After the trenches 104 are patterned, the photoresist 120 may be removed by ashing, for example.

Figure 27A:
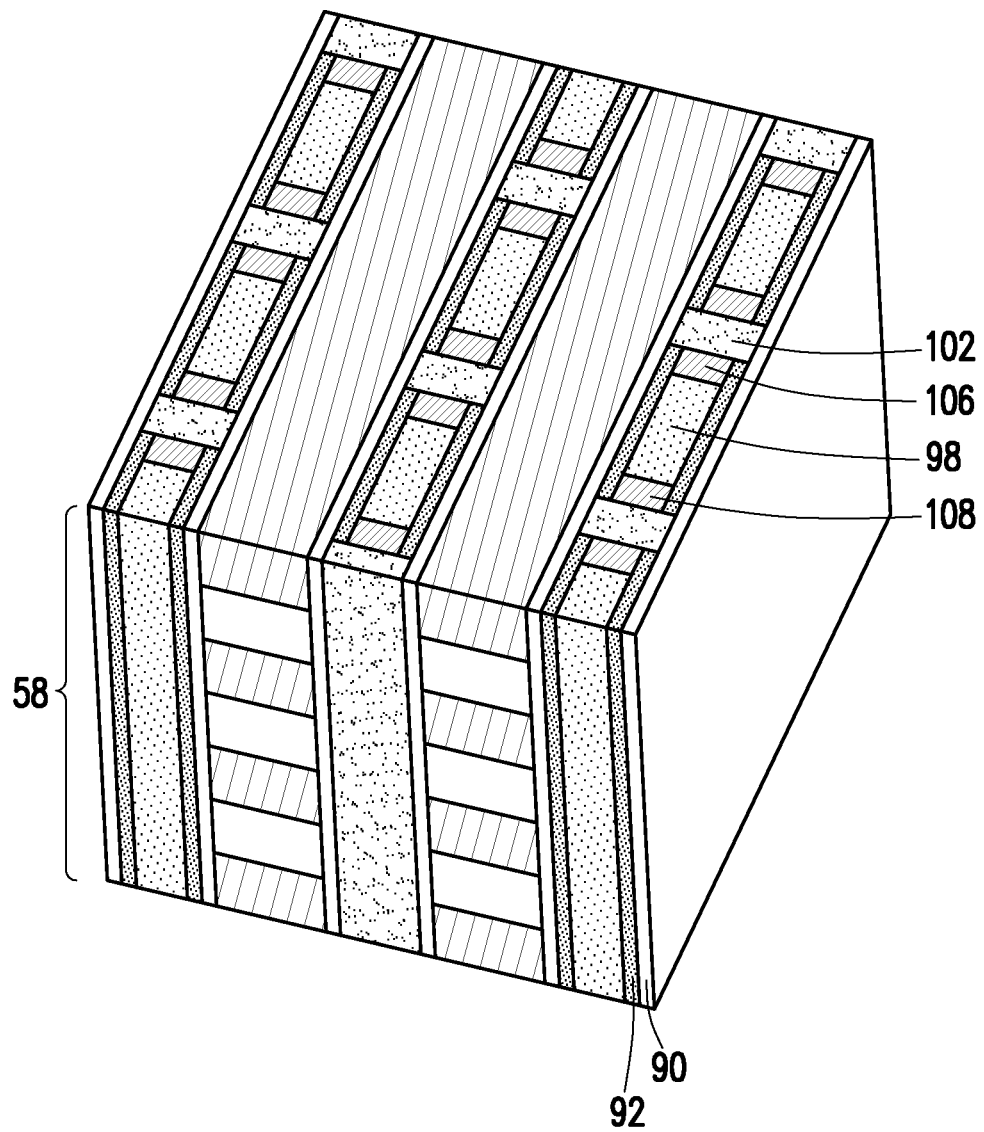
Figure 27B:
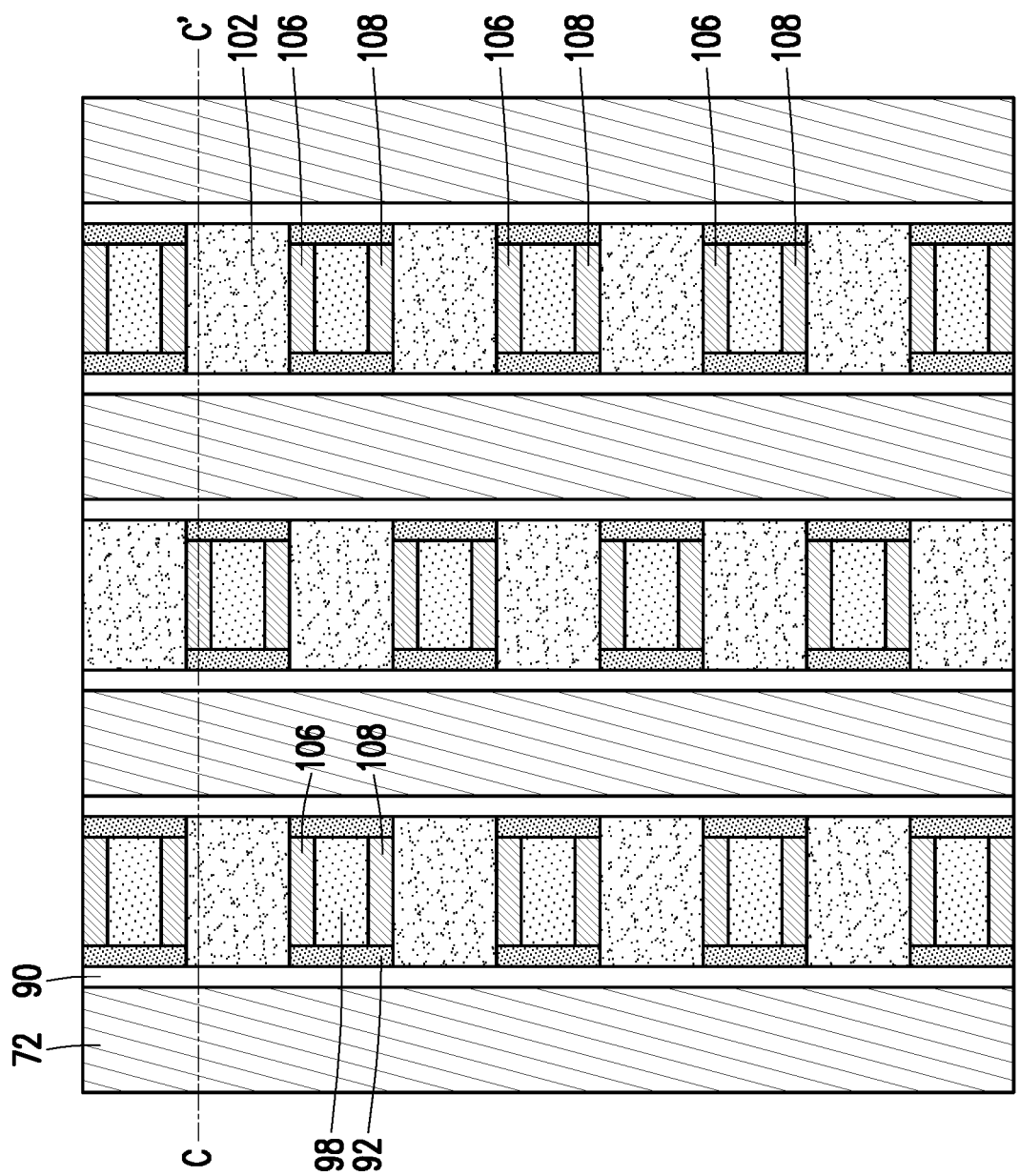
Figure 27C:
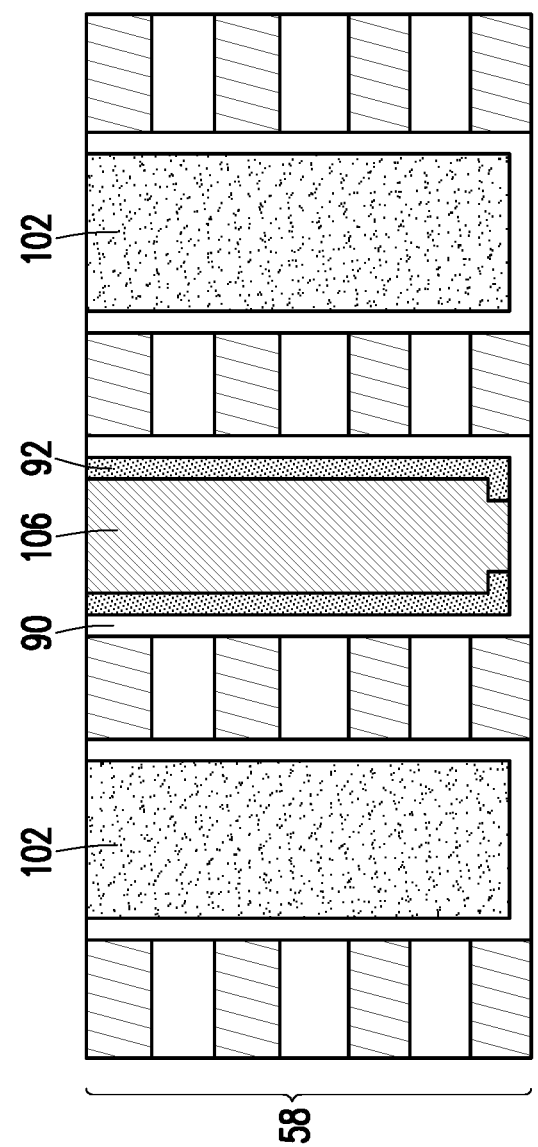

In FIGS. 27A, 27B, and 27C the trenches 104 are filled with a conductive material to form the conductive lines 106 and 108. FIG. 27C illustrates a cross-sectional view of line C-C' in FIG. 27B. The conductive lines 106 and 108 may each comprise a conductive material, such as, copper, titanium, titanium nitride, tantalum, tantalum nitride, tungsten, ruthenium, aluminum, combinations thereof, or the like, which may be each formed using, for example, CVD, ALD, PVD, PECVD, or the like. After the conductive lines 106 and 108 are deposited, a planarization (e.g., a CMP, etch back, or the like) may be performed to remove excess portions of the conductive material, thereby forming the conductive lines 106 and 108. In the resulting structure, top surfaces of the multi-layer stack 58, the memory film 90, the OS layer 92, the conductive lines 106, and the conductive lines 108 may be substantially level (e.g., within process variations). The conductive lines 106 may correspond to bit lines in the memory array, and the conductive lines 108 may correspond to source lines in the memory array 200. Although FIG. 27C illustrates a cross-sectional view that only shows the conductive lines 106, a cross-sectional view of the conductive lines 108 may be similar.

Figure 28A:
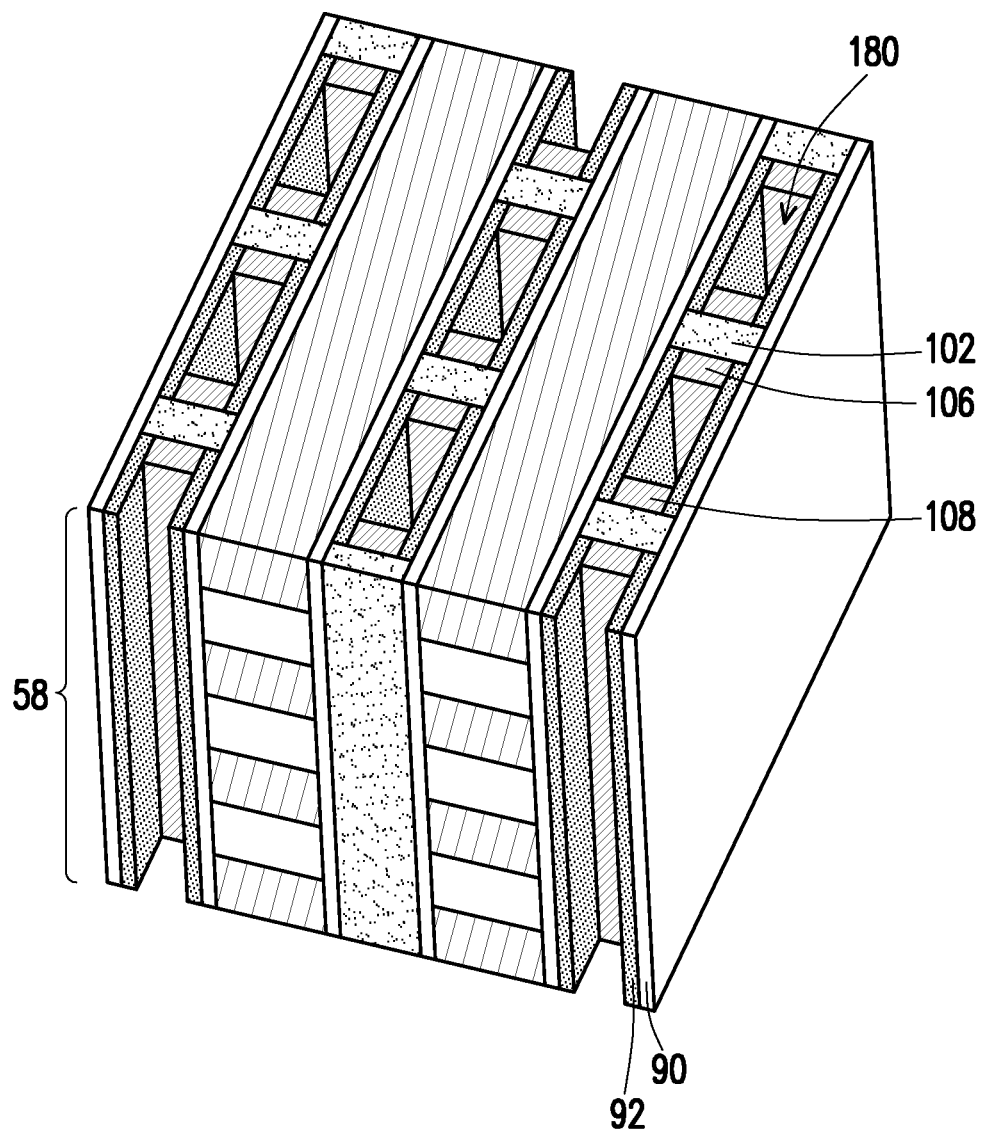
Figure 28B:
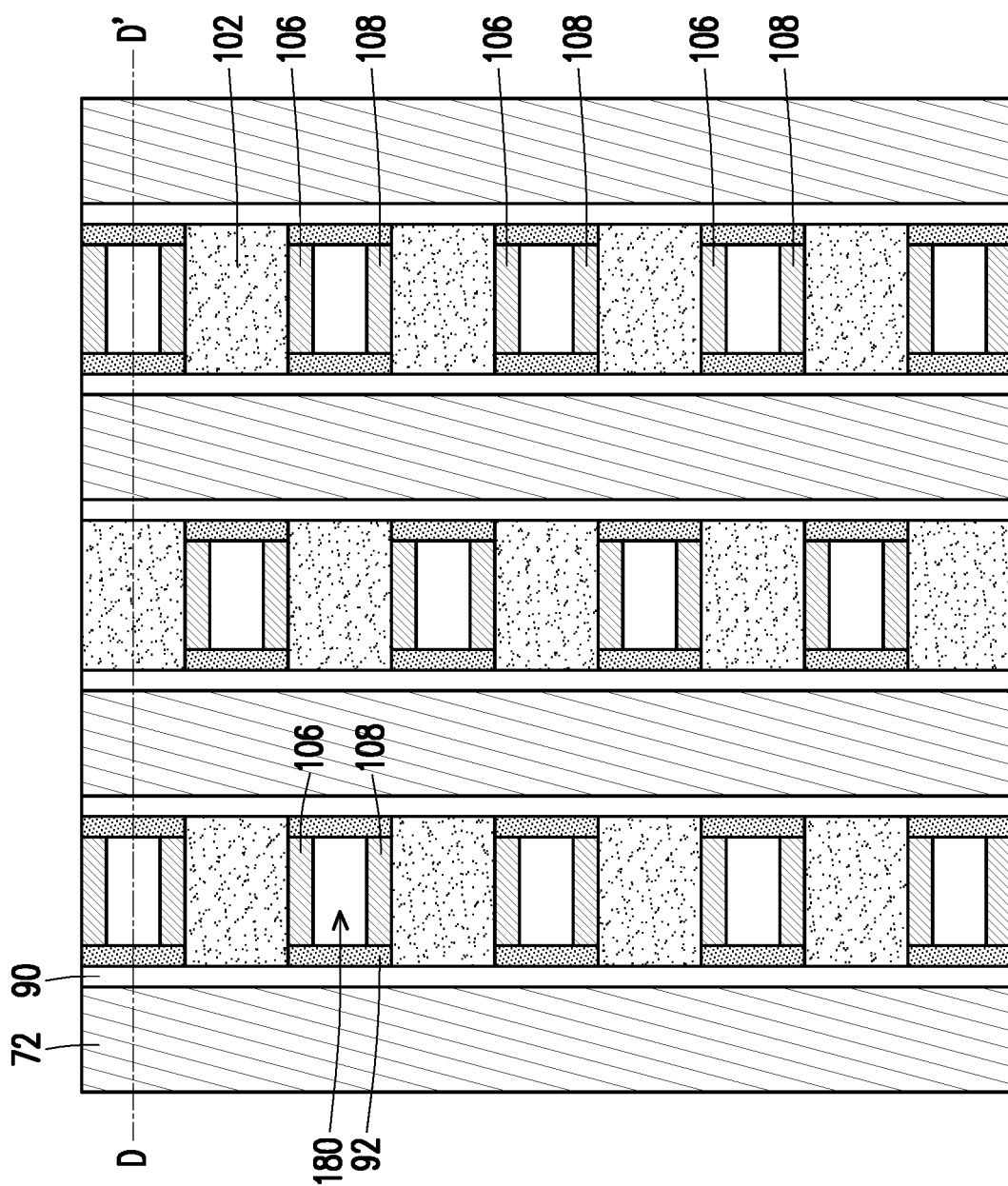
Figure 28C:
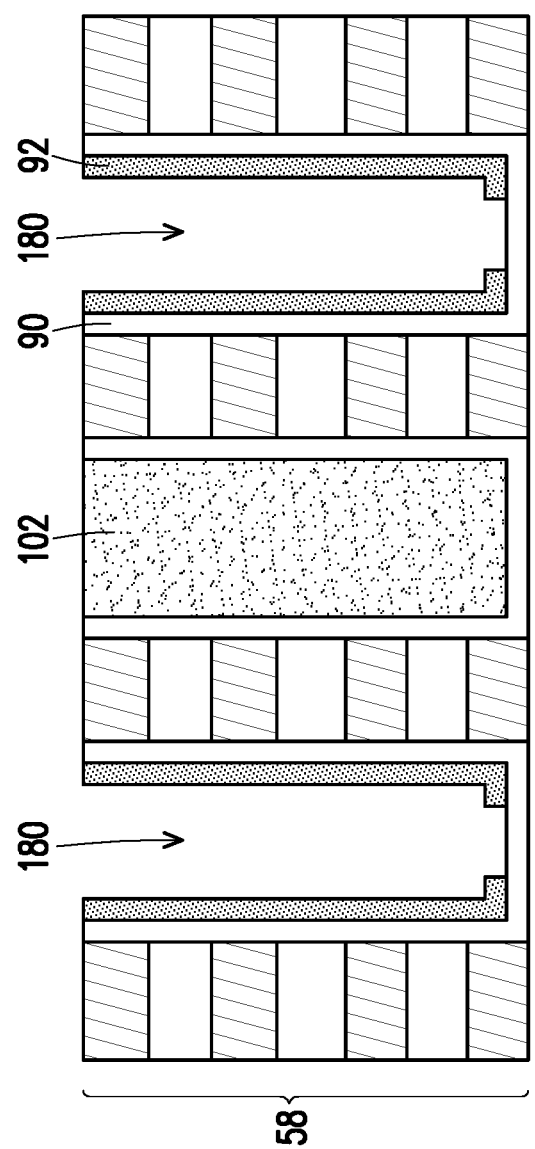

In FIGS. 28A, 28B, and 28C, trenches 180 are formed by removing the dielectric layer 98. FIG. 28C illustrates a cross-sectional view of line D-D' in FIG. 28B. The trenches 180 are patterned by patterning the dielectric layer 98 using a combination of photolithography and etching, for example.

For example, a photoresist (not shown in FIGS. 28A through 28C) may be deposited over the multi-layer stack 58, the dielectric layer 98, the dielectric layer 102, the OS layer 92, the memory film 90, the conductive lines 106 and the conductive lines 108. The photoresist can be formed by using a spin-on technique, for example. The photoresist is patterned to define openings that overlap a corresponding region of the dielectric layer 98. For example, each opening may expose a region of the dielectric layer 98 between the conductive lines 106 and 108. The photoresist can be patterned using acceptable photolithography techniques.

Subsequently, the dielectric layer 98 exposed by the openings may be removed by etching, for example, to form the trenches 180. The etching may be any acceptable etch process, such as by wet or dry etching, a reactive ion etch (RIE), neutral beam etch (NBE), the like, or a combination thereof. The etching may be anisotropic. After the trenches 180 are patterned, the photoresist may be removed by ashing, for example. In some embodiments, the processes and materials used to form trenches 180 are similar to the processes and materials used to form trenches 104 (described previously in FIG. 26A through 26C).

Figure 29A:
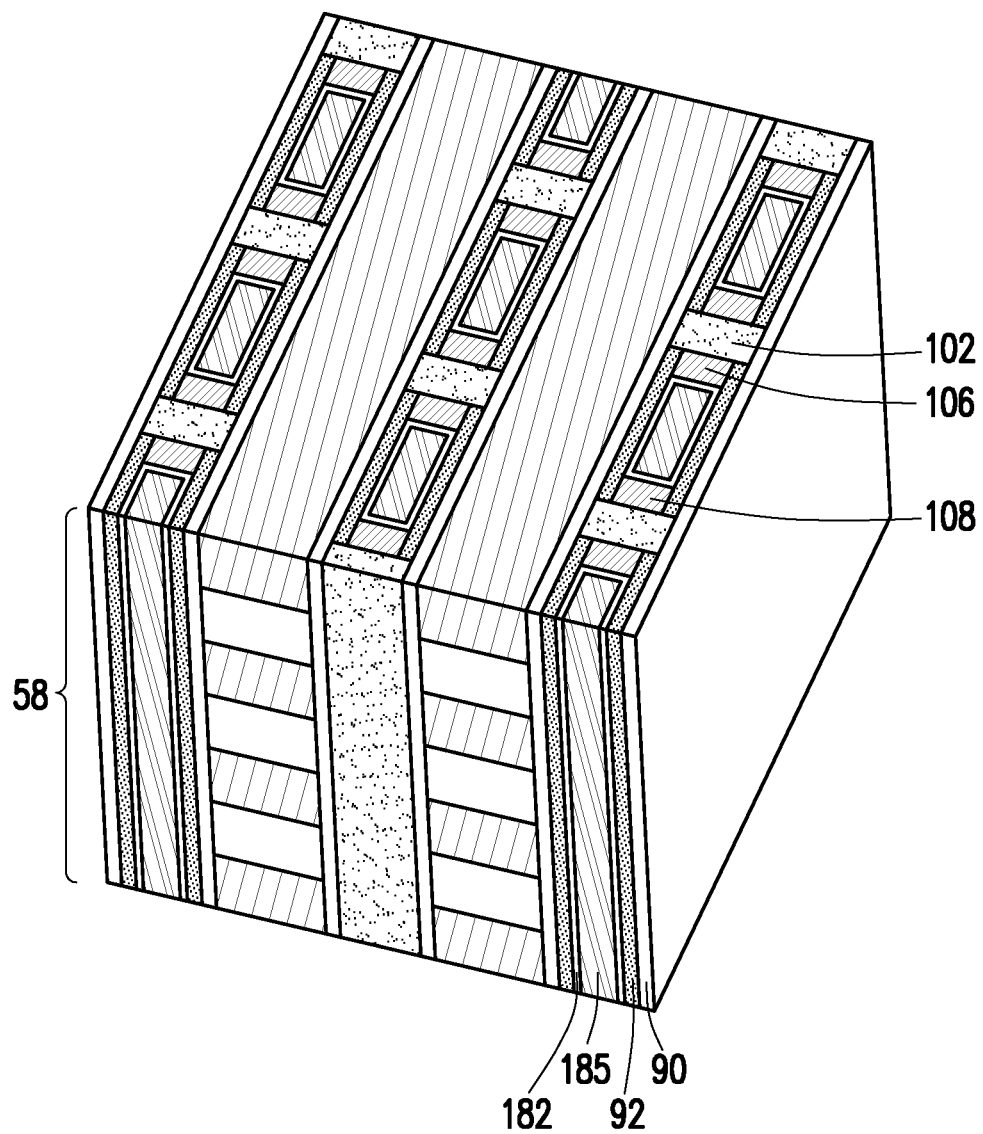
Figure 29B:
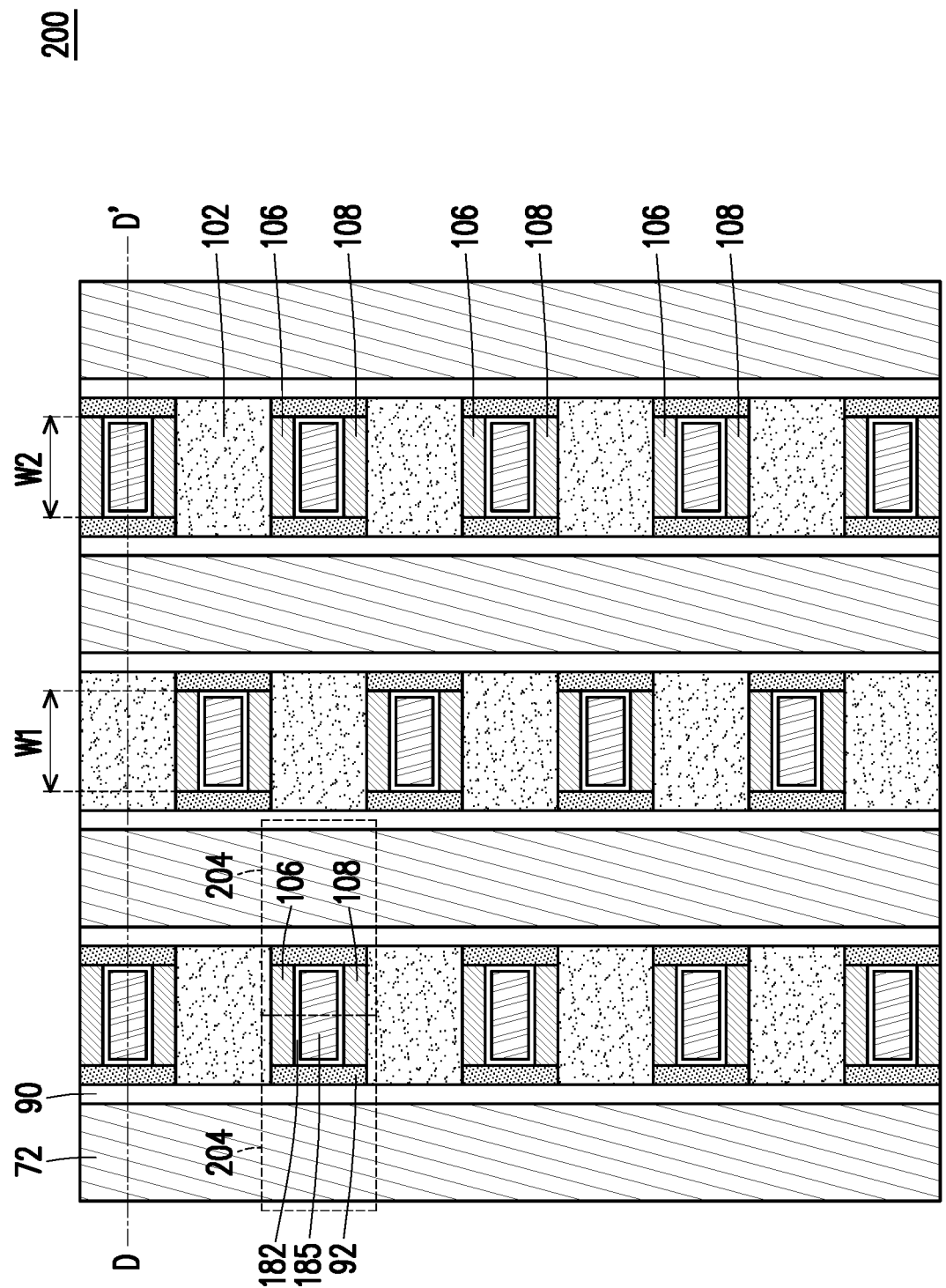
Figure 29C:
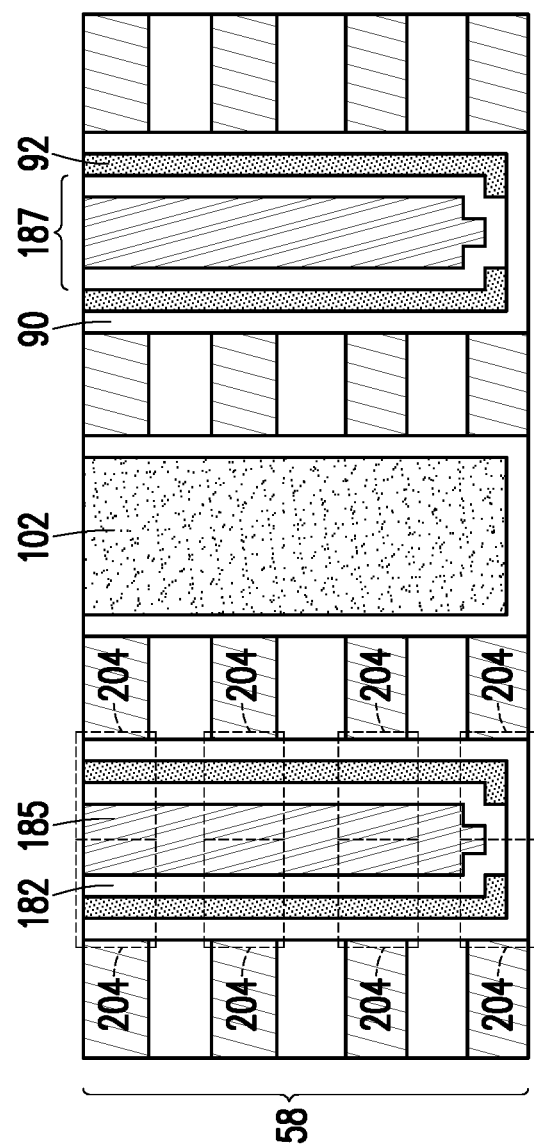

In FIGS. 29A through 29C, gate dielectric layer 182 and gate electrodes 185 (collectively, gate stacks 187) are formed in the trenches 180. FIG. 29C illustrates a cross-sectional view of line D-D' in FIG. 29B. The gate dielectric layer 182 is deposited conformally in the trenches 180 (e.g., over the multi-layer stack 58, the dielectric layer 102, the OS layer 92, the memory film 90, the conductive lines 106 and the conductive lines 108 and on the sidewalls of the OS layer 92, the conductive lines 106 and the conductive lines 108). In accordance with some embodiments, the gate dielectric layer 182 comprises silicon oxide, silicon nitride, or multi-layers thereof. In some embodiments, the gate dielectric layer 182 is a high-k dielectric material, and in these embodiments, the gate dielectric layer 182 may have a k value greater than about 7.0, and may include a metal oxide or a silicate of Hf, Al, Zr, La, Mg, Ba, Ti, Pb, and combinations thereof. The formation methods of the gate dielectric layer 182 may include Molecular-Beam Deposition (MBD), ALD, PECVD, and the like.

After the deposition of the gate dielectric layer 182, the gate electrode 185 is deposited over the gate dielectric layer 182 to fill the trenches 180. The gate electrode 185 may be formed of a conductive material such as tungsten, cobalt, ruthenium, aluminum, nickel, copper, a copper alloy, silver, gold, or the like, which may be deposited by ALD, CVD, PVD, or the like. The gate electrode 185 may be conformally deposited. In some embodiments, the gate electrode 185 comprises tungsten, TiN, TaN, or the like, or the combination thereof. After the deposition, a planarization process (e.g., a CMP, etch back, or the like) may be performed to remove excess portions of the gate dielectric layer 182 and the gate electrode 185. The resulting structure may result in top surfaces of the multi-layer stack 58, the memory film 90, the OS layer 92, the dielectric layer 102, the gate dielectric layer 182, the conductive lines 106, conductive lines 108 and the gate electrode 185 being substantially level (e.g., within process variations). After the planarization process, the remaining portions of the gate dielectric layer 182 and the gate electrode 185 may be referred to as the gate stacks 187. In some embodiments, each of the gate stacks 187 may have a first width W1 that is equal to a second width W2 of each of the conductive lines 106 and 108.

Figure 29D:
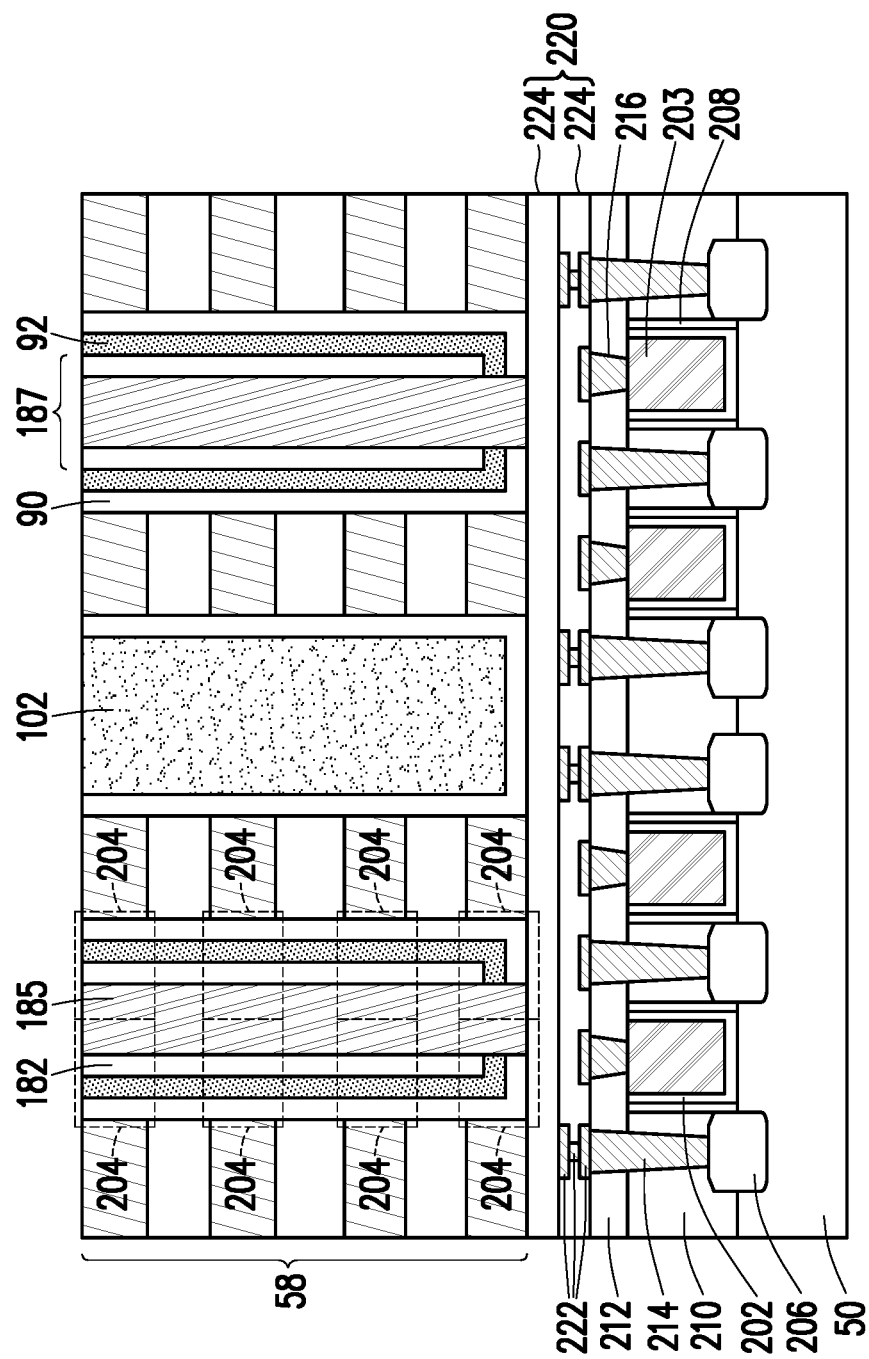

FIG. 29D illustrates an alternative embodiment where the gate electrodes 185 of the gate stacks 187 are formed to extend through the gate dielectric layer 182, the OS layer 92, and the memory film 90. For example, after the deposition of the gate dielectric layer 182 as described above, the trenches 180 can be further extended through the OS layer 92, the memory film 90 and the dielectric layer 182.

In some embodiments, bottom portions of the gate dielectric layer 182 in the trenches 180 are removed using a combination of photolithography and etching, for example. The etching may be any acceptable etch process, such as by wet or dry etching, a reactive ion etch (RIE), neutral beam etch (NBE), the like, or a combination thereof. The etching may be anisotropic. Subsequently, as also illustrated by FIG. 29D, the gate dielectric layer 182 may be used as an etch mask to etch through a bottom portion of the memory film 90 in the trenches 180. The etching may be any acceptable etch process, such as by wet or dry etching, a reactive ion etch (RIE), neutral beam etch (NBE), the like, or a combination thereof. The etching may be anisotropic. Etching the memory film 90 may expose portions of the underlying interconnect structure 220, including one or more of the stacked dielectric layers 224 and the conductive features 222 formed in the one or more dielectric layers 224. In some embodiments, the etching process includes multiple etches.

Next, as shown in FIG. 29D, gate electrode 185 is deposited over the gate dielectric layer 182 to fill the trenches 180. The gate electrode 185 may be formed of a same material using a same process as described above in FIGS. 29A through 29C. After the deposition, a planarization process (e.g., a CMP, etch back, or the like) may be performed to remove excess portions of the gate dielectric layer 182 and the gate electrode 185. The resulting structure may result in top surfaces of the multi-layer stack 58, the memory film 90, the OS layer 92, the dielectric layer 102, the gate dielectric layer 182, the conductive lines 106, conductive lines 108 and the gate electrode 185 being substantially level (e.g., within process variations). The resulting gate electrode 185 may extend through the gate dielectric layer 182, the OS layer 92, and the memory film 90, which allows for the gate electrode 185 to be readily connected to metallization patterns of the underlying interconnect structure 220.

Thus stacked transistors 204 may be formed in the memory array 200. Each transistor 204 comprises a first gate electrode (e.g., a portion of a corresponding conductive line 72), a first gate dielectric (e.g., a portion of a corresponding memory film 90), a channel region (e.g., a portion of a corresponding OS layer 92), source and drain electrodes (e.g., portions of corresponding conductive lines 106 and 108), a second gate electrode (e.g., a portion of a corresponding gate electrode 185), and a second gate dielectric (e.g., a portion of a corresponding gate dielectric layer 182). The dielectric layer 102 isolates adjacent transistors 204 in a same column and at a same vertical level. The transistors 204 may be disposed in an array of vertically stacked rows and columns.

Advantages can be achieved as a result of each memory cell 202 of the memory array 200 comprising a transistor 204 that includes a gate stack 187. The gate stack 187 may be used to provide extra charge (e.g., to apply a biasing voltage to increase a write voltage). As a result, the operational voltage of the 3D memory array 200 can be reduced, leading to improved reliability. In addition, increasing the write voltage applied during a write operation can help increase the speed and accuracy of the write operation. Further, the gate stack 187 can help control the surface potential of the OS layer 92 (particularly the portions of the OS layer 92 distal the conductive lines 72 (e.g., word lines)) during write operations. The window for write operations may thus be widened.

Figure 30A:
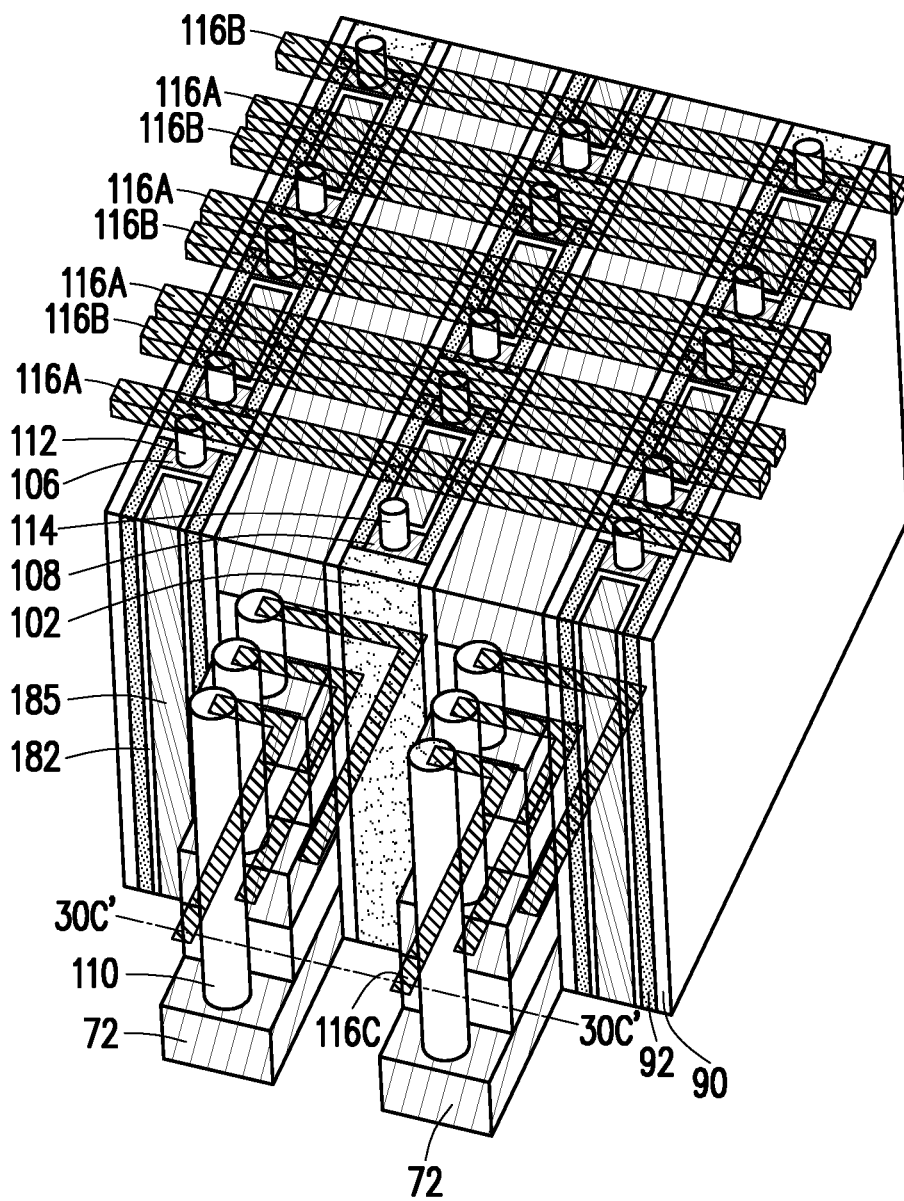
Figure 30B:
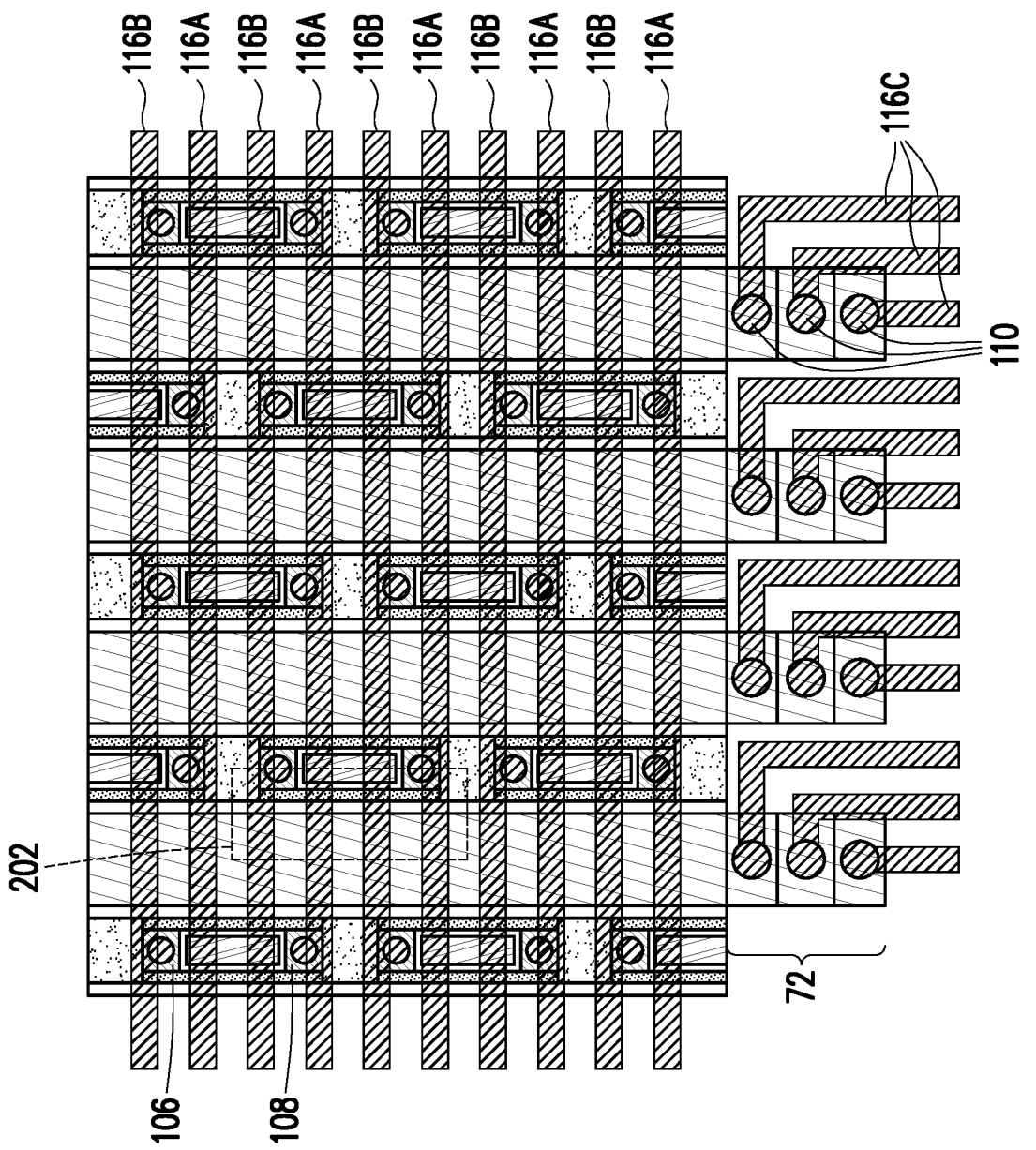
Figure 30C:
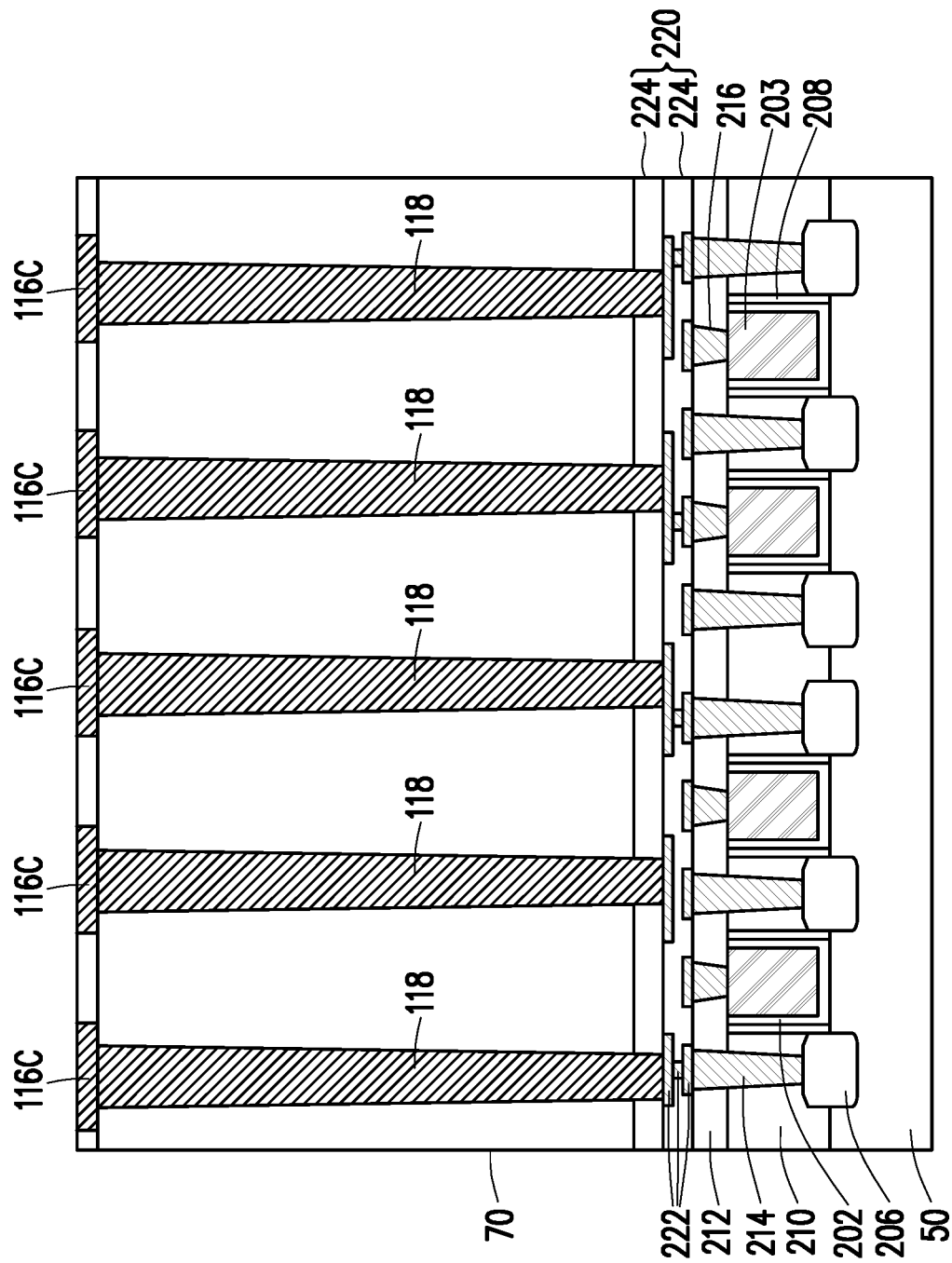
Figure 30D:
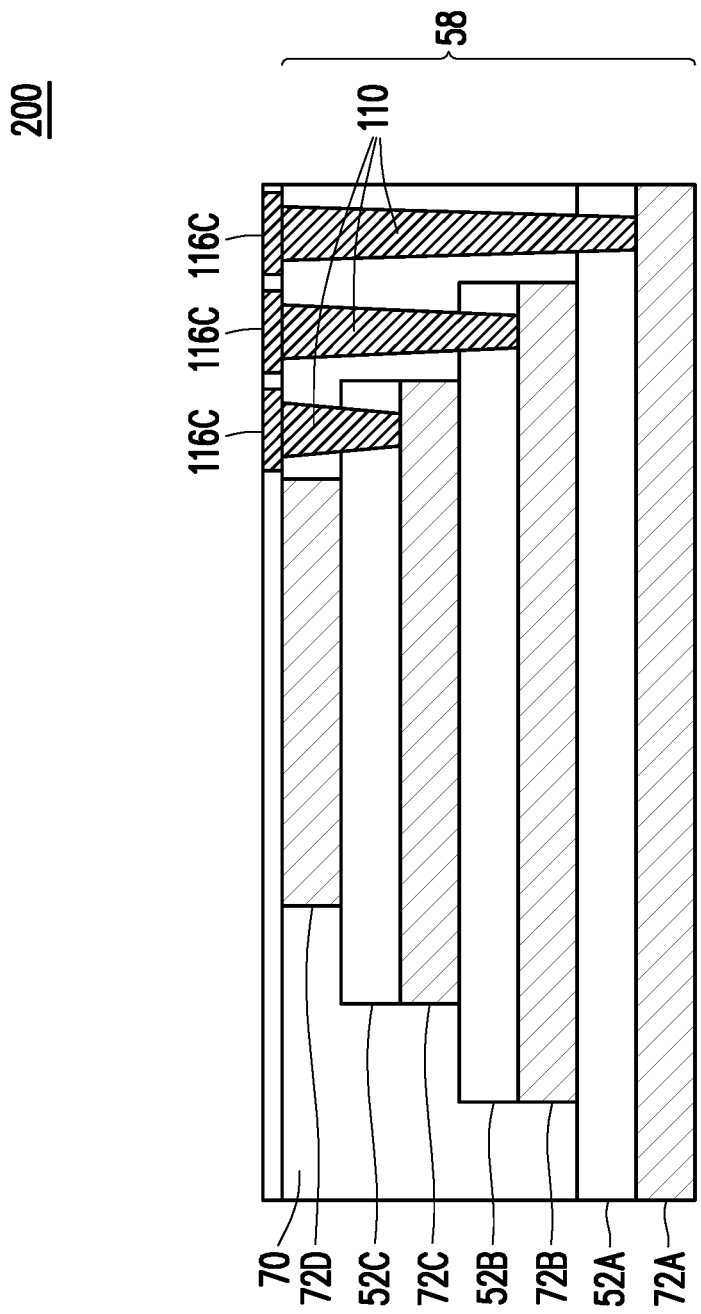

In FIGS. 30A, 30B, 30C, and 30D, contacts 110 are made to the conductive lines 72, the conductive lines 106, and the conductive lines 108. FIG. 30A illustrates a perspective view of the memory array 200; FIG. 30B illustrates a top-down view of the memory array 200; and FIG. 30C illustrates a cross-sectional view of the device and underlying substrate alone the line 30C'-30C' of FIG. 30A; and FIG. 30D illustrates a cross-sectional view of the device along line B-B' of FIG. 1A. In some embodiments, the staircase shape of the conductive lines 72 may provide a surface on each of the conductive lines 72 for the conductive contacts 110 to land on. Forming the contacts 110 may include patterning openings in the IMD 70 and the dielectric layers 52 to expose portions of the conductive layers 54 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the IMD 70. The remaining liner and conductive material form the contacts 110 in the openings.

As also illustrated by the perspective view of FIG. 30A, conductive contacts 112 and 114 may also be made to the conductive lines 106 and the conductive lines 108, respectively. The conductive contacts 110, 112, and 114 may be electrically connected to conductive lines 116A, 116B, and 116C, respectively, which connect the memory array to an underlying/overlying circuitry (e.g., control circuitry) and/or signal, power, and ground lines in the semiconductor die. For example, conductive vias 118 may extend through the IMD 70 to electrically connect conductive lines 116C to the underlying circuitry of the interconnect structure 220 and the active devices on the substrate 50 as illustrated by FIG. 30C. Other conductive vias may be formed through the IMD 70 to electrically connect the conductive lines 116A and 116B to the underlying circuitry of the interconnect structure 220. In alternate embodiments, routing and/or power lines to and from the memory array may be provided by an interconnect structure formed over the memory array 200 in addition to or in lieu of the interconnect structure 220.

The gate electrodes 185 may be electrically connected to the underlying interconnect structure 220 and extend through the memory film 90 and the gate dielectric layer 182, in a similar manner as described above in FIG. 29D. In an embodiment, each gate electrode 185 is connected to a different underlying conductive line, and thus each gate electrode 185 can be connected to and controlled by its own device (e.g., its own transistor). Accordingly, the memory array 200 may be completed.

Figure 31A:
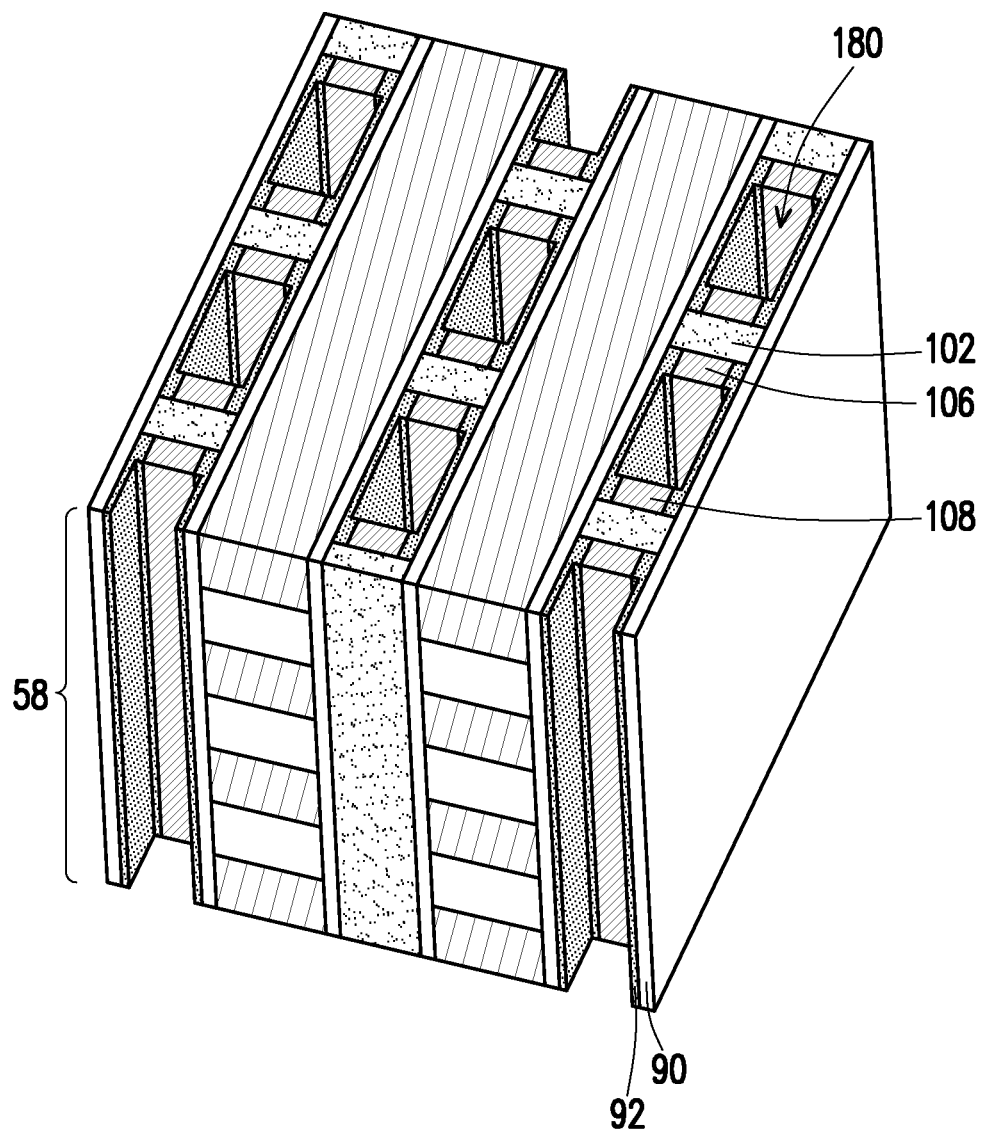
FIGS. 31A, 31B, 31C, 32A, 32B and 32C illustrate varying views of manufacturing a memory array in accordance with alternate embodiments.
Figure 31B:
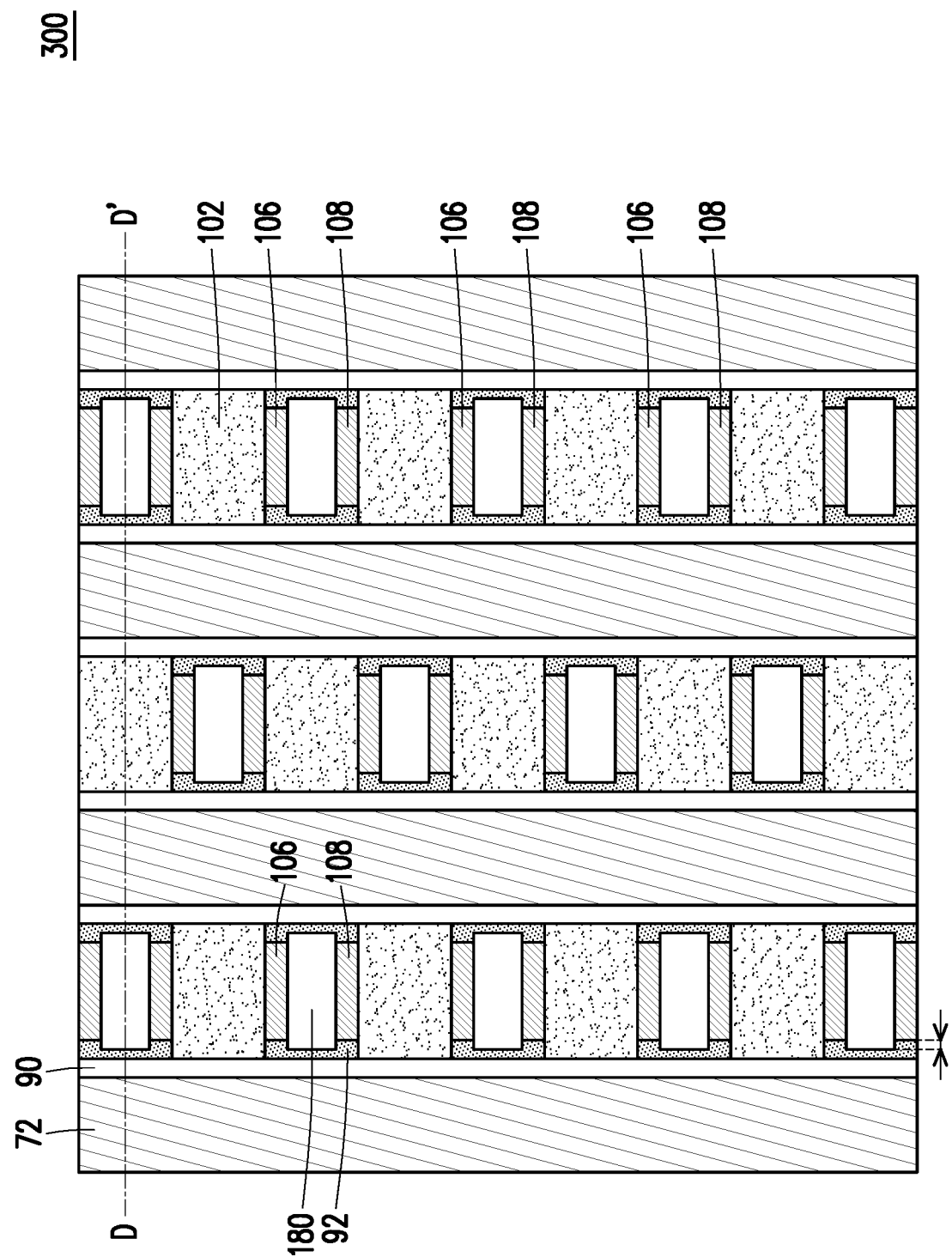
Figure 31C:
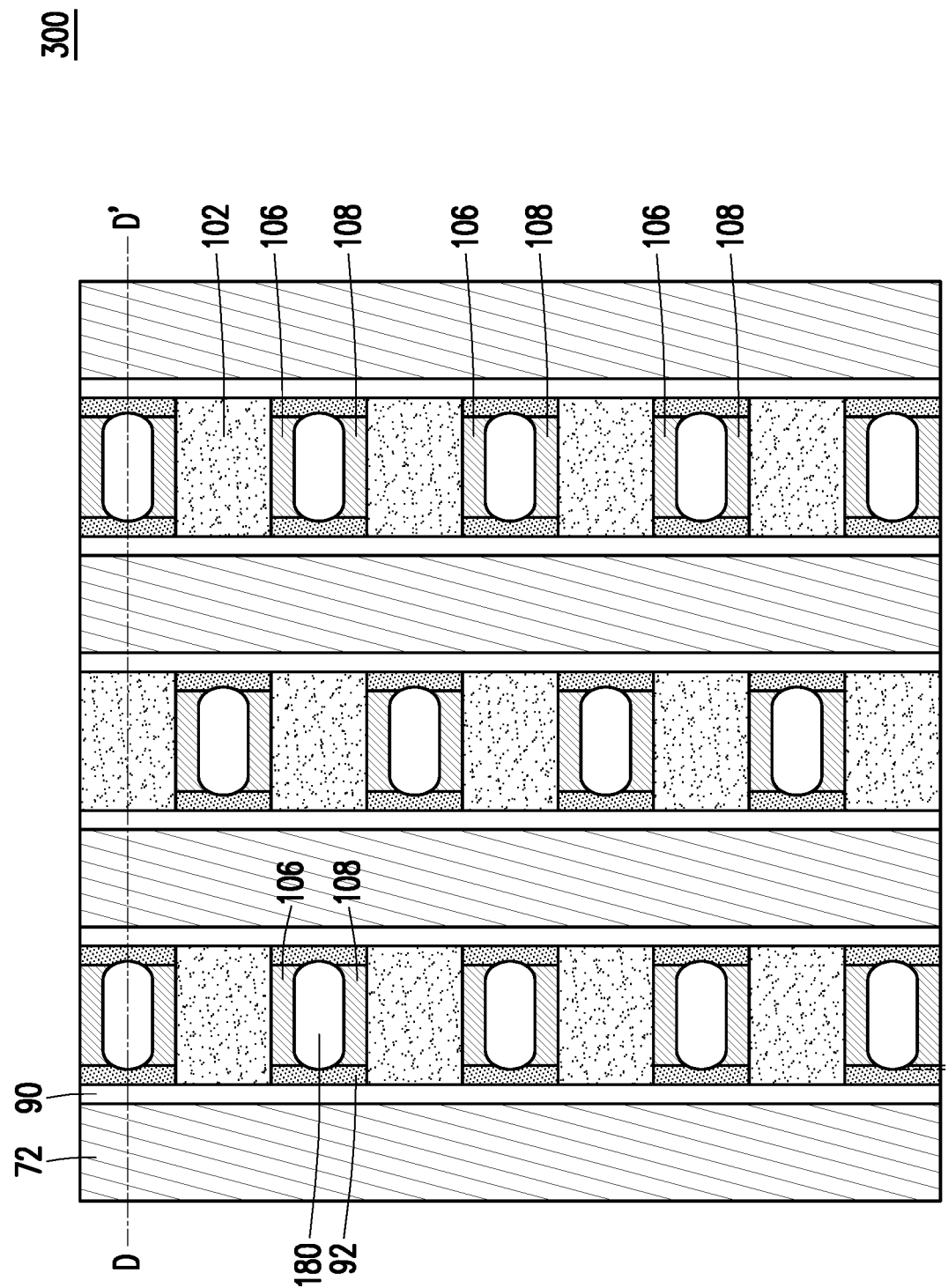

FIGS. 31A through 32C illustrate various views of intermediate steps in the forming of the 3D Memory Array 300, in accordance with alternate embodiments. Unless specified otherwise, like reference numerals in this embodiment represent like components in the embodiment shown in FIGS. 1A through 30D. Accordingly, the process steps and applicable materials may not be repeated herein. The initial steps of this embodiment are essentially the same as shown in FIGS. 1A through 27C. In FIGS. 31A and 31B, trenches 180 are formed by removing the dielectric layer 98 as well as a portion of the OS layer 92. The trenches 180 are formed by patterning the dielectric layer 98 and the OS layer 92 using a combination of photolithography and etching, for example. In an alternate embodiment, ends of the trenches 180 may be rounded or curved as shown in FIG. 31C.

For example, a photoresist (not shown in FIGS. 31A and 31B) may be deposited over the multi-layer stack 58, the dielectric layer 98, the dielectric layer 102, the OS layer 92, the memory film 90, the conductive lines 106, and the conductive lines 108. The photoresist can be formed by using a spin-on technique, for example. The photoresist is patterned to define openings that overlap a corresponding region of the dielectric layer 98 and a corresponding region of the OS layer 92. For example, each opening may expose a region of the dielectric layer 98 and a region of the OS layer 92. The photoresist can be patterned using acceptable photolithography techniques.

Subsequently, the dielectric layer 98 exposed by the openings may be removed by etching, for example, to form the trenches 180. The OS layer 92 may also be exposed and etched to define recesses 186. As a result, the trenches 180 comprise recesses 186 in the OS layer 92. The etching may be any acceptable etch process, such as by wet or dry etching, the like, or a combination thereof. The etching may be anisotropic. After the trenches 180 are patterned, the photoresist may be removed by ashing, for example.

Figure 32A:
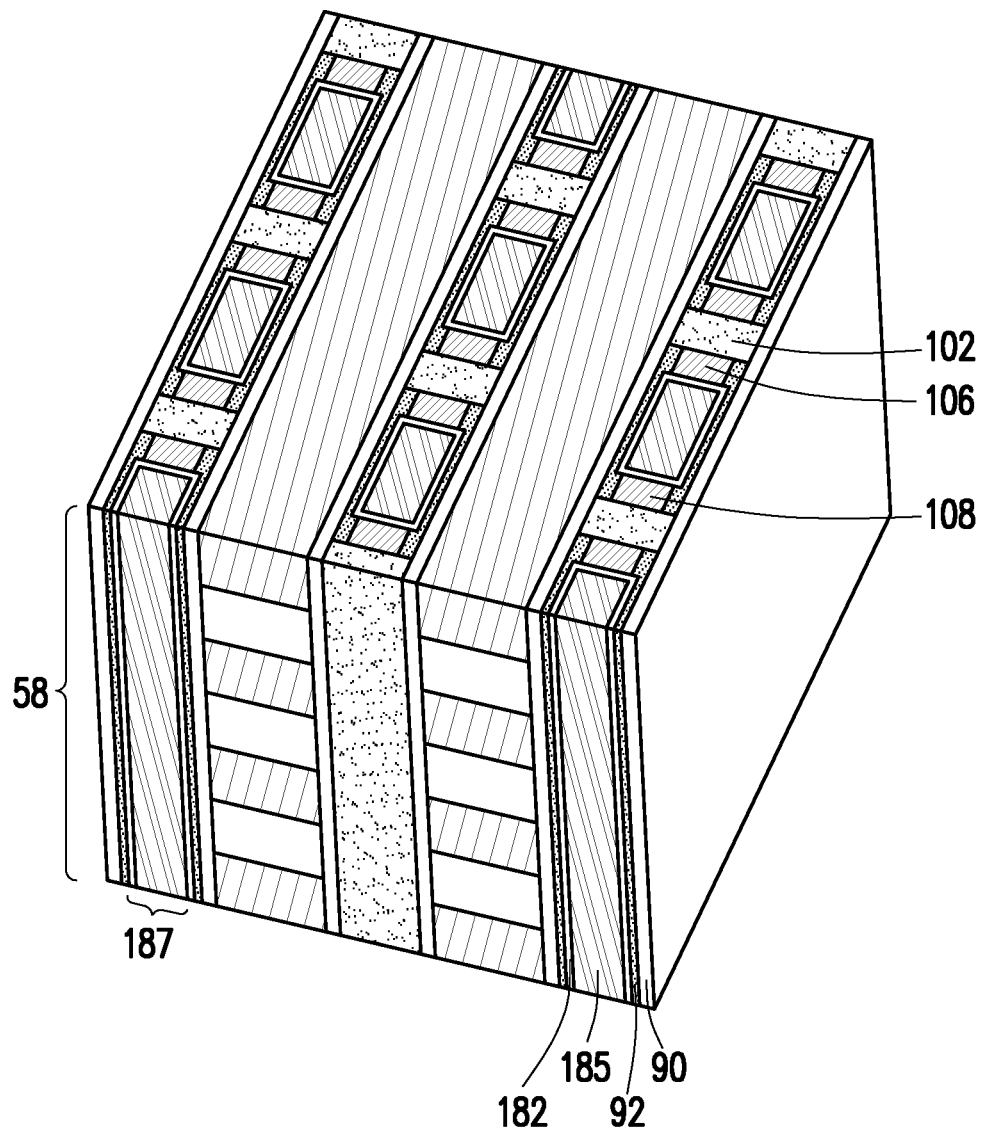
Figure 32B:
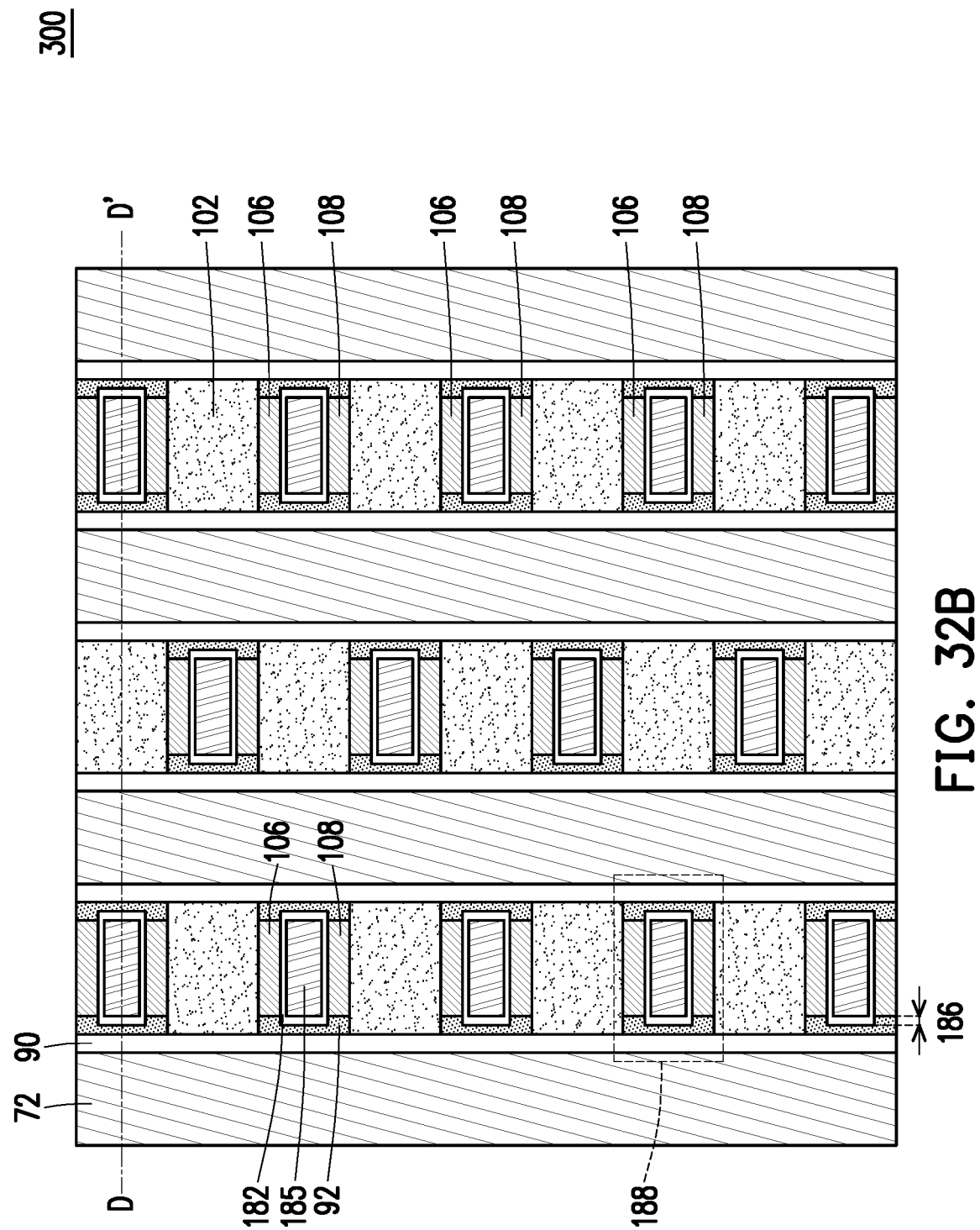
Figure 32C:
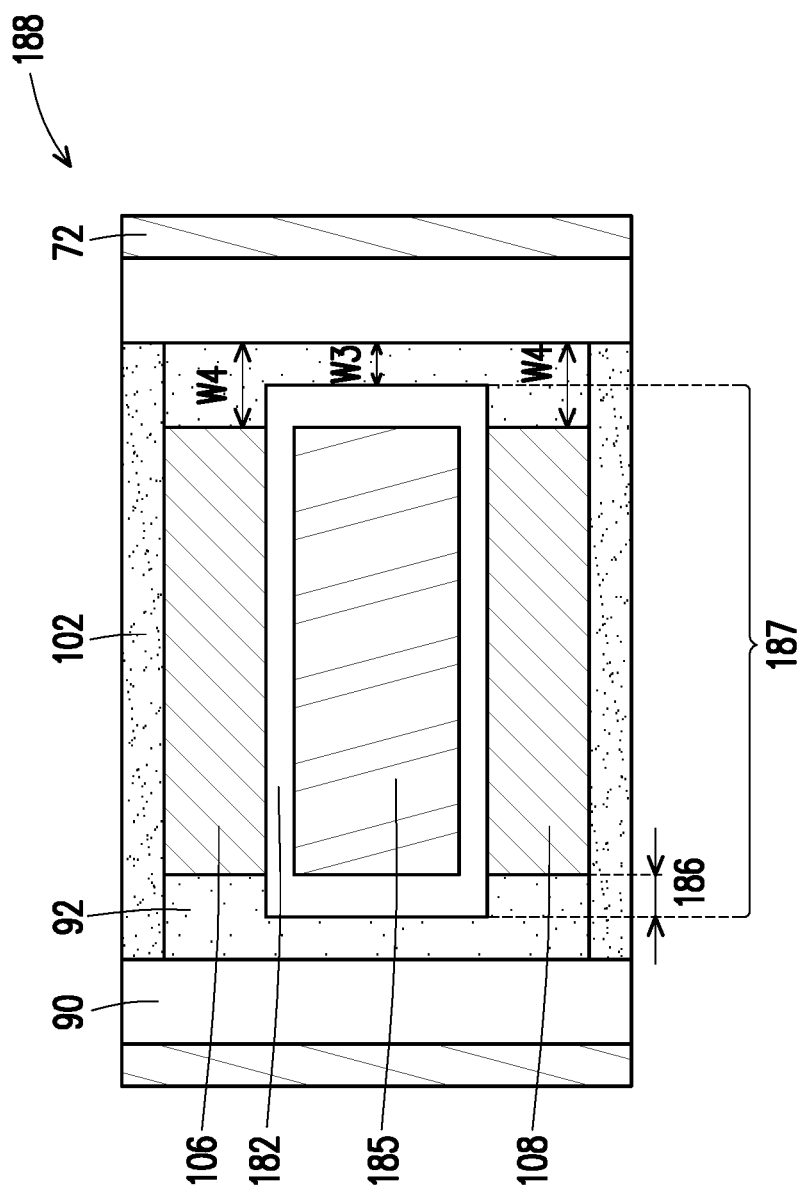

In FIGS. 32A through 32C, gate dielectric layer 182 and gate electrodes 185 (collectively, gate stacks 187) are formed in the trenches 180. The gate dielectric layer 182 and the gate electrode 185 may be formed of same materials and same processes as those described above in FIGS. 29A through 29D. FIG. 32C illustrates an enlarged view of the region 188 in FIG. 32B. The gate stacks 187 extend into the recesses 186 in the OS layer 92. In some embodiments, a first portion of the OS layer 92 comprises a third width W3, and a second portion of the OS layer 92 and a third portion of the OS layer 92 comprise a fourth width W4 larger than the third width W3, wherein the first portion of the OS layer 92 is in between the second portion of the OS layer 92 and the third portion of the OS layer 92.

Advantages can be achieved as a result of each memory cell 202 of the memory array 200 comprising a transistor 204 that includes a gate stack 187. The gate stack 187 may be used to provide extra charge (e.g., to apply a biasing voltage to increase a write voltage). As a result, the operational voltage of the 3D memory array 200 can be reduced, leading to improved reliability. In addition, increasing the write voltage applied during a write operation can help increase the speed and accuracy of the write operation. Further, the gate stack 187 can help control the surface potential of the OS layer 92 (particularly the portions of the OS layer 92 distal the conductive lines 72 (e.g., word lines)) during write operations. The window for write operations may thus be widened. In addition, the gate stack 187 may extend into the recess 186 of the OS layer 92 which allows the gate stack 187 to exert better control of corresponding transistors 204 during operation.

Figure 33:
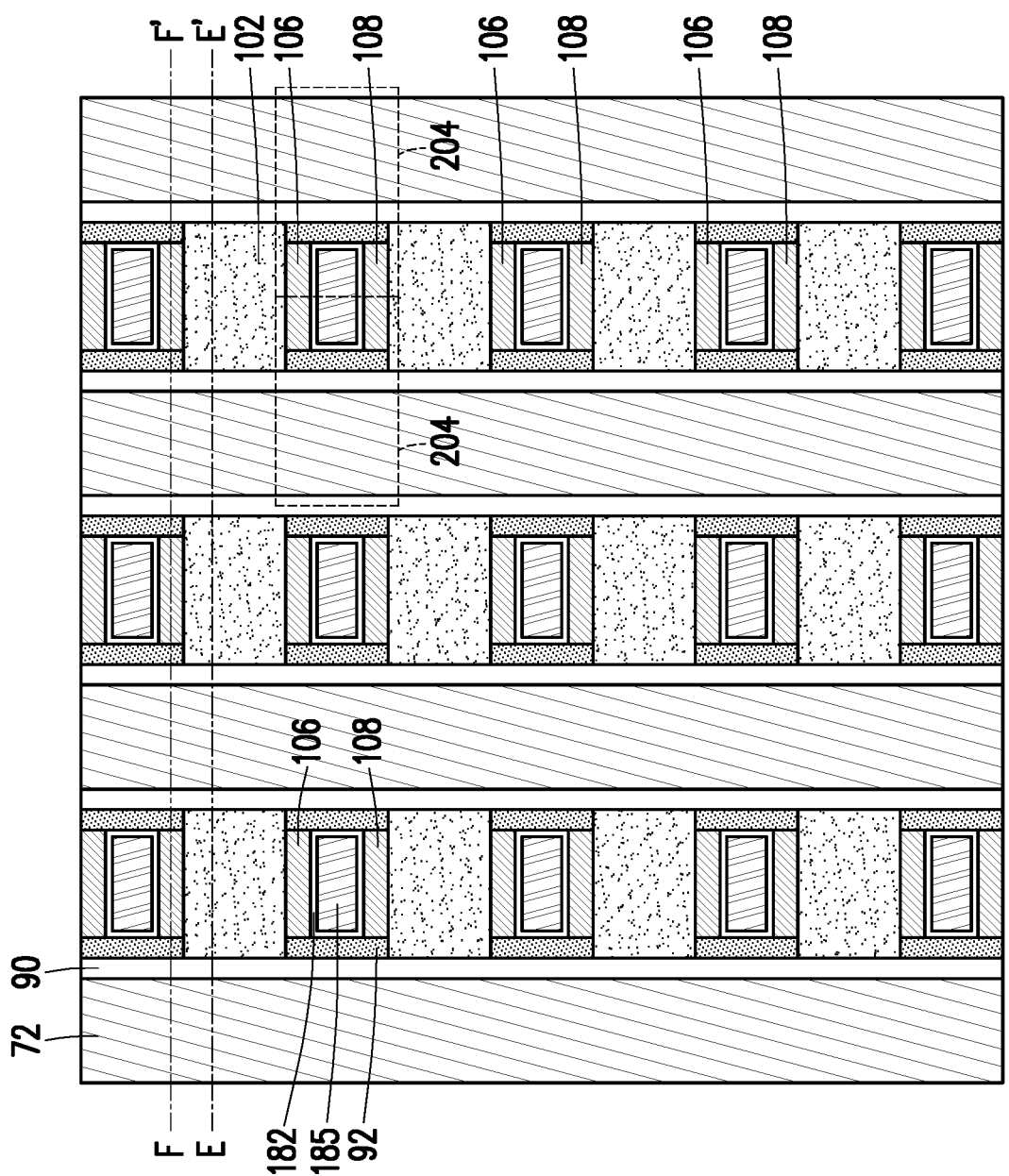
FIGS. 33, 34, and 35 illustrate varying views of a memory array in accordance with alternate embodiments.
Figure 34:
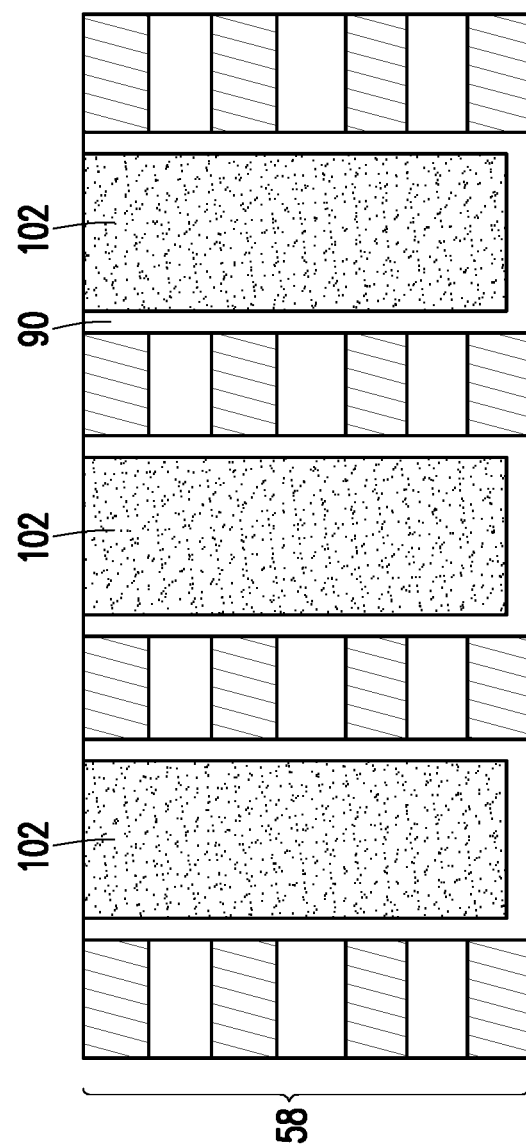
Figure 35:
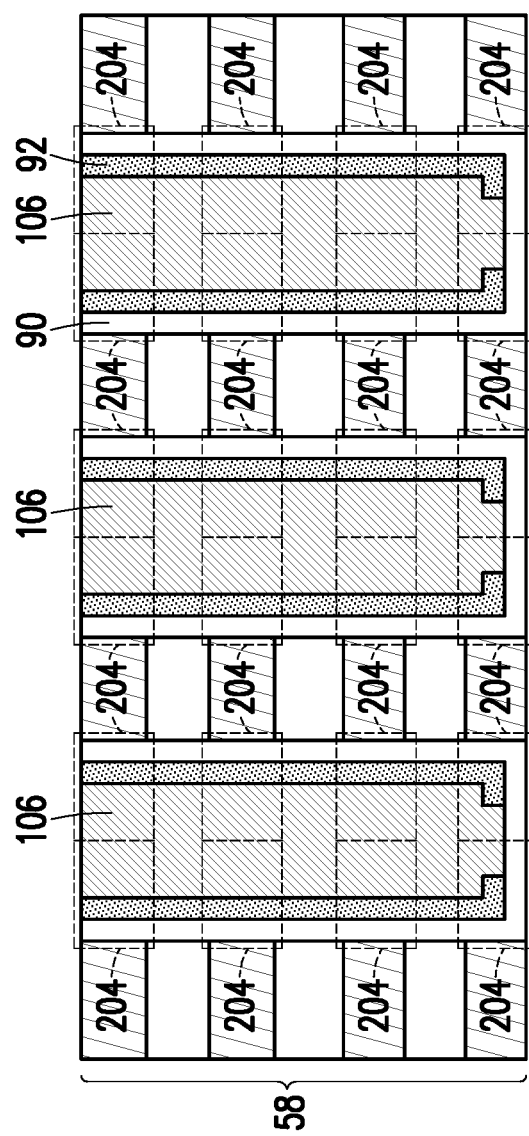

Although the embodiments of FIGS. 2 through 32C illustrate a particular pattern for the conductive lines 106 and 108, other configurations are also possible. For example, in these embodiments, the conductive lines 106 and 108 have a staggered pattern. In some embodiments, the conductive lines 106 and 108 in a same row of the array are all aligned with each other as shown in FIG. 33. FIG. 33 illustrates a top-down view, and FIG. 34 illustrates a cross-sectional view along line E-E' of FIG. 33. FIG. 35 illustrates a cross-sectional view alone line F-F' of FIG. 33. In FIGS. 33, 34, and 35, like reference numerals indicate like elements formed by like processes as the elements of FIGS. 2 through 32C.

Various embodiments provide a 3D memory array with a plurality of vertically stacked memory cells. Each memory cell includes a transistor having a word line region acting as a first gate electrode, a bit line region acting as a first source/drain electrode, and a source line region acting as a second source/drain electrode. Each transistor further includes an insulating memory film (e.g., as a gate dielectric)

and an oxide semiconductor (OS) channel region. Additionally, each memory cell includes a second gate electrode that may be used to provide extra charge (e.g., to apply a biasing voltage to increase a write voltage). As a result, the operational voltage of the 3D memory array can be reduced, leading to improved reliability. In addition, increasing the write voltage applied during a write operation can help increase the speed and accuracy of the write operation. Further, the second gate electrode can help control the surface potential of the OS channel region during write operations, thus allowing the window for write operations to be widened. Additionally, the oxide semiconductor (OS) channel region can be formed with a recess that allows the second gate electrode to exert better control of each transistor during operation.

In accordance with an embodiment, a method includes patterning a first trench extending through a first conductive line; depositing a memory film along sidewalls and a bottom surface of the first trench; depositing a channel layer over the memory film, the channel layer extending along the sidewalls and the bottom surface of the first trench; depositing a first dielectric layer over and contacting the channel layer to fill the first trench; patterning a first opening, where patterning the first opening includes etching the first dielectric layer; depositing a gate dielectric layer in the first opening; and depositing a gate electrode over the gate dielectric layer and in the first opening, the gate electrode being surrounded by the gate dielectric layer. In an embodiment, the channel layer includes an oxide semiconductor (OS) material. In an embodiment, the method further includes patterning a second opening in the first dielectric layer; patterning a third opening in the first dielectric layer; and filling the second opening and the third opening with a second conductive material to define a first source line in the second opening and a first bit line in the third opening. In an embodiment, the first source line is isolated from an adjacent second bit line by a second dielectric layer, and the first bit line is isolated from and adjacent second source line by the second dielectric layer. In an embodiment, patterning the first opening further includes etching a portion of the gate dielectric layer and a portion of the memory film on the bottom surface of the first trench. In an embodiment, the gate electrode extends through the gate dielectric layer and the memory film, and where the gate electrode is electrically coupled to an interconnect structure under the gate electrode. In an embodiment, patterning the first opening further includes etching the channel layer.

In accordance with an embodiment, a device includes a source line extending in a first direction; a bit line extending in the first direction; a gate stack between the source line and the bit line, the gate stack extending in the first direction; a word line extending in a second direction, the second direction being perpendicular to the first direction; a memory film extending along the word line; and a channel layer between the source line and the memory film, between the gate stack and the memory film, and between the bit line and the memory film. In an embodiment, a first width of the gate stack is the same as a second width of the source line and a third width of the bit line. In an embodiment, the gate stack includes a gate dielectric layer surrounding a gate electrode, where the gate dielectric layer separates the gate electrode from the source line and the bit line. In an embodiment, a portion of the gate electrode extends below a bottommost surface of the gate dielectric layer. In an embodiment, a first portion of the channel layer includes a first width, and a second portion of the channel layer and a third portion of the channel layer includes a second width larger than the first width, where the first portion of the channel layer is in between the second portion of the channel layer and the third portion of the channel layer. In an embodiment, a first width of the gate stack is larger than a second width of the source line and a third width of the bit line. In an embodiment, a first, a second, and a third sidewall of the gate dielectric layer physically contact the channel layer. In an embodiment, a first sidewall of the second portion of the channel layer physically contacts the source line and a second sidewall of the third portion of the channel layer physically contacts the bit line.

In accordance with an embodiment, a device includes a semiconductor substrate; a first memory cell over the semiconductor substrate, the first memory cell comprising a first transistor, where the first transistor includes a first gate electrode provided by a portion of a first word line; a first portion of a ferroelectric material, the first portion of the ferroelectric material being on a sidewall of the first word line; a first channel region on a sidewall of the ferroelectric material; and a second gate electrode on a sidewall of the first channel region opposite the ferroelectric material; a first source/drain electrode provided by a first portion of a source line; and a second source/drain electrode provided by a first portion of a bit line, where the second gate electrode separates the first source/drain electrode and the second source/drain electrode; and a second memory cell over the first memory cell. In an embodiment, the second memory cell includes a second transistor, and where the second transistor includes a third gate electrode connected to the second gate electrode. In an embodiment, each of the second gate electrode and the third gate electrode are surrounded by a gate dielectric layer. In an embodiment, a second portion of the source line provides a first source/drain electrode for the second transistor, and wherein a second portion of the bit line provides a second source/drain electrode for the second transistor. In an embodiment, further including a second word line over the first word line, where a fourth gate electrode of the second transistor is provided by a portion of the second word line, and where the first word line is longer than the second word line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a source line extending in a first direction;
   a bit line extending in the first direction;
   a gate stack between the source line and the bit line, the gate stack extending in the first direction;
   a word line extending in a second direction, the second direction being perpendicular to the first direction;
   a memory film extending along the word line; and
   a channel layer between the source line and the memory film, between the gate stack and the memory film, and between the bit line and the memory film.

2. The device of claim 1, wherein a first width of the gate stack is the same as a second width of the source line and a third width of the bit line.

3. The device of claim 1, wherein the gate stack comprises:
a gate dielectric layer surrounding a gate electrode, wherein the gate dielectric layer separates the gate electrode from the source line and the bit line.

4. The device of claim 3, wherein a portion of the gate electrode extends below a bottommost surface of the gate dielectric layer.

5. The device of claim 3, wherein a first portion of the channel layer comprises a first width, and a second portion of the channel layer and a third portion of the channel layer comprise a second width larger than the first width, wherein the first portion of the channel layer is in between the second portion of the channel layer and the third portion of the channel layer.

6. The device of claim 5, wherein a first width of the gate stack is larger than a second width of the source line and a third width of the bit line.

7. The device of claim 5, wherein a first, a second, and a third sidewall of the gate dielectric layer physically contact the channel layer.

8. The device of claim 5, wherein a first sidewall of the second portion of the channel layer physically contacts the source line and a second sidewall of the third portion of the channel layer physically contacts the bit line.

9. A device comprising:
a semiconductor substrate;
a first memory cell over the semiconductor substrate, the first memory cell comprising a first transistor, wherein the first transistor comprises:
a first gate electrode provided by a portion of a first word line;
a first portion of a ferroelectric material, the first portion of the ferroelectric material being on a sidewall of the first word line;
a first channel region on a sidewall of the ferroelectric material; and
a second gate electrode on a sidewall of the first channel region opposite the ferroelectric material;
a first source/drain electrode provided by a first portion of a source line; and
a second source/drain electrode provided by a first portion of a bit line, wherein the second gate electrode separates the first source/drain electrode and the second source/drain electrode; and
a second memory cell over the first memory cell.

10. The device of claim 9, wherein the second memory cell comprises a second transistor, and wherein the second transistor comprises a third gate electrode connected to the second gate electrode.

11. The device of claim 10, wherein each of the second gate electrode and the third gate electrode are surrounded by a gate dielectric layer.

12. The device of claim 10, wherein a second portion of the source line provides a first source/drain electrode for the second transistor, and wherein a second portion of the bit line provides a second source/drain electrode for the second transistor.

13. The device of claim 12 further comprising a second word line over the first word line, wherein a fourth gate electrode of the second transistor is provided by a portion of the second word line, and wherein the first word line is longer than the second word line.

14. A device comprising:
a semiconductor substrate;
a first memory cell and a second memory cell over the semiconductor substrate, wherein the first memory cell is adjacent to the second memory cell, the first memory cell comprising:
a first portion of a first pair of conductive lines, the first pair of conductive lines extending in a first direction;
a first portion of a first word line, the first word line extending in a direction perpendicular to the first direction;
a first portion of a first gate stack disposed between the first pair of conductive lines;
a first portion of a first semiconductor layer disposed between the first portion of the first word line and the first portion of the first gate stack, and between the first portion of the first word line and the first pair of conductive lines; and
a first portion of a first memory film disposed between the first portion of the first word line and the first portion of the first semiconductor layer.

15. The device of claim 14, wherein the second memory cell comprises:
a first portion of a second pair of conductive lines, the second pair of conductive lines extending in the first direction;
a second portion of the first word line;
a first portion of a second gate stack disposed between the second pair of conductive lines;
a first portion of a second semiconductor layer disposed between the second portion of the first word line and the first portion of the second gate stack, and between the second portion of the first word line and the second pair of conductive lines; and
a first portion of a second memory film disposed between the second portion of the first word line and the first portion of the second semiconductor layer.

16. The device of claim 15, wherein the first semiconductor layer and the second semiconductor layer comprise an oxide semiconductor (OS) material.

17. The device of claim 15, wherein the first memory film and the second memory film comprise a ferroelectric material.

18. The device of claim 15 further comprising:
a third memory cell vertically above the first memory cell, the third memory cell comprising:
a second portion of the first pair of conductive lines;
a first portion of a second word line extending in a direction perpendicular to the first direction;
a second portion of the first gate stack;
a second portion of the first semiconductor layer disposed between the first portion of the second word line and the second portion of the first gate stack, and between the first portion of the second word line and the first pair of conductive lines; and
a second portion of the first memory film disposed between the first portion of the second word line and the second portion of the first semiconductor layer.

19. The device of claim 14, wherein a first conductive line of the first pair of conductive lines is a source line, and a second conductive line of the first pair of conductive lines is a bit line.

20. The device of claim 19, wherein the source line is electrically coupled to ground.

* * * * *